(12) United States Patent
Yamazaki et al.

(10) Patent No.: US 6,714,183 B2
(45) Date of Patent: *Mar. 30, 2004

(54) SEMICONDUCTOR DISPLAY DEVICE AND DRIVING CIRCUIT THEREFOR

(75) Inventors: Shunpei Yamazaki, Atsugi (JP); Jun Koyama, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/147,971

(22) Filed: May 20, 2002

(65) Prior Publication Data

US 2002/0135554 A1 Sep. 26, 2002

Related U.S. Application Data

(62) Division of application No. 09/479,242, filed on Jan. 7, 2000, now Pat. No. 6,392,628.

(30) Foreign Application Priority Data

Jan. 8, 1999 (JP) .............................. 11-002390

(51) Int. Cl.$^7$ ................................. G09G 3/36
(52) U.S. Cl. ........................................ 345/98; 345/100
(58) Field of Search ............................. 345/87, 94, 95, 345/98, 100, 204, 208, 210, 211

(56) References Cited

U.S. PATENT DOCUMENTS

| | | |
|---|---|---|
| 4,692,641 A | 9/1987 | Highton |
| 5,061,920 A | 10/1991 | Nelson |
| 5,247,190 A | 9/1993 | Friend et al. |
| 5,399,502 A | 3/1995 | Friend et al. |
| 5,518,940 A | 5/1996 | Hodate et al. |
| 5,576,737 A | 11/1996 | Isozaki |
| 5,594,569 A | 1/1997 | Konuma et al. |
| 5,643,826 A | 7/1997 | Ohtani et al. |
| 5,648,277 A | 7/1997 | Zhang et al. |
| 5,648,791 A | 7/1997 | Date et al. |
| 5,731,796 A | 3/1998 | Furuhashi et al. |
| 5,828,357 A | 10/1998 | Tamai et al. |
| 5,835,172 A | 11/1998 | Yeo et al. |
| 5,923,962 A | 7/1999 | Ohtani et al. |
| 6,166,726 A | 12/2000 | Uchida et al. |
| 6,218,678 B1 | 4/2001 | Zhang et al. |
| 6,285,042 B1 | 9/2001 | Ohtani et al. |
| 6,335,541 B1 | 1/2002 | Ohtani et al. |
| 6,392,628 B1 * | 5/2002 | Yamazaki et al. |
| 2002/0167502 A1 | 11/2002 | Yamazaki et al. |

FOREIGN PATENT DOCUMENTS

| | | |
|---|---|---|
| DD | 239499 | 9/1986 |
| EP | 0 201 838 | 11/1986 |
| EP | 0 599 273 | 6/1994 |
| GB | 2 134 686 | 8/1984 |
| JP | 7-130652 | 5/1995 |
| JP | 7-135318 | 5/1995 |
| JP | 8-078329 | 3/1996 |
| JP | 10-92576 | 4/1998 |
| WO | 90/13148 | 11/1990 |

OTHER PUBLICATIONS

Furue et al., "Characteristics and Driving Scheme of Polymer–Stabilized Monostable FLCD, Exhibiting Fast Response Time and High Contrast Ratio with Gray–Scale Capability," SID 98 DIGEST, pp. 782–785.

(List continued on next page.)

*Primary Examiner*—Regina Liang
(74) *Attorney, Agent, or Firm*—Eric J. Robinson; Robinson Intellectual Property Law Office, P.C.

(57) ABSTRACT

A semiconductor display device with low power consumption, low electromagnetic noise, and low unwanted radiation is provided. In a peripheral driving circuit, a clock signal with a voltage level increased by a level shifter circuit is input to a shift register circuit. Then a timing signal from the shift register circuit is input to a level shifter circuit, and the voltage level is thus raised in two stages.

26 Claims, 39 Drawing Sheets

OTHER PUBLICATIONS

Yoshida et al., "A Full–Color Thresholdless Antiferroelectric LCD Exhibiting Wide Viewing Angle With Fast Response Time," SID 97 DIGEST pp. 841–844.

Inui et al., "Thresholdless Antiferroelectricity in Liquid Crystals and its Application to Displays," J. Mater. Chem., 1996, 6(4), pp. 671–673.

Terada et al., "Half–V Switching Mode FLCD," Proceedings of the 46$^{th}$ Applied Physics Association Lectures, 28P–V–8, p. 1316, Mar. 1999.

Yoshihara et al., "Time Division Full Color LCD by Ferroelectric Liquid Crystal," EKISHO, vol. 3, No. 3, pp. 190–194, 1999.

Hermann Schenk et al., "Polymers for Light Emitting Diodes," EuroDisplay '99 Proceedings, pp. 33–37.

*International Search Report*, Oct. 9, 2002.

Igor De Rycke et al., *2–MHz Clocked LCD Drivers on Glass*, IEEE Journal of Solid–State Circuits, vol. 25, No. 2, Apr. 1, 1990, pp. 531–538.

Mutsuko Hatano et al., *A Novel Self–Aligned Gate–Overlapped LDD Poly–Si TFT with High Reliability and Performance*, IDEM 97, pp. 523–526, Jan. 1, 1997.

Tiemin Zhao et al., *A Novel Floating Gate Spacer Polysilicon TFT, IEDM*, 1993, pp. 393–396, Dec. 5, 1993.

R.A. Johnson, et al., *Novel Polysilicon Sidewall Gate Silicon–on–Sapphire MOSFET for Power Amplifier Applications*, Proceedings 1997 IEEE International SOI Conference, Oct. 1, 1997, pp. 136–137.

Ken–ichi Oki et al., *Mos–El Integrated Display Device*, SID 82 Digest, May 11, 1982, pp. 266–267.

*Full Color Active Matrix Display Based on GaN Lateral Light Emitting Diode Structures*, IBM Technical Disclosure Bulletin, vol. 39, No. 8, Aug. 1, 1996, pp. 75–79.

\* cited by examiner

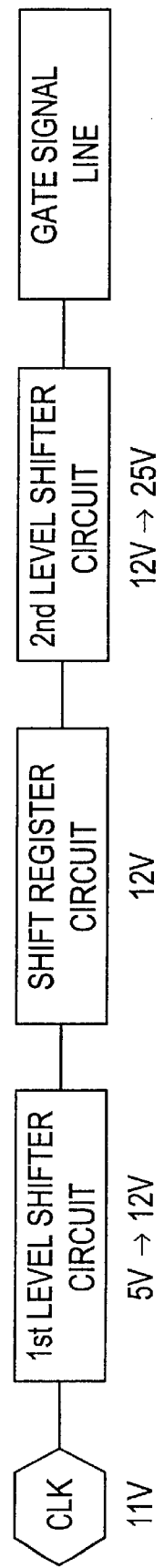

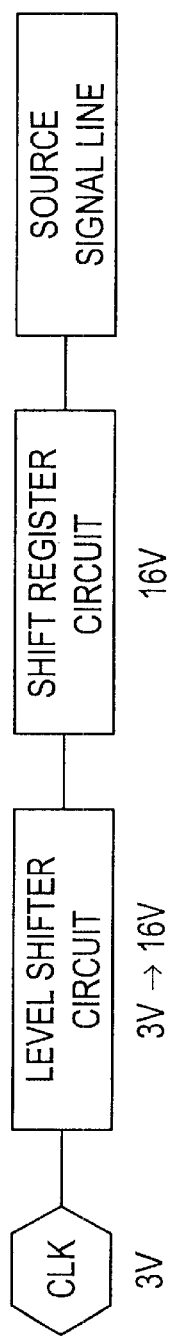
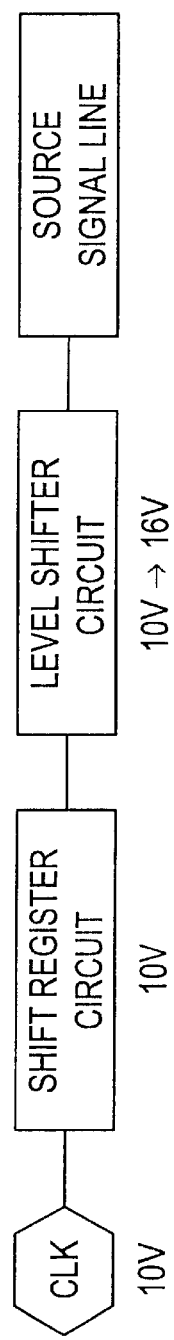
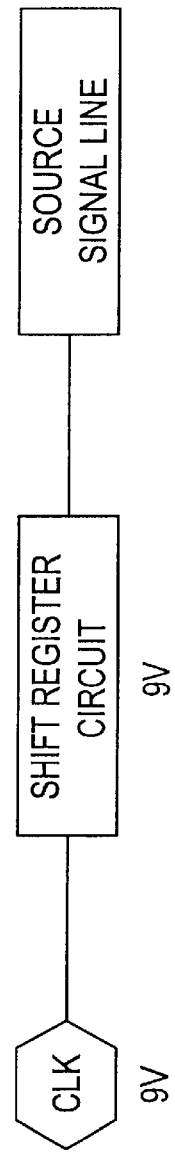
FIG. 19A PRIOR ART
FIG. 19B PRIOR ART
FIG. 19C PRIOR ART

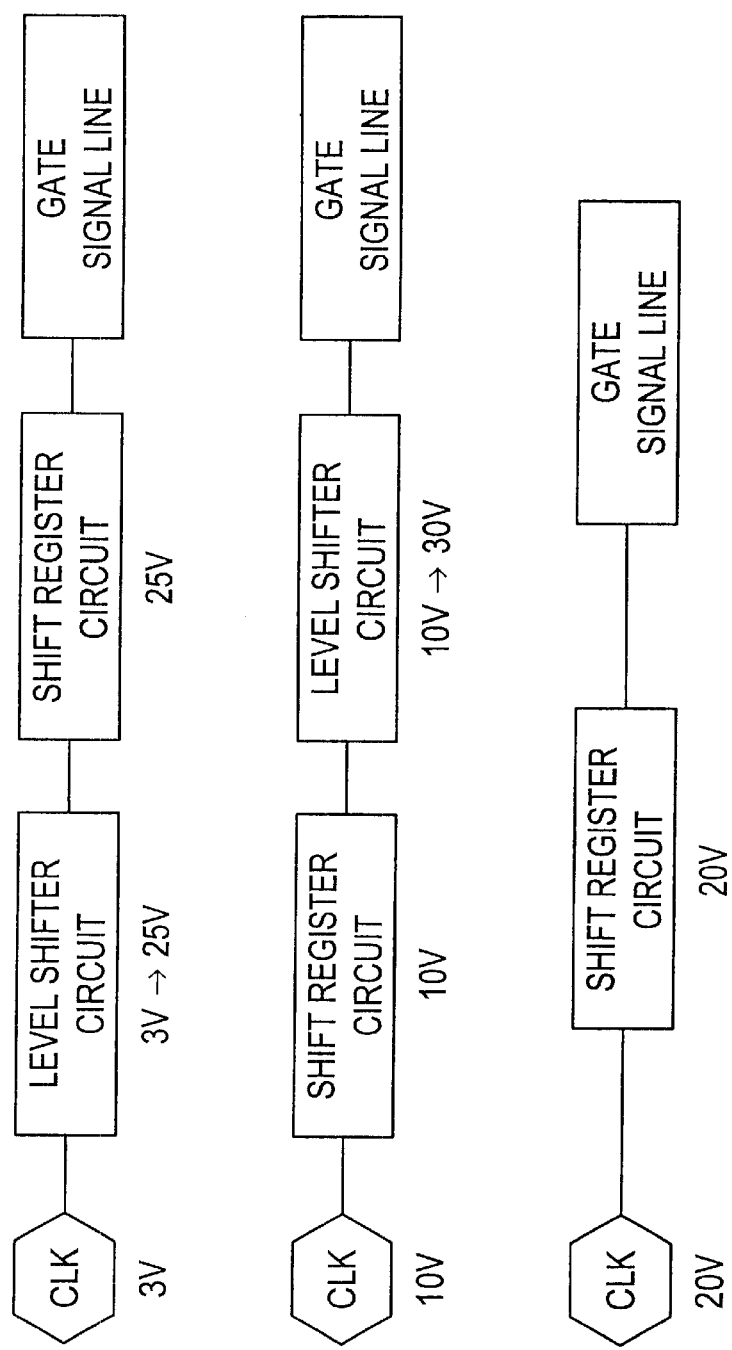

SEMICONDUCTOR DISPLAY DEVICE AND DRIVING CIRCUIT THEREFOR

BACKGROUND OF THE INVENTION

1. Field of the Invention

The present invention relates to a semiconductor display device. More specifically, it relates to a semiconductor display device which performs image display by driving pixel TFTs arranged in a matrix state, and to a semiconductor display device driving circuit. In addition, it relates to electronic equipment using such semiconductor display devices.

2. Description of the Related Art

Recently there has been rapid development in techniques of manufacturing semiconductor display devices, for example a thin film transistor (TFT), formed from semiconductor thin films on an inexpensive glass substrate. The reason for this is because the demand for active matrix type liquid crystal display devices has risen.

A TFT is placed in each of the several hundreds of thousands to several millions of pixel regions arranged in a matrix state on an active matrix type liquid crystal display device. The electric charge entering and exiting every pixel electrode is controlled by the switching function of the TFT arranged in the pixel regions.

The structure of a conventional active matrix type liquid crystal display device is shown in FIG. 18. A source signal line side driving circuit 1801 and a gate signal line side driving circuit 1802 are, normally, generically referred to as driving circuits. In recent years the driving circuit has been formed in unity with the pixel region, which is comprised of the pixel region, on the same substrate.

Further, source signal lines 1803 connected to the source signal line side driving circuit 1801, and gate signal lines 1804 connected to the gate signal line side driving circuit 1802, intersect in a pixel region 1808. Pixel thin film transistors (pixel TFTs) 1805, liquid crystal cells 1806, which sandwich liquid crystals between a pixel electrode and an opposing electrode, and storage capacitors 1807 are formed in the regions surrounded by the source signal lines 1803 and the gate signal lines 1804.

An image signal input to the source signal lines 1803 is selected by the pixel TFTs 1805 and written to a predetermined pixel electrode.

Sampling is performed on the image signal in accordance with a timing signal output from the source signal line side driving circuit 1801, and the image signal is supplied to the source signal lines 1803.

The pixel TFTs 1805 operate in accordance with a selection signal input from the gate signal line side driving circuit 1802, via the gate signal lines 1804.

Prior Art A

A block diagram of an example of the conventional source signal line side driving circuit 1801 is shown in FIG. 19A.

An input signal input from external to the source signal line side driving circuit, a clock signal CLK (for example, 3 V), in this case, is input to the source signal line side driving circuit. The voltage amplitude level of the input clock signal is raised by a level shifter circuit (for example, from 3 to 16 V).

In the present specification the voltage amplitude level refers to the absolute value of the difference between the highest electric potential and the lowest electric potential of a signal. If the voltage amplitude level becomes higher (goes up), this means that the electric potential difference has become larger, and if the voltage amplitude level becomes lower, this means that the electric potential difference has become smaller.

Then the increased voltage amplitude level clock signal is input to the shift register circuit. The shift register circuit operates in accordance with the input clock signal, and a start pulse signal input at the same time to the shift register circuit, and creates a timing signal in order to sample the image signal. The timing signal is input to a sampling circuit, and the sampling circuit performs sampling of the image signal based on the input timing signal.

FIG. 21 shows an example of the specific circuit structure of FIG. 19A. A level shifter circuit 11, a shift register circuit 12, a sampling circuit 13, and an image signal line 14 are arranged as shown in the diagram.

A clock signal CLK and an inverted clock signal CLKb are input to the level shifter circuit 11, and a start pulse signal SP and a drive direction switching signal SL/R are input to the shift register circuit 12 from the wirings shown in the drawing.

The clock signal CLK (for example, 3 V) is input to the level shifter circuit 11 from external to the source signal line side driving circuit. It is necessary for the voltage amplitude level of the clock signal to be of a voltage amplitude level at which the level shifter circuit 11 can operate.

Further, unwanted radiation due to the clock signal is a problem of the set. Unwanted radiation is caused by generation of high frequency components of digital circuits which use rectangular wave trains starting up very sharply. Unwanted radiation becomes larger as the signal frequency gets higher, but it can be suppressed to a certain extent by reducing the voltage amplitude level of the signal.

It is necessary to suppress the unwanted radiation to within the range conforming to the standard established by CISPR (the International Special Committee on Radio Interference). Furthermore, in addition to CISPR, it is necessary that the range conform to the standards established by other foreign and domestic organizations such as the United States FCC (Federal Communications Commission), VCCI (Voluntary Control Council for Interference by data processing equipment and electronic office machines), and the German VDE (Verband Deutscher Elektrotechniker e.v). For example, the standard established by the FCCI states that, for industrial equipment, the permitted value of unwanted radiation is 1000 $\mu$V when the frequency is from 0.45 to 1.6 MHz, and is 3000 $\mu$V when the frequency is from 1.6 to 30 MHz. It is necessary to reduce the voltage amplitude level of the clock signal input from external to the source signal line side driving circuit to a level in which the unwanted radiation will conform to the standards established by the CISPR and other foreign and domestic standards and cause no trouble.

The voltage amplitude level of the clock signal input to the level shifter circuit increases. An equivalent circuit diagram of the level shifter circuit 11 is shown in FIG. 20. The reference Vin denotes an input signal, and Vinb denotes an input of an inverted Vin. In addition, Vddh denotes the application of a positive voltage, and Vss denotes the application of a negative voltage. The level shifter circuit 11 is designed so that the signal input from Vin, made into a high voltage signal, and inverted, is then output from Voutb. In short, if Hi is input to Vin, then a signal corresponding to Vss is output from Voutb, and if Lo is input to Vin, then a signal corresponding to Vddh is output from Vout.

The voltage amplitude level of the clock signal is increased, by a level shifter like that shown in FIG. 20, to a voltage amplitude level that includes a certain fixed margin voltage in addition to a voltage amplitude level at which the liquid crystal is driven to a saturation state (liquid crystal saturation voltage). Further, saturation voltage indicates the liquid crystal saturation voltage in the present specification. A liquid crystal being driven into a saturation state indicates a state (saturation state) in which a change in the electro-optical characteristics following change in the liquid crystal arrangement will not accompany a further increase of the applied voltage.

The timing signal is a signal used in order to sample the image signal input to the sampling circuit. The voltage of the timing signal input to the sampling circuit is then applied to a gate electrode of a TFT which structures the analog switch of the sampling circuit. This forms a channel in the TFT which structures the analog switch, and a current flows from the source to the drain. Thus the image signal is sampled, and this is supplied to the source of the pixel TFT through the source signal line.

For example, for the case of a 5 V drive TN (twisted nematic) liquid crystal, 5 V is the saturation voltage. An alternating current drives the liquid crystal, the result being that −5 V to +5 V, namely a 10 V voltage amplitude level, is applied to the liquid crystal. When the liquid crystal is driven in the saturation state, it is necessary to sample a 10 V image signal (in this case the image signal and the saturation voltage are equal) and supply that to the source of the pixel TFT.

In order to sample this image signal, it is necessary to apply a timing signal, with a voltage amplitude level that includes a certain fixed margin voltage (for example, ±3 V) in addition to the saturation voltage, to the gate of the TFT that structures the analog switch. In short, to sample an image signal voltage of −5 to +5 V, namely a 10 V voltage amplitude level image signal, it is necessary that the voltage amplitude level of the timing signal have the absolute value of −8 to 8 V, in other words a voltage amplitude level of 16 V.

The margin voltage is a voltage in order to reliably supply a saturation voltage image signal to the pixel TFT source. There is a problem in that the n-channel-type TFT which constitutes the analog switch does not operate with a ±5 V voltage amplitude level image signal and sampling does not occur, when sampling is attempted using a timing signal with the same ±5 V voltage amplitude level, which does not include a margin. This is because the voltage amplitude level (5 V) of the image signal applied to the source of the n-channel TFI that constitutes the analog switch, and the voltage amplitude level (5 V) of the timing signal applied to the gate electrode, have a voltage amplitude level difference of 0 V, and the n-channel type TFT does not operate. Further, a p-channel type TFT does not operate for the same reason. Due to this, it is necessary to have the timing signal include a margin voltage in order to drive the liquid crystal to the saturation state. It is necessary that the size of the margin voltage be large enough to sample the saturation voltage image signal in accordance with the timing signal, and to reliably supply the source signal line with the signal.

Additionally, in recent years the development of large screen, high definition liquid crystal display devices has been advancing. When considering display at the same frame rate, the more the number of pixels in a liquid crystal display device increases, the higher the speed at which it is necessary to operate the shift register circuit. There is a demand for a higher frequency drive of the shift register.

The operating speed of the shift register circuit is proportional to the mobility of the shift register circuit TFT, and to the voltage amplitude level of the clock signal applied to the source, and is inversely proportional to the square of the channel length. The reason that the operating speed of the shift register circuit is inversely proportional to the square of the channel length is that if the TFT channel length is short, the resistance becomes small, and the gate capacitance becomes small.

In order to operate the shift register circuit at higher speed, it is necessary to either make the shift register circuit power supply voltage large, or to shorten the channel length, because there is a limit to the extent of the TFT mobility.

However, if power supply voltage for the shift register circuit is made higher, and the channel length is made shorter, the TFT is easily damaged by punch through and hot electrons caused by the short channel effect. Therefore it is necessary to lower the shift register circuit power supply voltage to a level that does not cause damage to the TFT.

In addition, if the voltage amplitude level of the clock signal applied to the source is reduced to a level that will not damage the TFT due to punch through or hot electrons caused by a short channel effect of the shift register circuit TFT, and if the TFT channel length is made shorter, then the TFT can not be manufactured due to limits in the design of TFTs with short channels. For that reason, the shift resister circuit can not operate at a speed higher than a certain speed. Therefore, in order to operate the shift register circuit at higher speed, it is necessary to increase the channel length to a range in which it can be made, and to increase the clock signal voltage amplitude level applied to the source to a level at which the TFT, with a channel length which can be manufactured, will operate.

In short, in order to operate the shift register circuit at higher speed, it is necessary to reduce the shift register circuit power supply voltage to a level at which the shift register circuit TFT is not damaged due to punch through or hot electrons by short channel effect, and it is necessary to increase the shift register circuit power supply voltage to a level at which the manufacturable channel length TFT will operate.

In the conventional circuit structure of FIG. 21, the clock signals (CLK, CLKb) input to the shift register circuit TFT become the same voltage amplitude level as the timing signal input to the sampling circuit because there is no level shifter circuit in between the shift register circuit and the sampling circuit. In other words, the voltage amplitude level of the clock signals input to the shift register circuit cannot be reduced to a level at which damage due to punch through or hot electrons due to the short channel effect will not occur in the TFT that constitutes the shift register circuit. Therefore the shift register circuit TFT is easily damaged.

There is a solution path for the above problems by using a liquid crystal display device structured with a LCD material that can be driven with a relatively low voltage, smaller than 3 V. However, the reliability is low because the liquid crystal used has a voltage holding rate that is low, current leaks due to the voltage applied to the liquid crystals, and the liquid crystals easily deteriorate. LCD materials that can be driven with a voltage greater than 3 V have a relatively high voltage holding rate of over 95%, and the reliability of a liquid crystal display device that uses an LCD material driven with a voltage greater than 3 V is high.

Prior Art B

A block diagram of another example of the conventional source signal line side driving circuit 1801 is shown in FIG. 19B.

A clock signal CLK (for example, 10 V) input from external to the source signal line side driving circuit is directly input to the shift register circuit. Then the shift register circuit operates in accordance with the input clock signal and a start pulse signal input at the same time to the shift register circuit, and a timing signal is created in order to sample the image.

The created timing signal is input to the level shifter circuit, and the voltage amplitude level is increased. The timing signal with an increased voltage amplitude level is input to the sampling circuit, and the sampling circuit performs sampling of the image signal based on the input timing signal.

FIG. 22 shows an example of the specific circuit structure of FIG. 19B. A shift register circuit 21, a level shifter circuit 22, a sampling circuit 23, and an image signal line 24 are arranged as shown in the diagram.

A clock signal CLK, an inverted clock signal CLKb, a start pulse signal SP, and a drive direction switching signal SL/R are input to the shift register circuit 21 from the wirings shown in the drawing.

The clock signal CLK (for example, 10 V) is input to the level shifter circuit 21 from external to the source signal line side driving circuit. The voltage amplitude level of the input clock signal is a voltage amplitude level at which the shift register circuit 21 can operate.

The shift register circuit 21 operates in accordance with the input clock signal, and the start pulse signal input to the shift register circuit 21 at the same time, and a timing signal is created in order to sample the image. The created timing signal is input to the level shifter circuit 22.

It has already been stated that in order to drive the liquid crystal in a saturation state, it is necessary to input a timing signal which has a voltage amplitude level that includes a certain fixed margin voltage in addition to the saturation voltage, to the sampling circuit 23. Therefore, if the voltage amplitude level of the timing signal input to the sampling circuit 23 does not meet the voltage amplitude level that includes a certain fixed margin voltage in addition to the saturation voltage, it is necessary to increase the voltage amplitude level of the timing signal. The timing signal input to the level shifter circuit 22 is increased to a voltage amplitude level that includes a certain fixed margin voltage in addition to the saturation voltage (for example, 16 V), and then output. The output timing signal is then input to the sampling circuit 23.

In order to operate the shift register circuit at high-speed, it is necessary to reduce the power supply voltage of the shift register circuit to a level that does not cause damage to the TFT of the shift register circuit 21 from punch through or hot electrons due to the short channel effect. It is also necessary to increase the power supply voltage of the shift register circuit to a level at which the TFT, with a manufacturable channel length, will operate. However, with the circuit structure of Prior Art B, if the voltage amplitude level of the clock signal, input from external to the source signal line side driving circuit, is increased to a high voltage, to a voltage amplitude level at which the shift register circuit can operate at high-speed, it is difficult to suppress the voltage amplitude level of the clock signal, input from external to the source signal line side driving circuit, to a level at which unwanted radiation does not become a problem. Further, the higher the voltage amplitude level of the clock signal input from external to the source signal line side driving circuit becomes, the larger the power consumption, which is not desirable.

There is a solution path for the above problems by using a liquid crystal display device structured with a LCD material that can be driven with a relatively low voltage, smaller than 3 V. However, the reliability is low because the liquid crystal used has a voltage holding rate that is low, current leaks due to the voltage applied to the liquid crystals, and the liquid crystals easily deteriorate. LCD materials that can be driven with a voltage greater than 3 V have a relatively high voltage holding rate of over 95%, and the reliability of a liquid crystal display device that uses an LCD material driven with a voltage greater than 3 V is high.

Prior Art C

A block diagram of another example of the conventional source signal line side driving circuit 1801 is shown in FIG. 19C.

A clock signal CLK (for example, 9 V) from external to the source signal line side driving circuit is input to the shift register circuit. Then the shift register circuit operates in accordance with the input clock signal and a start pulse signal input at the same time to the shift register circuit, and a timing signal is created in order to sample the image. The sampling circuit operates based on the timing signal, and the image signal is sampled.

FIG. 23 shows an example of the specific circuit structure shown in the block diagram of FIG. 19C. A shift register circuit 31, a sampling circuit 32, and an image signal line 33 are arranged as shown in the diagram.

A clock signal CLK, an inverted clock signal CLKb, a start pulse signal SP, and a drive direction switching signal SL/R are input to the shift register circuit 31 from the wirings shown in the drawing.

The clock signal CLK (for example, 9 V) is input to the shift register circuit 31 from external to the source signal line side driving circuit.

The shift register circuit 31 operates in accordance with the input clock signal, and the start pulse signal input to the shift register circuit 31 at the same time, and creates in order a timing signal for sampling the image. The created timing signal is input to the sampling circuit 32.

It is self-evident that the Prior Art C possesses the drawbacks of both Prior Art A and Prior Art B. If the liquid crystals are driven in the saturation state, the TFT of the shift register circuit is easily damaged due to punch through and hot electrons resulting from the short channel effect, so there is a problem that the channel length cannot be shortened and therefore high-speed operation is not possible.

Further, with the circuit structure of Prior Art C, at the point of input from external to the source signal line side driving circuit, the voltage amplitude level of the clock signal is a voltage amplitude level that includes a certain fixed margin voltage in addition to the saturation voltage. Therefore this cannot be suppressed enough to avoid the problems of unwanted radiation and power consumption.

There is a solution path for the above problems by using a liquid crystal display device structured with a LCD material that can be driven with a relatively low voltage, smaller than 3 V. However, the reliability is low because the liquid crystal used has a voltage holding rate that is low, current leaks due to the voltage applied to the liquid crystals, and the liquid crystals easily deteriorate. LCD materials that can be driven with a voltage greater than 3 V have a relatively high voltage holding rate of over 95%, and the reliability of a liquid crystal display device that uses an LCD material driven with a voltage greater than 3 V is high.

Prior Art D

A block diagram a conventional gate signal line side driving circuit is shown in FIG. 24A.

A clock signal CLK (for example, 3 V) from external to the gate signal line side driving circuit is input to the level shifter circuit. The voltage amplitude level of the clock signal must be a voltage amplitude level at which it is possible for the level shifter circuit to operate.

The voltage amplitude level of the clock signal input to the level shifter circuit is increased (for example, from 3 V to 25 V).

It is necessary the voltage amplitude level of the selection signal input to the gate signal lines be a voltage amplitude level at which it is possible to reliably drive all of the pixel TFTs connected to the selected gate signal line. The selected signal voltage is applied to the gate electrodes of the pixel TFTs connected to the gate signal line, forming channels in the pixel TFTs. Thus a current flows from the source to the drain of the pixel TFTs, and the image signal is supplied to the liquid crystals, and the liquid crystals are driven.

The gate signal line has a long wiring and the wiring resistance is high, so there is a voltage drop when the selection signal input to the gate signal line is applied to the pixel TFT farthest away. The more the voltage drops, the more the voltage applied to the pixel TFT gate electrode becomes smaller, and in the worst case a channel cannot be formed in the pixel TFT.

To supply a pixel signal to the liquid crystals by reliably driving all of the pixel TFTs, the voltage amplitude level of the selection signal input to the gate signal line must be increased to a voltage amplitude level that includes a certain fixed margin voltage in addition to the image signal voltage amplitude level. Also, it is necessary for the selection signal to have a high voltage amplitude level, to a degree which the voltage drop due to the wiring resistance of the gate wiring will not become a problem.

The margin voltage is a voltage in order that an image signal with a voltage amplitude level that is the same as the saturation voltage is reliably supplied to the pixel electrode of the liquid crystal cell. It is necessary that the margin voltage have a size such that a saturation voltage image signal will reliably be supplied to the pixel electrode.

The increased voltage amplitude level clock signal (for example, 25 V) is input to the shift register circuit. The shift register circuit operates in accordance with the input clock signal and a start pulse signal input to the shift register circuit at the same time, and a selection signal is created in order to operate the pixel TFTs. The created selection signal is input to the gate signal line, channels are formed in the pixel TFTs, and the image signal is supplied to the liquid crystals.

It is not necessary to operate the shift register circuit at as high a speed for the gate signal line side driving circuit as it is for the source signal line side driving circuit. As stated above, the TFT operation speed is inversely proportional to the square of the channel length. The TFT channel length on the shift register circuit is longer on the gate signal line side driving circuit than on the source signal line side driving circuit, which has an operating speed slower than the source signal line side driving circuit, and it is difficult for damage to occur from punch through or hot electrons due to the short channel effect.

However, in recent years the development of large screen, high definition liquid crystal display devices has been advancing, as stated above. When considering display at the same frame rate, the more the number of pixels in a liquid crystal display device increases, the higher the speed at which it is necessary to operate the shift register circuit on the gate signal line side driving circuit, as in the source signal line side driving circuit. Accordingly, there is a demand for a higher frequency drive of the shift register in the gate signal line side driving circuit.

Then the increased voltage amplitude level clock signal is input to the shift register circuit. The shift register circuit operates in accordance with the input clock signal and a start pulse signal input at the same time to the shift register circuit, and a selection signal is created in order to reliably operate the pixel TFTs. The created selection signal is input to the gate signal lines.

It is self-evident that the Prior Art D possesses the same drawbacks as Prior Art A. With Prior Art D, in order to make it possible to reliably drive all of the pixel TFTs, it is difficult to reduce the voltage amplitude level of the selection signal input to the shift register circuit to an extent at which the shift register circuit TFT will not be damaged from punch through or hot electrons due to the short channel effect.

There is a solution path for the above problems by using a liquid crystal display device structured with a LCD material that can be driven with a relatively low voltage, smaller than 3 V. However, the reliability is low because the liquid crystal used has a voltage holding rate that is low, current leaks due to the voltage applied to the liquid crystals, and the liquid crystals easily deteriorate. LCD materials that can be driven with a voltage greater than 3 V have a relatively high voltage holding rate of over 95%, and the reliability of a liquid crystal display device that uses an LCD material driven with a voltage greater than 3 V is high.

Prior Art E

A block diagram of another example of a conventional gate signal line side driving circuit is shown in FIG. 24B.

A clock signal CLK (for example, 10 V) input from external to the gate signal line side driving circuit is input directly to the shift register circuit. The input clock signal has a voltage amplitude level at which it is possible for the shift register circuit to operate. The shift register circuit operates in accordance with the input clock signal and a start pulse signal input to the shift register circuit at the same time, and a selection signal is created in order to operate the pixel TFTs.

The created selection signal is input to the level shifter circuit, and the voltage amplitude level thereof is increased to a voltage amplitude level at which it is possible to reliably operate all of the pixel TFTs (for example, from 10 V to 30 V). The increased voltage amplitude level selection signal is then supplied to the gate signal lines.

It is self-evident that the Prior Art E possesses the same drawbacks as Prior Art B. With Prior Art B, if the input clock signal is given a voltage amplitude level at which high-speed operation of the shift register circuit is possible, then it is difficult to reduce it to a degree at which unwanted radiation will not become a problem. In addition, as stated above, there is a problem of not being capable of suppressing the power consumption.

There is a solution path for the above problems by using a liquid crystal display device structured with a LCD material that can be driven with a relatively low voltage, smaller than 3 V. However, the reliability is low because the liquid crystal used has a voltage holding rate that is low, current leaks due to the voltage applied to the liquid crystals, and the liquid crystals easily deteriorate. LCD materials that can be driven with a voltage greater than 3 V have a relatively high voltage holding rate of over 95%, and the reliability of a liquid crystal display device that uses an LCD material driven with a voltage greater than 3 V is high.

Prior Art F

A block diagram of another example of a conventional gate signal line side driving circuit is shown in FIG. 24C.

A clock signal CLK (for example, 20 V) from external to the gate signal line side driving circuit is input to the shift register circuit. At this point, the voltage amplitude level of the input clock signal has the necessary selection signal voltage amplitude level to drive the liquid crystals in the saturation state.

The shift register circuit then operates in accordance with the clock signal input to the shift register circuit and a start pulse signal input to the shift register circuit at the same time, and a selection signal is created in order to operate the pixel TFTs. The created selection signal is input to the gate signal lines.

It is self-evident that the Prior Art F possesses the same drawbacks as Prior Art C. If all of the pixel TFTs are to be reliably driven, the channel length cannot be shortened because the shift register circuit TFT is easily damaged by punch through and hot electrons due to the short channel effect, and therefore there is a problem of not being cable of operating at high-speed.

There is a solution path for the above problems by using a liquid crystal display device structured with a LCD material that can be driven with a relatively low voltage, smaller than 3 V. However, the reliability is low because the liquid crystal used has a voltage holding rate that is low, current leaks due to the voltage applied to the liquid crystals, and the liquid crystals easily deteriorate. LCD materials that can be driven with a voltage greater than 3 V have a relatively high voltage holding rate of over 95%, and the reliability of a liquid crystal display device that uses an LCD material driven with a voltage greater than 3 V is high.

The problem points from Prior Arts A to F are brought together below. A liquid crystal display device which can be driven at a relatively low voltage below 3V, the voltage holding rate is low, there is a current leak due to the voltage applied to the liquid crystals, and the liquid crystals easily deteriorate, so the reliability is low. Thus it is desirable to increase the liquid crystal display device reliability by using a display device with a high voltage holding rate and driven with a relatively high voltage. However, if the liquid crystals are driven to a saturation state by a conventional source signal line side driving circuit when a liquid crystal display device driven by a relatively high voltage is used, then the shift register circuit TFT is easily damaged by punch through and hot electrons due to the short channel effect. Further, the change to large scale display panels in recent years has brought with it the demand for high-speed operation of the shift register circuit. However, if the power consumption and the unwanted radiation with a conventional source signal line side driving circuit are suppressed, high-speed operation of the shift register circuit is difficult, and the demands accompanying large screens cannot be met.

Similarly for the gate signal line side driving circuit, if all of the pixel TFTs are to be reliably driven, the shift register circuit TFT is easily damaged by punch through and hot electrons due to the short channel effect. If the power consumption and the unwanted radiation are suppressed, then high-speed operation of the shift register circuit is difficult, and the demands accompanying large screens cannot be met.

There is a demand for the realization of a driving circuit that can drive without these types of problems, and for a high reliability semiconductor display device which has the driving circuit.

SUMMARY OF THE INVENTION

Thus an object of the present invention is to realize a driving circuit in which a voltage amplitude level of a clock signal input to a shift register circuit is set to obtain the voltage and channel length suitable for driving the shift register circuit at high-speed. By doing so, another object of the invention is to realize a high-speed operation driving circuit, and a semiconductor display device having the driving circuit, with which even if liquid crystals are driven in a saturation state, or even if all of the pixel TFTs are reliably operated, the shift register circuit will not be damaged. Further, another object of the invention is to make high-speed operation of the shift register circuit possible even if the voltage amplitude level of the clock signal, input from external to the driving circuit, is suppressed to a level at which power consumption and unwanted radiation do not become problems.

In the present invention, the voltage amplitude level of the clock signal input from external to the driving circuit is increased by a level shifter circuit, and the clock signal is then input to the shift register circuit. A timing signal created by the shift register circuit is additionally input to the level shifter circuit. The voltage amplitude level is increased in two stages.

As such, by arranging a level shifter circuit before and after the shift register circuit, the present invention reduces the shift register circuit power supply voltage so that the shift register circuit TFT is not damaged by punch through or hot electrons due to the short channel effect. Further, the shift register circuit is operated such that the channel length of the shift register circuit TFT is lengthened to an extent at which it can be formed, is and the voltage amplitude level of the clock signal applied to the TFT source is increased to the level at which the TFT operates. Thus, even if the liquid crystals are driven in the saturation state, and even if all of the pixel TFTs are reliably operated, the shift register circuit is not damaged, a driving circuit which operates at high-speed, and a semiconductor display device which contains the driving circuit are provided. In addition, a semiconductor device having a driving circuit with which it is possible to suppress power consumption and unwanted radiation, to such an extent that they do not become problems even when the shift register circuit is operated at high speed, is provided.

The structure of the present invention is explained below.

In accordance with a preferred embodiment of the present invention, there is provided a source signal line side driving circuit having a first level shifter circuit, a second level shifter circuit, a shift register circuit, and a sampling circuit, characterized in that:

the first level shifter circuit increases the voltage of an input signal, which is input to the first level shifter circuit from external to the source signal line side driving circuit, to a voltage amplitude level at which it is possible for the shift register circuit to operate, and inputs the result to the shift resister circuit;

the shift register circuit creates a timing signal, based on the input signal input from the first level shifter circuit, in order to sample an image signal supplied from external to the source signal line side driving circuit, and inputs the created timing signal to the second level shifter circuit;

the second level shifter circuit further increases the voltage amplitude level of the input timing signal, and inputs the result to the sampling circuit; and the sampling circuit samples the image signal in accordance with the input timing signal, and supplies the result to source signal lines connected to the source signal line side driving circuit. Thus the above objects of the present invention are achieved.

In addition, in accordance with another preferred embodiment of the present invention, there is provided a source signal line side driving circuit having a first level shifter circuit, a second level shifter circuit, a shift register circuit, and a sampling circuit, characterized in that:

the first level shifter circuit increases the voltage of a clock signal, which is input to the first level shifter circuit from external to the source signal line side driving circuit and has a voltage amplitude level at which it is possible for the first level shifter circuit to operate, to a voltage amplitude level at which it is possible for the shift register circuit to operate, and inputs the result to the shift register circuit;

the shift register circuit creates a timing signal, based on the clock signal input to the shift register circuit, in order to sample an image signal supplied from external to the source signal line side driving circuit, and inputs the created timing signal to the second level shifter circuit;

the second level shifter circuit increases the voltage amplitude level of the timing signal input to the second level shifter circuit, to a voltage amplitude level that includes a certain fixed margin voltage in addition to the saturation voltage of a liquid crystal, and inputs the result to the sampling circuit; and the sampling circuit samples the image signal in accordance with the timing signal input to the sampling circuit, and supplies the result to source signal lines connected to the source signal line side driving circuit. Thus the above objects of the present invention are achieved.

In addition, in accordance with another preferred embodiment of the present invention, there is provided a gate signal line side driving circuit having a first level shifter circuit, a second level shifter circuit, and a shift register circuit, characterized in that:

the first level shifter circuit increases the voltage of an input signal, which is input from external to the gate signal line side driving circuit, to a voltage amplitude level at which it is possible for the shift register circuit to operate, and inputs the result to the shift register circuit;

the shift register circuit creates a selection signal, based on the input signal which is input to the shift register circuit, and inputs the created selection signal to the second level shifter circuit; and the second level shifter circuit increases the voltage amplitude level of the input selection signal, to a voltage amplitude level at which it is possible for all pixel TFTs connected to gate signal lines to reliably operate, and either directly, or through a buffer circuit, supplies the increased voltage selection signal to the gate signal lines. Thus the above objects of the present invention are achieved.

In addition, in accordance with another preferred embodiment of the present invention, there is provided a gate signal line side driving circuit having a first level shifter circuit, a second level shifter circuit, and a shift register circuit, characterized in that:

the first level shifter circuit increases the voltage of a clock signal, which is input to the first level shifter circuit from external to the gate signal line side driving circuit and has a voltage amplitude level at which it is possible for the first level shifter circuit to is operate, to a voltage amplitude level at which it is possible for the shift register circuit to operate, and inputs the result to the shift register circuit;

the shift register circuit, based on the clock signal input to the shift register circuit, creates a selection signal which operates pixel TFTs connected to the gate signal line side driving circuit through gate signal lines, and inputs the created selection signal to the second level shifter circuit; and the second level shifter circuit increases the voltage amplitude level of the selection signal input to the second level shifter circuit, to a voltage amplitude level at which it is possible for all of the pixel TFTs connected to the gate signal lines to reliably operate, and supplies the selection signal, which has been increased in voltage by the second level shifter circuit, to the gate signal lines. Thus the above objects of the present invention are achieved.

In addition, in accordance with another preferred embodiment of the present invention, there is provided a semiconductor display device having:

a pixel region in which a plurality of pixel TFTs are arranged in a matrix state;

a plurality of source signal lines which are connected to source electrodes of the multiple number of pixel TFTs, respectively;

a plurality of gate signal lines which are connected to gate electrodes of the plurality of pixel TFTs, respectively;

a source signal line side driving circuit connected to the plurality of source signal lines; and a gate signal line side driving circuit connected to the plurality of gate signal lines, characterized in that:

the source signal line side driving circuit has a first level shifter circuit, a second level shifter circuit, a shift register circuit, and a sampling circuit;

the first level shifter circuit increases the voltage of a clock signal, which is input to the first level shifter circuit from external to the source signal line side driving circuit and has a voltage amplitude level at which it is possible for the first level shifter circuit to operate, to a voltage amplitude level at which it is possible for the shift register circuit to operate, and inputs the result to the shift register circuit;

the shift register circuit creates a timing signal, based on the clock signal input to the shift register circuit, in order to sample an image signal supplied from external to the source signal line side driving circuit, and inputs the created timing signal to the second level shifter circuit;

the second level shifter circuit increases the voltage amplitude level of the timing signal input to the second level shifter circuit, to a voltage amplitude level that includes a certain fixed margin voltage in addition to the saturation voltage of a liquid crystal, and inputs the result to the sampling circuit; and the sampling circuit samples the image signal in accordance with the timing signal input to the sampling circuit, and supplies the result to the source signal lines. Thus the above objects of the present invention are achieved.

The source signal line side driving circuit may be formed with the pixel region on the same substrate.

In addition, in accordance with another preferred embodiment of the present invention, there is provided a semiconductor display device having:

a pixel region in which a plurality of pixel TFTs are arranged in a matrix state;

a plurality of source signal lines which are connected to source electrodes of the plurality of pixel TFTs, respectively;

a plurality of gate signal lines which are connected to gate electrodes of the plurality of pixel TFTs, respectively;

a source signal line side driving circuit connected to the plurality of source signal lines; and a gate signal line side driving circuit connected to the plurality of gate signal lines, characterized in that:

the gate signal line side driving circuit has a first level shifter circuit, a second level shifter circuit, and a shift register circuit;

the first level shifter circuit increases the voltage of a clock signal, which is input to the first level shifter circuit from external to the gate signal line side driving circuit and has a voltage amplitude level at which it is possible for the first level shifter circuit to operate, to a voltage amplitude level at which it is possible for the shift register circuit to operate, and inputs the result to the shift register circuit;

the shift register circuit, based on the clock signal input to the shift register circuit, creates a selection signal which operates the pixel TFTs connected to the gate signal line side driving circuit through the gate signal lines, and inputs the created selection signal to the second level shifter circuit; and the second level shifter circuit increases the voltage amplitude level of the selection signal input to the second level shifter circuit, to a voltage amplitude level at which it is possible for all of the pixel TFTs connected to the gate signal lines to reliably operate, and supplies the selection signal, which has been increased in voltage by the second level shifter circuit, to the gate signal lines. Thus the above objects of the present invention are achieved.

The gate signal line side driving circuit may be formed with the pixel region on the same substrate.

In addition, in accordance with another preferred embodiment of the present invention, there is provided a semiconductor display device having:

a pixel region in which a plurality of pixel TFTs are arranged in a matrix state;

a plurality of source signal lines which are connected to source electrodes of the plurality of pixel TFTs, respectively;

a plurality of gate signal lines which are connected to gate electrodes of the plurality of pixel TFTs, respectively a source signal line side driving circuit connected to the plurality of source signal lines; and a gate signal line side driving circuit connected to the plurality of gate signal lines, characterized in that:

the source signal line side driving circuit has a first level shifter circuit, a second level shifter circuit, a first shift register circuit, and a first sampling circuit;

the first level shifter circuit increases the voltage of a clock signal, which is input to the first level shifter circuit from external to the source signal line side driving circuit and has a voltage amplitude level at which it is possible for the first level shifter circuit to operate, to a voltage amplitude level at which it is possible for the first shift register circuit to operate, and inputs the result to the first shift register circuit;

the first shift register circuit creates a timing signal, based on the clock signal input to the first shift register circuit, in order to sample an image signal supplied from external to the source signal line side driving circuit, and inputs the created timing signal to the second level shifter circuit;

the second level shifter circuit increases the voltage amplitude level of the timing signal input to the second level shifter circuit, to a voltage amplitude level that includes a certain fixed margin voltage in addition to the saturation voltage of a liquid crystal, and inputs the result to the first sampling circuit;

the first sampling circuit samples the image signal in accordance with the timing signal input to the first sampling circuit, and supplies the result to the source signal lines;

the gate signal line side driving circuit has a third level shifter circuit, a fourth level shifter circuit, and a second shift register circuit;

the third level shifter circuit increases the voltage of a clock signal, which is input to the third level shifter circuit from external to the gate signal line side driving circuit and has a voltage amplitude level at which it is possible for the third level shifter circuit to operate, to a voltage amplitude level at which it is possible for the second shift register circuit to operate, and inputs the result to the second shift register circuit;

the second shift register circuit, based on the clock signal input to the second shift register circuit, creates a selection signal which operates the pixel TFTs connected to the gate signal line side driving circuit through the gate signal lines, and inputs the created selection signal to the fourth level shifter circuit; and the fourth level shifter circuit increases the voltage amplitude level of the selection signal input to the fourth level shifter circuit, to a voltage amplitude level at which it is possible for all of the pixel TFTs connected to the gate signal lines to reliably operate, and supplies the selection signal, which has been increased in voltage by the fourth level shifter circuit, to the gate signal lines. Thus the above objects of the present invention are achieved.

The source signal line side driving circuit and the gate signal line side driving circuit may be formed with the pixel region on the same substrate.

In addition, in accordance with another preferred embodiment of the present invention, there is provided a driving circuit for a semiconductor display device of digital drive system, the driving circuit having a first level shifter circuit, a second level shifter circuit, a third level shifter circuit, a first latch circuit, a second latch circuit, a shift register circuit, and a D/A converter circuit, the driving circuit characterized in that:

the first level shifter circuit increases the voltage of an input signal, which is input to the first level shifter circuit from external to the driving circuit, to a voltage amplitude level at which it is possible for the shift register circuit to operate, and inputs the result to the shift register circuit;

the shift register circuit creates a timing signal, based on the input signal input from the first level shifter, which determines the timing for writing a digital signal, supplied from external to the driving circuit, to the first latch circuit, and inputs the result to the first latch circuit;

the digital signal is input to the third level shifter circuit, and a digital signal output from the third level shifter circuit is input to the first latch circuit at the timing determined by the timing signal;

the digital signal input to the first latch circuit, after logical operation, undergoes logical operation in the second latch circuit, and is output; and the output digital signal is input to the D/A converter circuit, through the second level shifter circuit, and is converted to analog. Thus the above objects of the present invention are achieved.

BRIEF DESCRIPTION OF THE DRAWINGS

In the accompanying drawings:

FIG. 11 is a block diagram of a gate signal line side driving circuit of the present invention;

FIGS. 19A to 19C are block diagrams of conventional source signal line side driving circuits;

FIGS. 24A to 24C are block diagrams of conventional source signal line side driving circuits;

DETAILED DESCRIPTION OF THE PREFERRED EMBODIMENTS

Figure 1:
FIG. 1 is a block diagram of a source signal line side driving circuit of the present invention.

A source signal line side driving circuit is taken as an example of the driving circuit of the present invention and explained. First, a block diagram of the structure of the source signal line side driving circuit is shown in FIG. 1.

A clock signal CLK is input to the source signal line side driving circuit from external to the source signal line side driving circuit.

The input clock signal is input to a first level shifter circuit, and the voltage amplitude level thereof is increased. Then the clock signal, which has a voltage amplitude level increased by the first level shifter circuit, is input to a shift register circuit. The shift register circuit operates based on the input clock signal, and in accordance with a start pulse signal input to the shift register circuit at the same time, and a timing signal for sampling an image is created in order.

The timing signal is input to a second level shifter circuit, and the voltage amplitude level is increased again. A sampling circuit operates based on the timing signal with a voltage amplitude level increased by the second level shifter circuit, and an image signal is sampled. The sampled image signal is supplied to source signal lines, and input to the sources of pixel TFTs.

Figure 2:
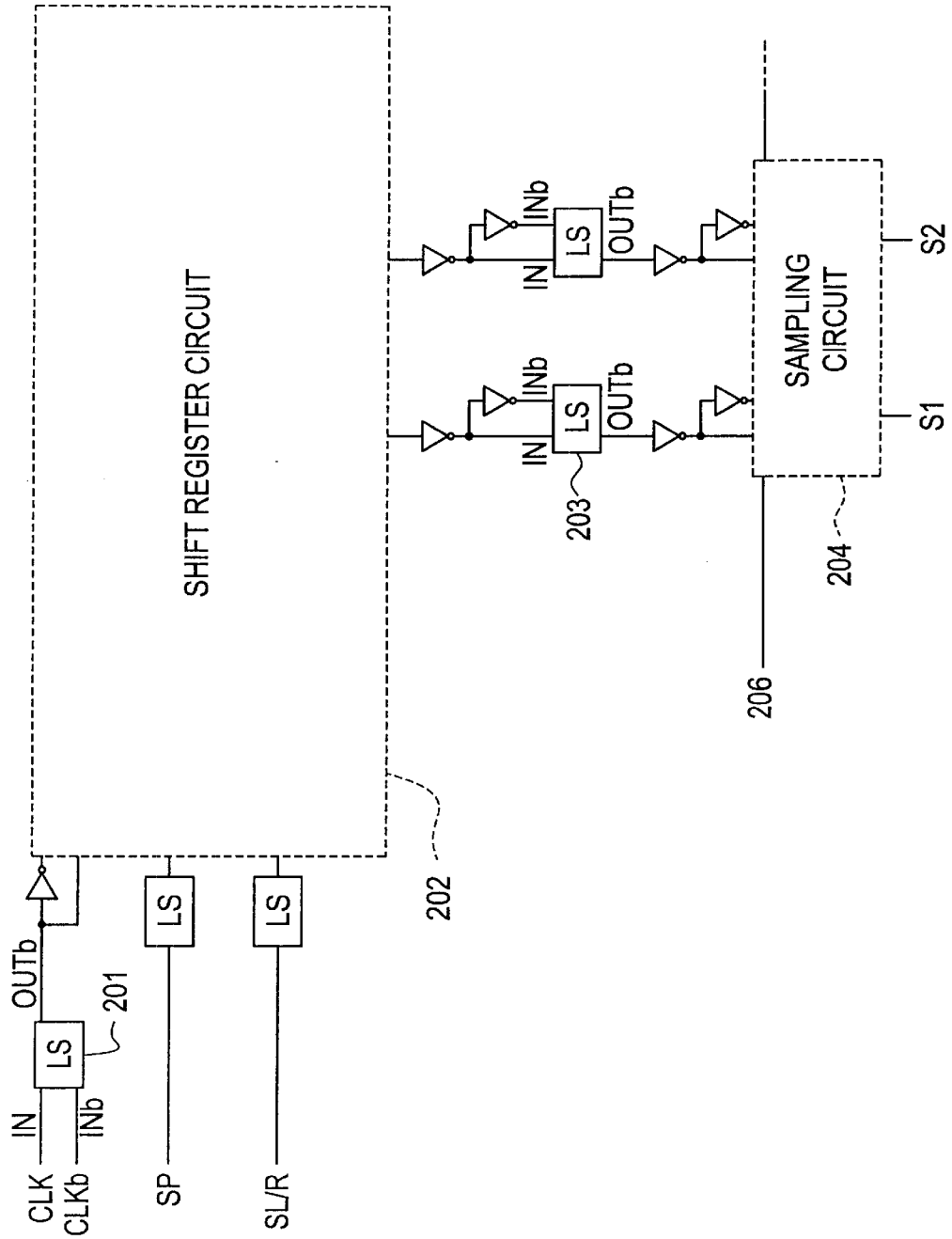
FIG. 2 is a circuit diagram of a source signal line side driving circuit of the present invention.

FIG. 2 shows an example of the circuit structure in the block diagram shown in FIG. 1.

Clock signals CLK and CLKb are input to a first level shifter circuit 201 from external to the source signal line side driving circuit. The voltage amplitude level of the clock signal needs to be as low as possible in the range in which the first level shifter circuit 201 can operate, in order to suppress unwanted radiation to an extent that it does not become a problem. It is also necessary in order to limit power consumption.

The clock signals input to the first level shifter circuit 201 have their voltages increased and then are output. It is necessary to increase the clock signal voltage amplitude levels at this time to an extent at which a TFT of a shift register circuit 202 is not damaged by punch through or hot electrons due to the short channel effect, and moreover to an extent at which a TFT which has a manufacturable channel length will operate.

The clock signals, which have increased voltage amplitude levels due to the first level shifter circuit 201, are input to the shift register circuit 202. Further, a start pulse signal SP, with a voltage amplitude level increased by a level shifter circuit, is input to the shift register circuit 202. The shift register circuit 202 begins operation of creating a timing signal, based on the clock signals input to the shift register circuit 202, and in accordance with a start pulse signal input to the shift register circuit at the same time. The timing signal determines the sampling timing of an image signal to pixel TFTs corresponding to source signal lines S1 and S2. The timing signal created by the shift register circuit 202 is input to a second level shifter circuit 203.

The voltage of the timing signal input to the second level shifter circuit 203 is increased. An image signal with a voltage amplitude level which drives the liquid crystals in the saturation state (saturation voltage) is sampled, so it is necessary to increase the voltage of the timing signal at this point to a voltage amplitude level that includes a certain fixed margin voltage in addition to the saturation voltage.

The margin voltage is used in order to reliably supply a saturation voltage image signal to the pixel TFT sources. It is necessary that the size of the margin voltage be large enough that the saturation voltage image signal is sampled in accordance with the timing signal, and reliably supplied to the source signal lines S1 and S2.

The timing signal, with its voltage increased by the second level shifter circuit 203, is input to a sampling circuit 204.

The sampling circuit 204 is an aggregate of analog switches connected to each of the source lines S1 and S2. When the timing signal is input to the sampling circuit 204, the timing signal voltage is applied to gate electrodes of the TFTs that constitute the analog switches of the sampling circuit 204. Thus channels are formed in the TFTs which comprise the analog switches, and a current flows from the sources to the drains. Therefore the image signal is sampled, and supplied to the pixel TFTs through the source signal lines S1 and S2.

In the present invention, by arranging level shifter circuits both before and after the shift register circuit, the shift register circuit TFT is not damaged due to punch through or hot electrons caused by the short channel effect. Furthermore, by using a clock signal with a voltage amplitude level at which a TFT with a manufacturable channel length operates, the shift register circuit can be operated. As a result, high-speed operation can be performed without damage to the shift register circuit, and it is possible to drive the liquid crystals to a saturation state. In addition, even if the voltage amplitude level of the clock signal input from external to the source signal line side driving circuit is reduced as much as possible within the range in which the level shifter circuit can operate, high-speed operation of the shift register circuit is possible, so power consumption and unwanted radiation can be suppressed to such an extent that they do not become problems.

A driving circuit of the present invention, and a semiconductor device which has the driving circuit, are explained in detail using FIGS. 3 to 17B by embodiments below.

EMBODIMENT 1

Figure 3:
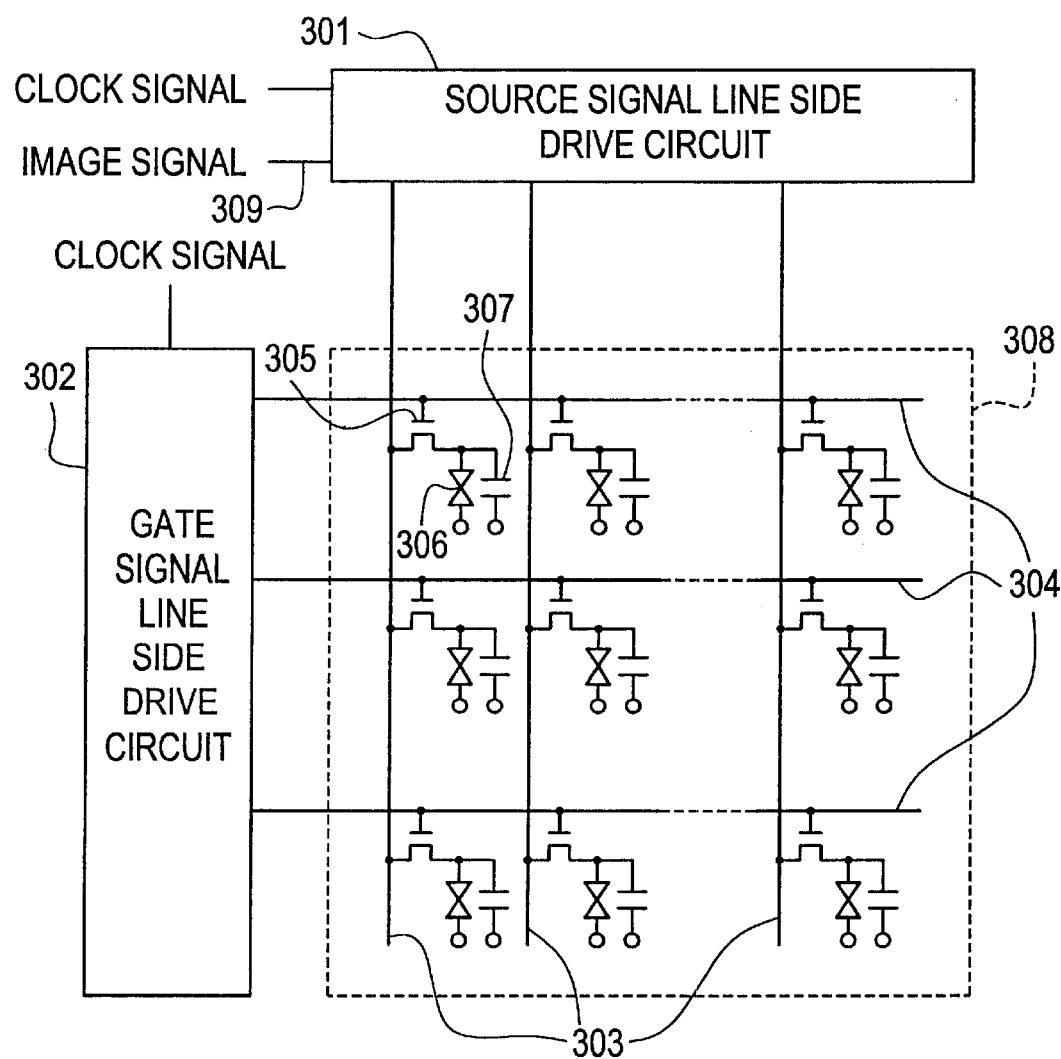
FIG. 3 is an outline diagram of an active matrix display device.

An example of a source signal line side driving circuit using the structure of the present invention, in which, by arranging level shifter circuits before and after a shift register circuit, the voltage amplitude level of a signal is increased in two stages, before and after the shift register circuit, is shown in Embodiment 1. The structure of a semiconductor device of Embodiment 1, in particular an active matrix type liquid crystal display device, is shown in FIG. 3.

A source signal line side driving circuit 301 and a gate signal line side driving circuit 302 are formed in unity on the same substrate as a pixel region which constitutes a pixel region 308.

In addition, a plurality of source signal lines 303 connected to the source signal line side driving circuit 301, and a plurality of gate signal lines 304, connected to the gate signal line side driving circuit 302, intersect in the pixel region 308. Formed in the region enclosed by each of the source signal lines 303 and each of the gate signal lines 304 are a liquid crystal cell 306, in which a liquid crystal is sandwiched by a pixel electrode and an opposing electrode, a storage capacitor 307, and one out of a plurality of pixel TFTs 305 connected to the source signal lines 303 and the gate signal lines 304.

An image signal input to the source signal lines 303 is selected by the pixel TFTs 305, and written to preset pixel electrodes.

The image signal, sampled in accordance with a timing signal output from the source signal line side driving circuit 301, is supplied to the source signal lines 303 by a sampling circuit.

The pixel TFTs 305 operate in accordance with the selection signal output from the gate signal line side driving circuit 302 through the gate signal lines 304.

Figure 4:
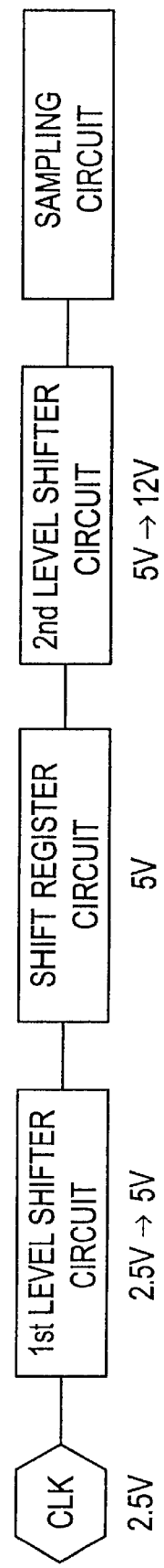
FIG. 4 is a block diagram of a source signal line side driving circuit of the present invention.

Next, a block diagram of the source signal line side driving circuit of Embodiment 1 is shown in FIG. 4. A liquid crystal with a saturation voltage of 5 V is used in Embodiment 1. A clock signal CLK, with a voltage amplitude level of 2.5 V and from external to the source signal line side driving circuit, is input to a first level shifter circuit of the source signal line side driving circuit. The voltage amplitude level of the clock signal input to the first level shifter circuit needs to be as low as possible, within the range in which the first level shifter circuit can operate, in order to suppress unwanted radiation to an extent where it does not become a problem. This is also necessary in order to reduce power consumption.

The voltage amplitude level of the clock signal input to the first level shifter circuit is increased (made higher voltage) by the first level shifter circuit, from 2.5 V to 5 V in Embodiment 1, and the result is input to the shift register circuit.

The voltage amplitude level of the clock signal input to the shift register circuit is required to be a voltage amplitude level that is within the range in which the shift register circuit can operate. The shift register circuit can operate at 5 V in Embodiment 1. For example, in order to operate the shift register circuit of the source signal line side driving circuit at 12.5 MHz or greater in Embodiment 1, when configured by a TFT with a 2 μm channel length, it is necessary for the voltage amplitude level of the clock signal input to the shift register circuit to be 4 V or greater. The voltage amplitude level is increased to 5 V in Embodiment 1, but the voltage amplitude level is not limited to this number for the present invention. A necessary condition is that the voltage amplitude level of the clock signal input to the shift register circuit be within the range in which the shift register circuit can operate. Further, the level shifter circuit may be used for signals other than just the clock signal, such as a start pulse signal.

The 5 V voltage amplitude level clock signal output from the level shifter circuit is input to the shift register circuit. The shift register circuit operates based on the clock signal input to the shift register circuit, and in accordance with the start pulse signal input to the shift register circuit at the same time, and creates a timing signal in order to sample the image signal supplied from an image signal line. The created timing signal is input to a second level shifter circuit.

The voltage amplitude level of the timing signal input to the second level shifter circuit is increased by the second level shifter circuit. It is necessary for the timing signal to be increased to a voltage amplitude level that includes a certain fixed margin voltage in addition to the saturation voltage. The timing signal input to the second level shifter circuit at 5 V is increased to 12 V, and the 12 V timing signal is input to the sampling circuit. The sampling circuit performs a sampling operation on the image signal supplied from the image signal lines in accordance with the timing signal input to the sampling circuit.

The sampled image signal is supplied to the source signal lines, and is input to the pixel TFTs connected to the source signal lines, operating the liquid crystals.

Figure 5:
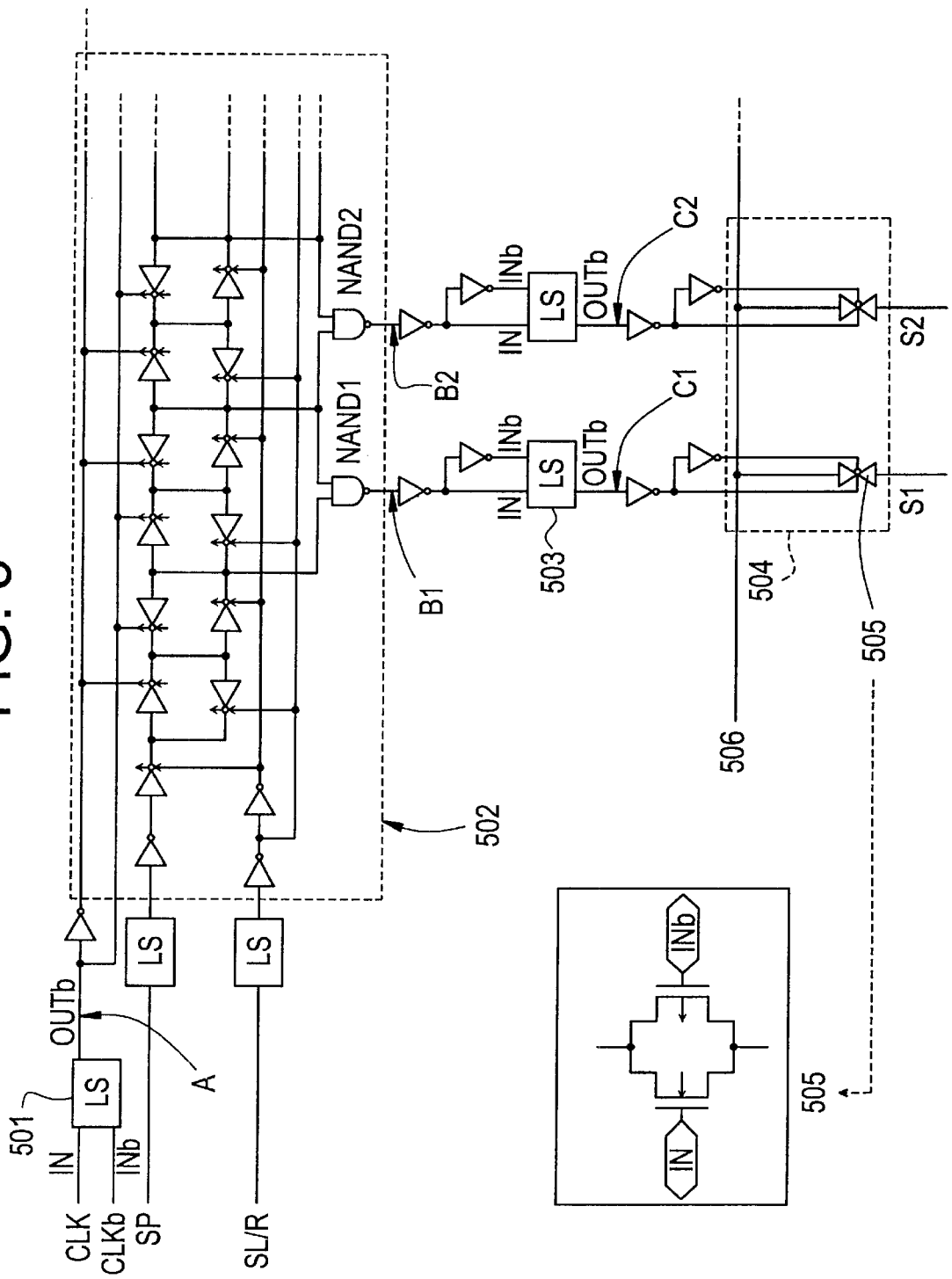
FIG. 5 is a circuit diagram of a source signal line side driving circuit of the present invention.
Figure 6:
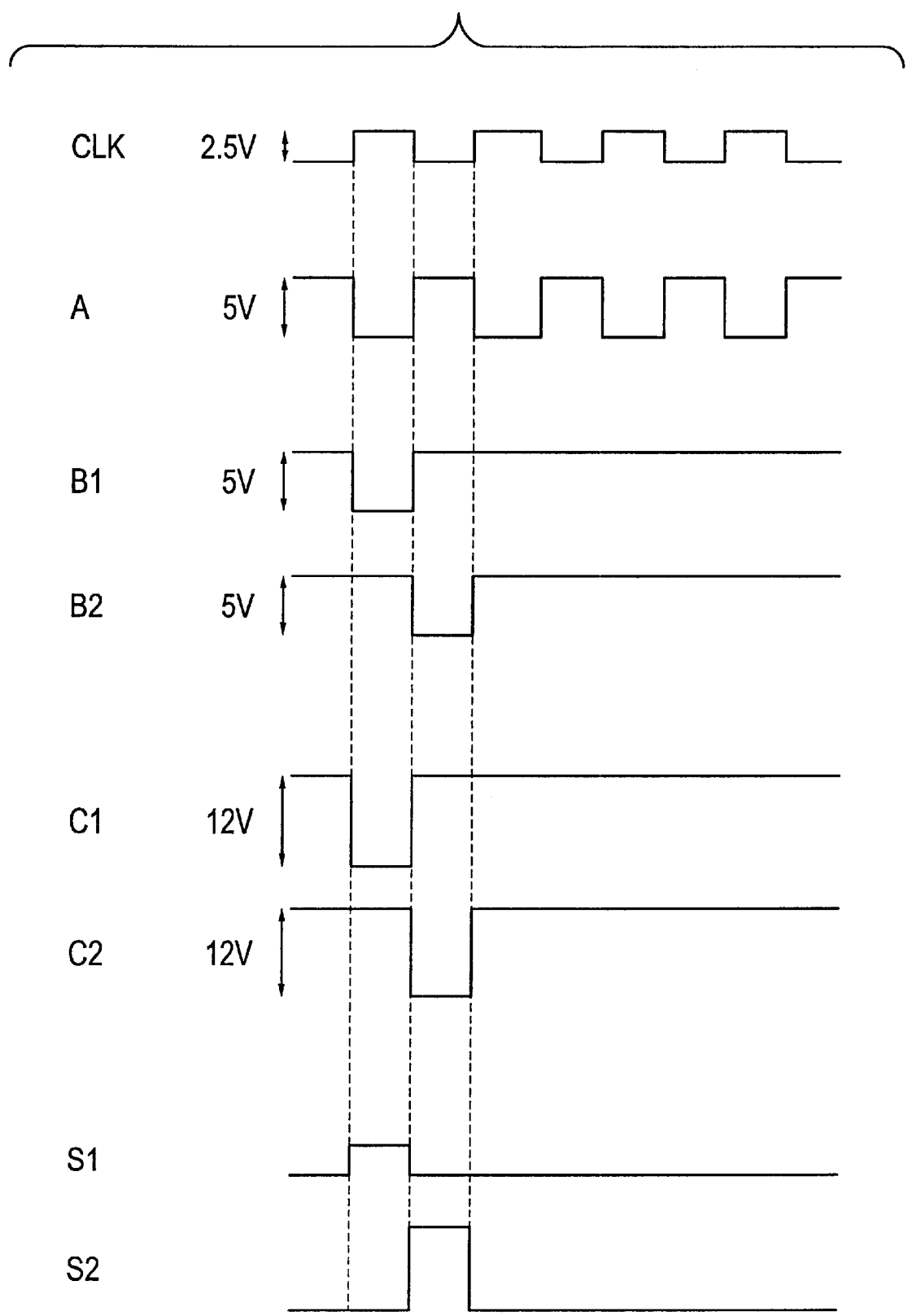
FIG. 6 is a timing chart of a source signal line side driving circuit of the present invention.

Note that a specific circuit diagram of the source signal line side driving circuit of Embodiment 1 is shown in FIG. 5, and timing chart of the specific circuit of this embodiment shown in FIG. 5, at the clock signal, points A, B1, B2, C1, C2, and on the timing signal lines S1 and S2 is shown in FIG. 6.

The 2.5 V voltage amplitude level clock signal CLK is amplified to 5 V by a first level shifter circuit 501 (point A). The increased voltage amplitude level clock signal is input to a shift register circuit 502, a start pulse signal SP, with its voltage amplitude level increased by a level shifter circuit, is input to the shift register circuit 502 at the same time, and a timing signal is created (points B1 and B2).

The timing signal is further amplified by a second level shifter circuit 503, becoming 12 V (points C1 and C2). Then the timing signal is input to an analogue switch 505, the image signal is sampled, and the image signal is supplied to the selected source signal lines S1 and S2.

Thus, by arranging level shifter circuits both before and after the shift register circuit with the present invention, a clock signal with a voltage amplitude level low enough to cause no damage to the shift register circuit TFT from punch through or hot electrons due to the short channel effect, and high enough that a TFT with a manufacturable channel length will operate, can be input to the shift register circuit. As a result, the shift register circuit can be operated at higher speed. Further, even if the voltage amplitude level of the clock signal input from external to the source signal line side driving circuit is reduced as much as possible within the range in which the level shifter circuit can operate, high-speed operation of the shift register circuit is possible, so power consumption and unwanted radiation can be suppressed to an extent that they do not become problems. An example of the present invention applied to a source signal line side driving circuit is explained in Embodiment 1, but the present invention is not limited to the preferred embodiment of Embodiment 1.

EMBODIMENT 2

Another example of a source signal line side driving circuit using the structure of the present invention, in which, by arranging level shifter circuits before and after a shift register circuit, the voltage amplitude level of a signal is increased in two stages, before and after the shift register circuit, is shown in Embodiment 2.

Figure 7:
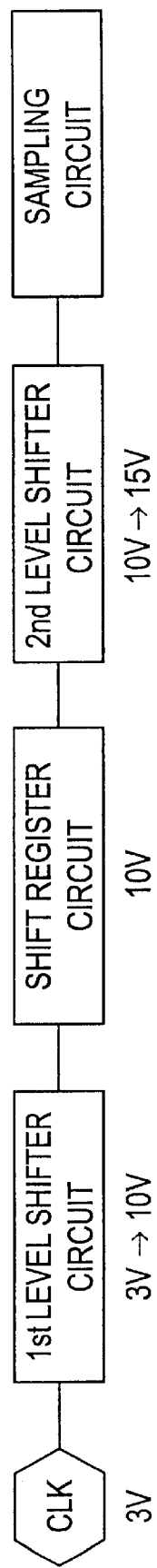
FIG. 7 is a block diagram of a source signal line side driving circuit of the present invention.

Next, a block diagram of the source signal line side driving circuit of Embodiment 2 is shown in FIG. 7. In Embodiment 2 a liquid crystal with a saturation voltage of 6 V is used. A clock signal CLK, with a voltage amplitude level of 3 V and from external to the is source signal line side driving circuit, is input to a first level shifter circuit of the source signal line side driving circuit. The voltage amplitude level of the clock signal input to the first level shifter circuit needs to be as low as possible, within the range in which the first level shifter circuit can operate, in order to suppress unwanted radiation to an extent where it does not become a problem. This is also necessary in order to reduce power consumption.

The voltage amplitude level of the clock signal input to the first level shifter circuit is increased (made higher voltage) by the first level shifter circuit, from 3 V to 10 V in Embodiment 2, and the result is input to the shift register circuit.

The voltage amplitude level of the clock signal input to the shift register circuit is required to be a voltage amplitude level that is within the range in which the shift register circuit can operate. The shift register circuit can operate at 10 V in Embodiment 2. For example, in order to operate the shift register circuit of the source signal line side driving circuit at 5 MHz or greater in Embodiment 2, when configured by a TFT with a 3 μm channel length, it is necessary for the voltage amplitude level of the clock signal input to the shift register circuit to be 8 V or greater. The voltage amplitude level is increased to 10 V in Embodiment 2, but the voltage amplitude level is not limited to this number for the present invention. A necessary condition is that the voltage amplitude level of the clock signal input to the shift register circuit be within the range in which the shift register circuit can operate. Further, the level shifter circuit may be used for signals other than just the clock signal, such as a start pulse signal.

The 10 V voltage amplitude level clock signal output from the level shifter circuit is input to the shift register circuit. The shift register circuit operates based on the clock is signal input to the shift register circuit, and in accordance with the start pulse signal input to the shift register circuit at the same time, and creates a timing signal in order to sample an image signal supplied from an image signal line. The created timing signal is input to a second level shifter circuit.

The voltage amplitude level of the timing signal input to the second level shifter circuit is increased by the second level shifter circuit. It is necessary for the timing signal to be increased to a voltage amplitude level that includes a certain fixed margin voltage in addition to the saturation voltage. The timing signal input to the second level shifter circuit at 10 V is increased to 15 V, and the 15 V timing signal is input to the sampling circuit. The sampling circuit performs a sampling operation on the image signal supplied from the image signal lines in accordance with the timing signal input to the sampling circuit.

The sampled image signal is supplied to the source signal lines, and is input to the pixel TFTs connected to the source signal lines, operating the liquid crystals.

Thus, by forming level shifter circuits both before and after the shift register circuit with the present invention, a clock signal with a voltage amplitude level low enough to cause no damage to the shift register circuit TFT from punch through or hot electrons due to the short channel effect, and high enough that a TFT with a manufacturable channel length will operate, can be input to the shift register circuit. As a result, the shift register circuit can be operated at higher speed. Further, even if the voltage amplitude level of the clock signal input from external to the source signal line side driving circuit is reduced as much as possible within the range in which the level shifter circuit can operate, high-speed operation of the shift register circuit is possible, so power consumption and unwanted radiation can be suppressed to an extent that they do not become problems. An example of the present invention applied to a source signal line side driving circuit is explained in Embodiment 2, but the present invention is not limited to the preferred embodiment of Embodiment 2.

EMBODIMENT 3

Another example of a source signal line side driving circuit using the structure of the present invention, in which, by arranging level shifter circuits before and after a shift register circuit, the voltage amplitude level of a signal is increased in two stages, before and after the shift register circuit, is shown in Embodiment 3.

Figure 8:
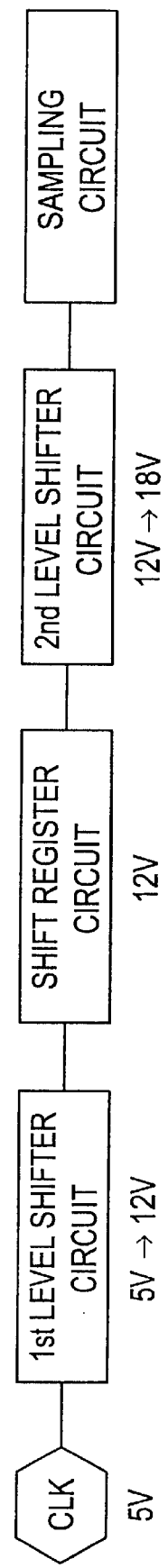
FIG. 8 is a block diagram of a source signal line side driving circuit of the present invention.

Next, a block diagram of the source signal line side driving circuit of Embodiment 3 is shown in FIG. 8. In Embodiment 3 a liquid crystal with a saturation voltage of 7 V is used. A clock signal CLK, with a voltage amplitude level of 5 V and from external to the source signal line side driving circuit, is input to a first level shifter circuit of the source signal line side driving circuit. The voltage amplitude level of the clock signal input to the first level shifter circuit needs to be as low as possible, within the range in which the first level shifter circuit can operate, in order to suppress unwanted radiation to an extent where it does not become a problem. This is also necessary in order to reduce power consumption.

The voltage amplitude level of the clock signal input to the first level shifter circuit is increased (made higher voltage) by the first level shifter circuit, from 5 V to 12 V in Embodiment 3, and the result is input to the shift register circuit.

The voltage amplitude level of the clock signal input to the shift register circuit is required to be a voltage amplitude level that is within the range in which the shift register circuit can operate. The shift register circuit can operate at 12 V in Embodiment 3. For example, in order to operate the shift register circuit of the source signal line side driving circuit at 3 MHz or greater in Embodiment 3, when configured by a TFT with a 5 $\mu$m channel length, it is necessary for the voltage amplitude level of the clock signal input to the shift register circuit to be 10 V or greater. The voltage amplitude level is increased to 12 V in Embodiment 3, but the voltage amplitude level is not limited to this number for the present invention. A necessary condition is that the voltage amplitude level of the clock signal input to the shift register circuit be within the range in which the shift register circuit can operate. Further, the level shifter circuit may be used for signals other than just the clock signal, such as a start pulse signal.

The 12 V voltage amplitude level clock signal output from the level shifter circuit is input to the shift register circuit. The shift register circuit operates based on the clock S signal input to the shift register circuit, and in accordance with the start pulse signal input to the shift register circuit at the same time, and creates a timing signal in order to sample an image signal supplied from an image signal line. The created timing signal is input to a second level shifter circuit.

The voltage amplitude level of the timing signal input to the second level shifter circuit is increased by the second level shifter circuit. It is necessary for the timing signal to be increased to a voltage amplitude level that includes a certain fixed margin voltage in addition to the saturation voltage. The timing signal input to the second level shifter circuit at 12 V is increased to 18 V, and the 18 V timing signal is input to the sampling circuit. The sampling circuit performs a sampling operation on the image signal supplied from the image signal lines in accordance with the timing signal input to the sampling circuit.

The sampled image signal is supplied to the source signal lines, and is input to the pixel TFTs connected to the source signal lines, operating the liquid crystals.

Thus, by arranging level shifter circuits both before and after the shift register circuit with the present invention, a clock signal with a voltage amplitude level low enough to cause no damage to the shift register circuit TFT from punch through or hot electrons due to the short channel effect, and high enough that a TFT with a manufacturable channel length will operate, can be input to the shift register circuit. As a result, the shift register circuit can be operated at higher speed. Further, even if the voltage amplitude level of the clock signal input from external to the source signal line side driving circuit is reduced as much as possible within the range in which the level shifter circuit can operate, high-speed operation of the shift register circuit is possible, so power consumption and unwanted radiation can be suppressed to an extent that they do not become problems. An example of the present invention applied to a source signal line side driving circuit is explained in Embodiment 3, but the present invention is not limited to the preferred embodiment of Embodiment 3.

EMBODIMENT 4

An example of the structure of the present invention applied to a gate signal line side driving circuit is explained in Embodiment 4.

Figure 9:
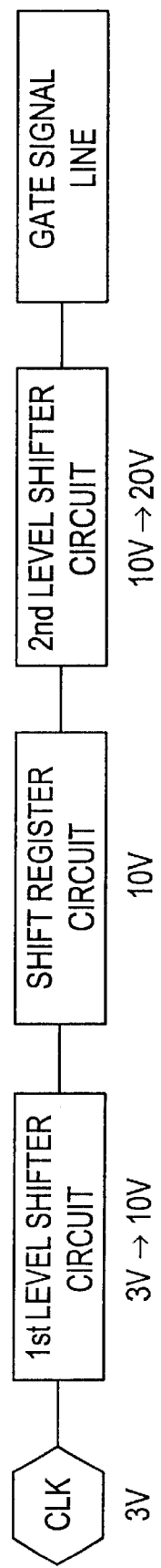
FIG. 9 is a block diagram of a gate signal line side driving circuit of the present invention.

A block diagram of the gate signal line side driving circuit of Embodiment 4 is shown in FIG. 9. In Embodiment 4 a liquid crystal with a saturation voltage of 15 V is used. A clock signal CLK, with a voltage amplitude level of 3 V and from external to the gate signal line side driving circuit, is input to a first level shifter circuit of the gate signal line side driving circuit. The voltage amplitude level of the clock signal input to the first level shifter circuit needs to be as low as possible, within the range in which the first level shifter circuit can operate, in order to suppress unwanted radiation to an extent where it does not become a problem. This is also necessary in order to reduce power consumption.

The voltage amplitude level of the clock signal input to the first level shifter circuit is increased (made higher voltage) by the first level shifter circuit, from 3 V to 10 V, and the result is input to the shift register circuit.

The voltage amplitude level of the clock signal input to the shift register circuit is required to be a voltage amplitude level that is within the range in which the shift register circuit can operate. The voltage amplitude level is increased to 10 V in Embodiment 4, but the voltage amplitude level is not limited to this number for the present invention. A necessary condition is that the voltage amplitude level of the clock signal input to the shift register circuit be within the range in which the shift register circuit can operate. Further, the level shifter circuit may be used for signals other than just the clock signal, such as a start pulse signal.

The 10 V voltage amplitude level clock signal output from the level shifter circuit is input to the shift register circuit. The shift register circuit operates based on the clock signal input to the shift register circuit, and in accordance with the start pulse signal input to the shift register circuit at the same time, and creates a selection signal in order to reliably operate all pixel TFTs connected to gate signal lines. The created selection signal is input to a second level shifter circuit.

The voltage amplitude level of the selection signal input to the second level shifter circuit is increased by the second level shifter circuit. It is necessary for the selection signal to be increased to a voltage amplitude level required to reliably operate all the pixel TFTs. The selection signal input to the second level shifter circuit at 10 V is increased to 20 V, the 20 V selection signal is input to the gate signal lines, and the pixel TFTs operate to supply an image signal to liquid crystals.

Figure 10:
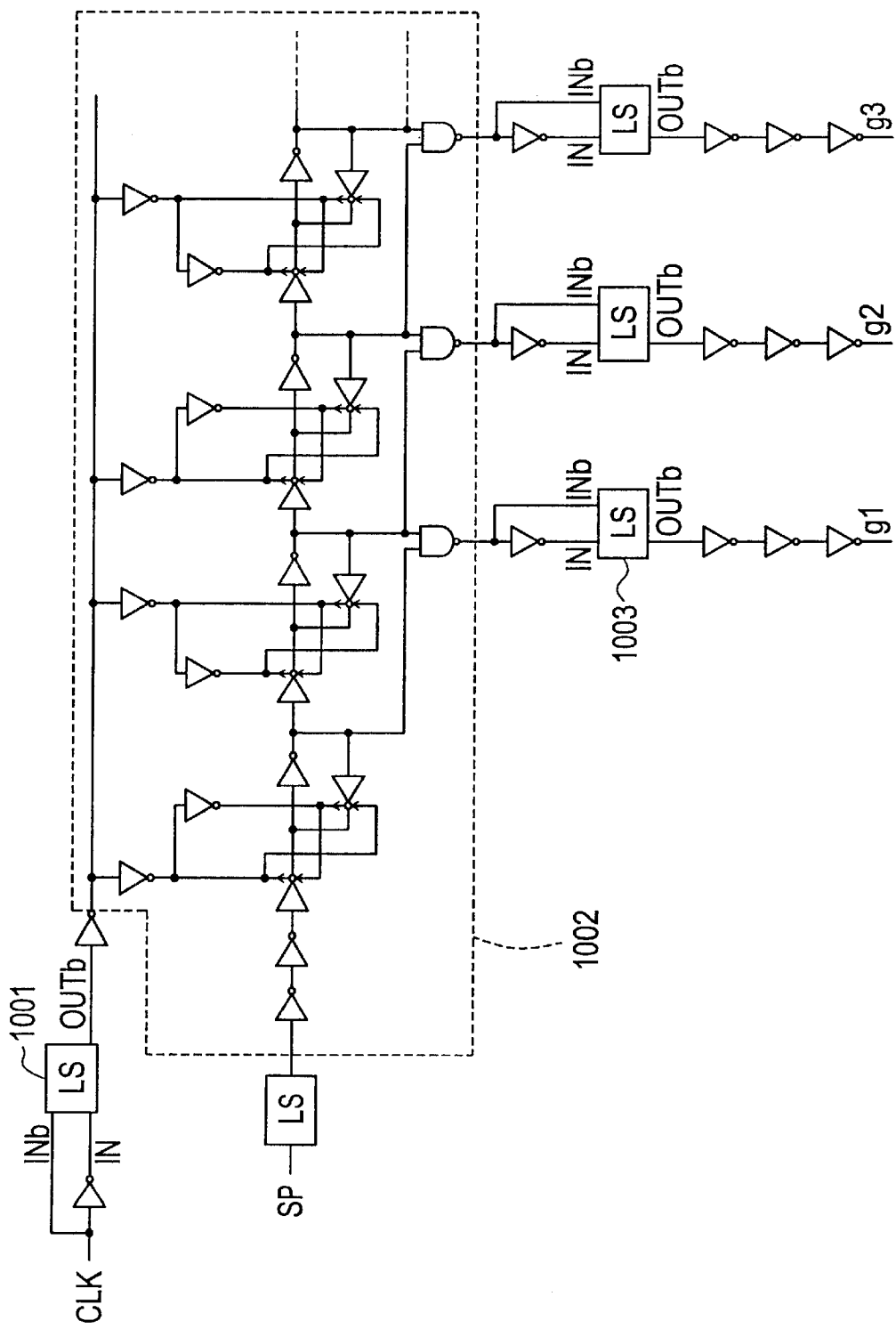
FIG. 10 is a circuit diagram of a gate signal line side driving circuit of the present invention.

A specific circuit structure of the block diagram of FIG. 9 is shown in FIG. 10.

The clock signal CLK, input to a first level shifter circuit 1001, is increased in voltage and then output. At this point the voltage amplitude level of the clock signal has a voltage amplitude level at which the level shifter circuit 1001 can operate, and it is desirable that the voltage amplitude level is lower than the selection signal voltage amplitude level required to reliably operate all of the pixel TFTs. The clock signal is input to a shift register circuit 1002.

A start pulse signal SP with a voltage amplitude level increased by a level shifter circuit is input to the shift register circuit 1002. The shift register circuit 1002 begins to operate at a preset timing in accordance with the input of the start pulse signal. Then, based on the clock signal input to the shift register circuit 1002, a selection signal which drives the pixel TFTs is output in order, and then input to a second level shifter circuit 1003.

The selection signal input to the second level shifter circuit 1003 is increased in voltage again and then output. The selection signal with an increased voltage is then input to the gate signal lines g1, g2, and g3. At this point it is necessary that the voltage amplitude level be increased to the selection signal voltage amplitude level required to reliably operate all of the pixel TFTs.

Thus, by arranging level shifter circuits both before and after the shift register circuit, a clock signal with a voltage amplitude level low enough to cause no damage to the shift register circuit TFT from punch through or hot electrons due to the short channel effect, and yet high enough that a TFT with a manufacturable channel length will operate, can be input to the shift register circuit. And power consumption can be suppressed. Further, even if the voltage amplitude level of the clock signal input from external to the gate signal line side driving circuit is reduced as much as possible within the range in which the level shifter circuit can operate, high-speed operation of the shift register circuit is possible, so power consumption and unwanted radiation can be suppressed to an extent that they do not become problems. An example of the present invention applied to a gate signal line side driving circuit is explained in Embodiment 4, but the present invention is not limited to the preferred embodiment of Embodiment 4.

Note that it is possible to use the gate signal line side driving circuit shown in Embodiment 4 in the active matrix type liquid crystal display device shown in FIG. 3 of Embodiment 1.

EMBODIMENT 5

Another example of the structure of the present invention applied to a gate signal line side driving circuit is explained in Embodiment 5.

A block diagram of the gate signal line side driving circuit of Embodiment 5 is shown in FIG. 11. In Embodiment 5 a liquid crystal with a saturation voltage of 14 V is used. A clock signal CLK, with a voltage amplitude level of 5 V and from external to the gate signal line side driving circuit, is input to a first level shifter circuit of the gate signal line side driving circuit. The voltage amplitude level of the clock signal input to the first level shifter circuit needs to be as low as possible, within the range in which the first level shifter circuit can operate, in order to suppress unwanted radiation to an extent where it does not become a problem. This is also necessary in order to reduce power consumption.

The voltage amplitude level of the clock signal input to the first level shifter circuit is increased (made higher voltage) by the first level shifter circuit, from 5 V to 12 V, and the result is input to the shift register circuit.

The voltage amplitude level of the clock signal input to the shift register circuit is required to be a voltage amplitude level that is within the range in which the shift register circuit can operate. The voltage amplitude level is increased to 12 V in Embodiment 5, but the voltage amplitude level is not limited to this number for the present invention. A necessary condition is that the voltage amplitude level of the clock signal input to the shift register circuit be within the range in which the shift register circuit can operate. Further, the level shifter circuit may be used for signals other than just the clock signal, such as a start pulse signal.

The 12 V voltage amplitude level clock signal output from the first level shifter circuit is input to the shift register circuit. The shift register circuit operates based on the clock signal input to the shift register circuit, and in accordance with the start pulse signal input to the shift register circuit at the same time, and creates a selection signal in order to reliably operate all pixel TFTs connected to gate signal lines. The created selection signal is input to a second level shifter circuit.

The voltage amplitude level of the selection signal input to the second level shifter circuit is increased by the second level shifter circuit. It is necessary for the selection signal to be increased to a voltage amplitude level required to reliably operate all the pixel TFTs. The selection signal input to the second level shifter circuit at 12 V is increased to 25 V, the 25 V selection signal is input to the gate signal lines, and the pixel TFTs operate to supply an image signal to liquid crystals. The image is therefore displayed in the liquid crystal display.

Thus, by arranging level shifter circuits both before and after the shift register circuit with-the present invention, a clock signal with a voltage amplitude level low enough to cause no damage to the shift register circuit TFT from punch through or hot electrons due to the short channel effect, and yet high enough that a TFT with a manufacturable channel length will operate, can be input to the shift register circuit. As a result, the shift register circuit can be operated at higher speed, and power consumption can be suppressed. Further, even if the voltage amplitude level of the clock signal input from external to the gate signal line side driving circuit is reduced as much as possible within the range in which the level shifter circuit can operate, high-speed operation of the shift register circuit is possible, so power consumption and unwanted radiation can be suppressed to an extent that they do not become problems. An example of the present invention applied to a gate signal line side driving circuit is explained in Embodiment 5, but the present invention is not limited to the preferred embodiment of Embodiment 5.

EMBODIMENT 6

The present invention may be applied to both a source signal line side driving circuit and a gate signal line side driving circuit. In this case, the source signal line side driving circuit and the gate signal line side driving circuit each use a first and a second level shifter circuit. For example, a combination of the above embodiments may be made.

EMBODIMENT 7

A manufacturing process of the active matrix type liquid crystal display device of the above Embodiments 1 to 6 is explained in Embodiment 7.

This embodiment describes with reference to FIGS. 12A to 15C an example in which a plurality of top gate type TFTs are formed on a substrate having an insulating surface, and in which a pixel region circuit and an operation circuit that includes a level shifter circuit and a shift register circuit are monolithically formed. Note that a CMOS circuit that is a basic circuit is shown as an example of a driving circuit such as a logic circuit, in Embodiment 7. Note also that, although the manufacturing process of a CMOS circuit configured with a p-channel type TFT and an n-channel type TFT each having one gate electrode is explained in Embodiment 7, a multiple gate electrode CMOS circuit such as a double gate CMOS circuit can also be manufactured in the same way.

Figure 12A:
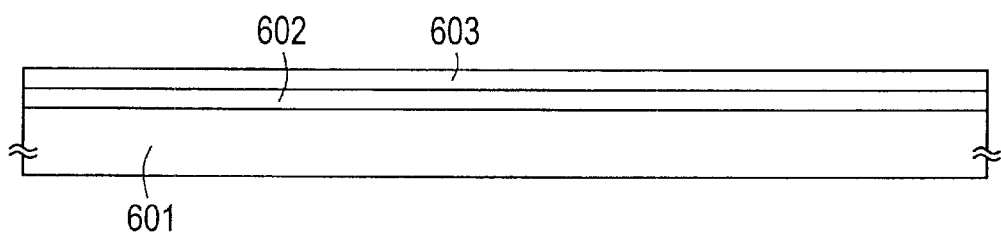
FIGS. 12A to 12E are cross sectional diagrams showing a manufacturing process of a TFT.
Figure 12B:
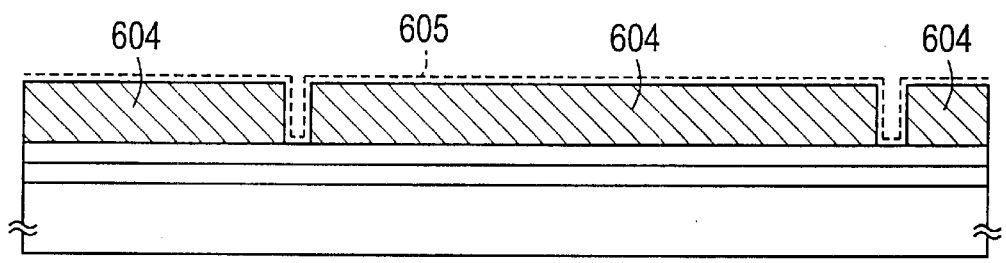
Figure 12C:
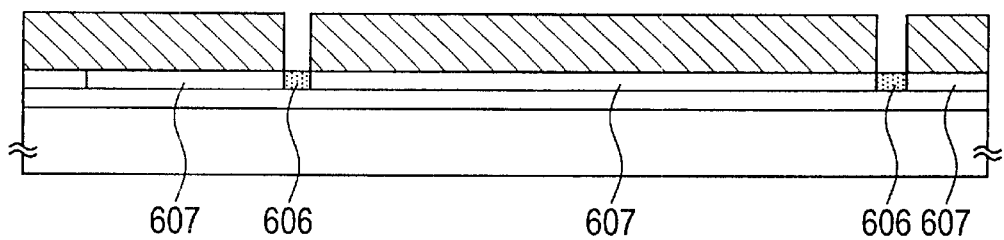
Figure 12D:
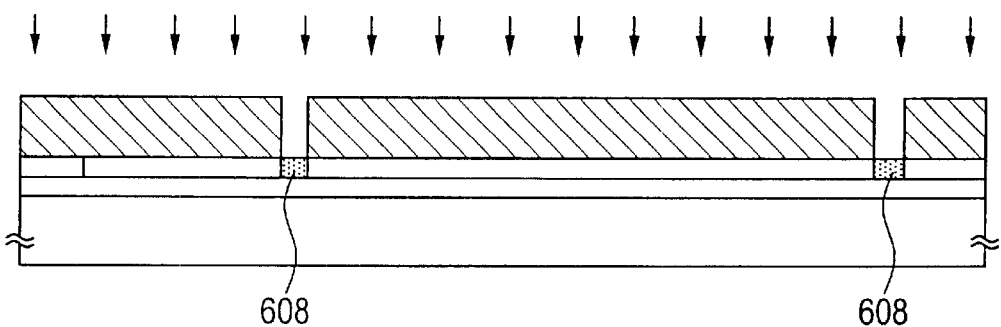

Please refer to FIG. 12A. First, a glass substrate 601 is prepared as a substrate having an insulating surface. A quartz substrate or a thermally oxidized film silicon substrate may be substituted for the glass substrate. In addition, a method may be used by which an amorphous silicon film is formed on a quartz substrate, and is then completely oxidized by heat into an insulating film. Further, a quartz substrate, a ceramic substrate, 1s or a silicon substrate, each with a silicon nitride film as the insulating film, may be used. In Embodiment 7 a base film comprising silicon oxide 602 is formed on the glass substrate 601 to have a thickness of 200 nm. The base film may be a laminated film of silicon nitride films, or a silicon nitride film only.

Reference numeral 603 denotes an amorphous silicon film, and adjustment is made so that its final film thickness (the film thickness determined by considering film reduction after thermal oxidation) is from 10 to 75 nm (desirable from 15 to 45 nm). Note that it is important to thoroughly control the concentration of impurities throughout the film when depositing the film.

The concentrations of all typical impurities such as C (carbon), N (nitrogen), O (oxygen), and S (sulphur) are controlled to be less than $5 \times 10^{18}$ atoms/cm$^3$ (desirable $1 \times 10^{18}$ atoms/cm$^3$ or less) throughout the amorphous silicon film 603 in the case of Embodiment 7. If any of the impurities exists at a higher concentration, this will have a bad influence during crystallization, and will become a cause of reduced film quality after crystallization.

Note that the concentration of hydrogen throughout the amorphous silicon film 603 is also a very important parameter, and that by reducing the hydrogen content, a film with better crystallinity can be obtained. Therefore it is desirable to use low pressure thermal CVD to deposit the amorphous silicon film 603. Note that by optimizing the film deposition conditions, it is also possible to use plasma CVD.

Next, a crystallization process is performed on the amorphous silicon film 603. The technique of Japanese Patent Application Laid-open No. Hei 7-130652 may be used as the crystallization means. The means in either Embodiment 1 or Embodiment 2 of the above patent application may be used, and it is desirable that the technique contents described in Embodiment 2 of the above patent application (details in Japanese Patent Application Laid-open No. Hei 8-78329) be used here for Embodiment 7.

First a mask insulating film 604, which selects catalytic element doping regions, is formed according to the technique of Japanese Patent Application Laid-open No. Hei 8-78329. The mask insulating film 604 has openings in several locations in order to dope the catalytic element. The location of the crystalline regions can be determined by the locations of the openings.

A solution containing nickel (Ni) as the catalytic element to promote crystallization of the amorphous silicon film 603 is then applied by spin coating, forming a Ni containing layer 605. Note that other than nickel, cobalt (Co), iron (Fe), palladium (Pd), platinum (Pt), copper (Cu), and gold (Au), etc., can be used as the catalytic element. (See FIG. 12B.)

In addition, ion implantation and plasma doping employing a resist mask can be used for the above catalytic element doping process. In this case it is easy to reduce the area occupied by the doping region, and to control growth distance in a lateral growth region, so this is an effective technique when constructing a scaled down circuit.

Next, after dehydrogenation at 450° C. for one hour after the catalytic element doping process is completed, a 4 to 24 hour heat treatment at between 500 and 700° C. (typically from 550 to 650° C.) in an inert, hydrogen or oxygen atmosphere is carried out to crystallize the amorphous silicon film 603. The heat treatment is performed at 570° C. for 14 hours in a nitrogen atmosphere in Embodiment 7.

At this point the crystallization of the amorphous silicon film 603 advances preferentially from nickel doped regions 606, or from seeds generated in the nickel doped regions 606, forming crystalline regions 607 which have grown almost parallel to the substrate surface of the glass substrate 601. The crystalline regions 607 are called lateral growth regions. Individual crystals are gathered in a relatively aligned state in the lateral growth regions, so there is an advantage in that the overall crystallinity is superior. (See FIG. 12C.)

Note that regions that can microscopically be called lateral growth regions are formed by use of the technique described in Embodiment 1 of the above stated Japanese Patent Application Laid-open No. Hei 7-130652. However, seed generation occurs non-uniformly inside the surface, so the technique can be criticized from the point of controllability of the grain boundaries.

Phosphorous is next doped in this state in order to remove the nickel throughout the film. Phosphorous is only doped into the nickel doped region 606 by doing so. These regions are denoted as phosphorous doped regions 608. At this point the doping acceleration voltage and the thickness of the mask insulating film 604 made of an oxidized film are optimized so that phosphorous does not substantially penetrate the mask insulating film 604. (See FIG. 12D.)

A phosphorous dose in a range from $1 \times 10^{14}$ to $1 \times 10^{15}$ ions/cm$^2$ is desirable. In Embodiment 7 a dose of $5 \times 10^{14}$ ions/cm$^2$ is doped using an ion doping apparatus.

Note that the acceleration voltage is 10 kV when ion doping. Almost no phosphorous can pass through a 1000 Å insulating film mask if the acceleration voltage is 10 kV.

Figure 12E:
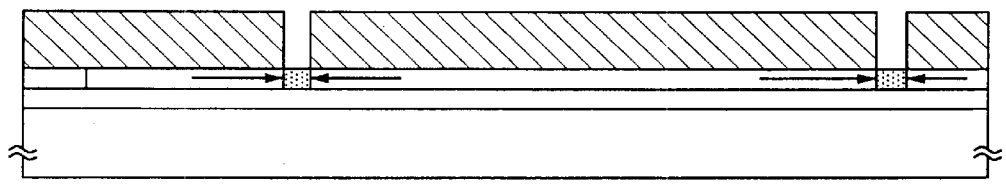

FIG. 12E is referred to next. Thermal annealing in a nitrogen atmosphere at 600° C. is for between 1 and 12 hours (for 12 hours in Embodiment 7) is then performed, gettering the nickel element. Annealing causes the nickel to be drawn to the phosphorous. At a temperature of 600° C., phosphorous atoms have almost no motion in the film, but nickel atoms can move a distance of several hundred micrometers or more. Thus it can be understood that phosphorous is one of the most suitable elements for the gettering of nickel.

The mask insulating film 604 is removed and patterning is performed after completion of a heat treatment for crystallization, forming island shaped semiconductor layers (active layers) 609, 610, and 611 from the lateral growth regions 607. (See FIG. 13A.)

Reference numeral 609 denotes an active layer of an n-type TFT which constitutes the CMOS circuit, 610 denotes an active layer of a p-type TFT which constitutes the CMOS circuit, and 611 denotes an active layer of an n-type TFT (pixel TFT) that constitutes the pixel region.

After forming the active layers 609, 610, and 611, a gate insulating film 612 made from an insulating film containing silicon is deposited on top.

Next, a metallic film, containing aluminum as its major constituent element and not shown in the figures, is deposited, forming the base shape of a later gate electrodes by patterning. An aluminum film containing 2 wt % scandium is used in Embodiment 7.

Next, porous anodic oxidation films 613 to 620, non-porous anodic oxidation films 621 to 624, and gate electrodes 625 to 628 are formed in accordance with the technique of Japanese Patent Application Laid-open No. Hei 7-135318. (See FIG. 13B.)

Figure 13A:
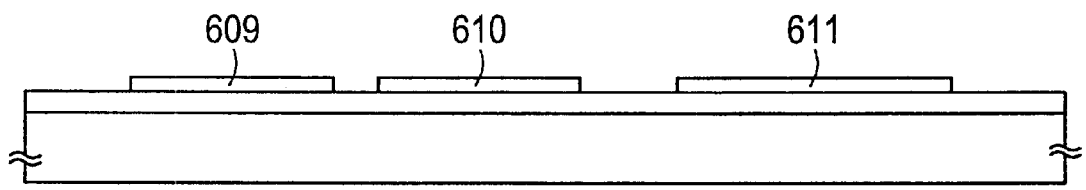
FIGS. 13A to 13C are cross sectional diagrams showing the manufacturing process of a TFT.
Figure 13B:
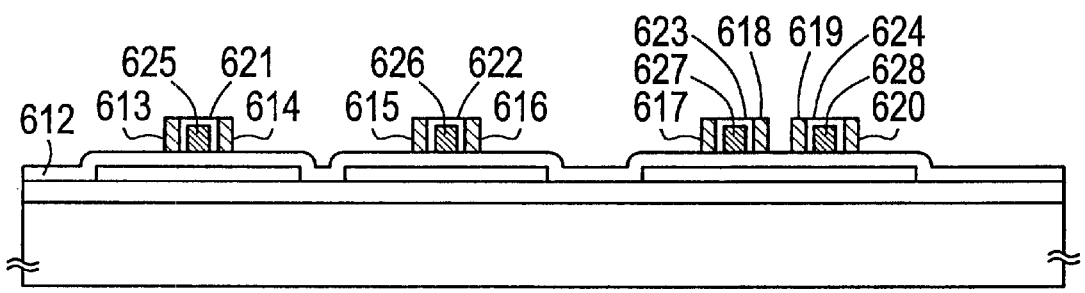
Figure 13C:
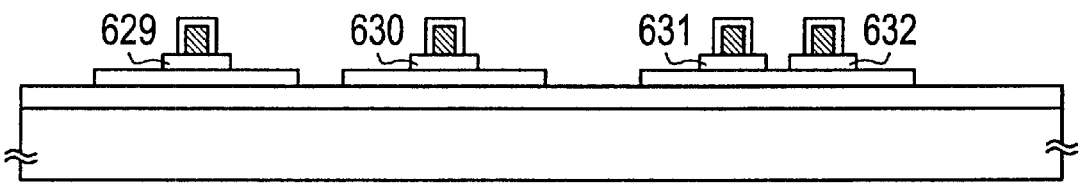

After obtaining the state in FIG. 13B, the gate electrodes 625 to 628 and the porous anodic oxidation films 613 to 620 are used as masks, and the gate insulating film 612 is etched. Then the porous anodic oxidation films 613 to 620 are removed, and the state of FIG. 13C is obtained. Note that reference numerals 629 to 632 shown in FIG. 13C denote the gate insulating films after processing.

Figure 14A:
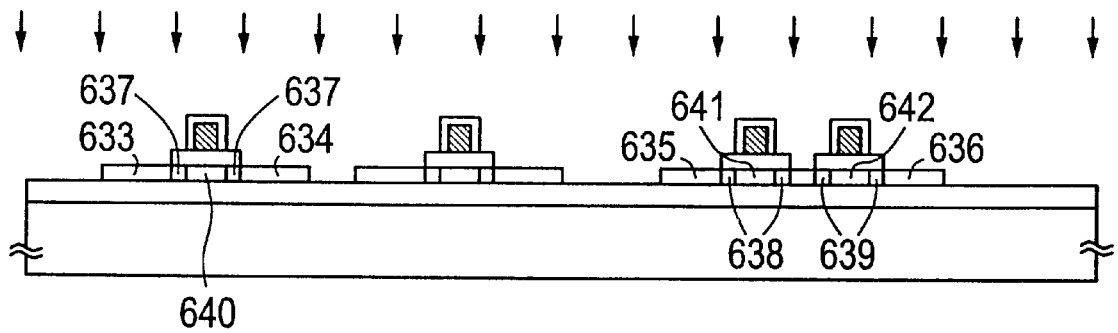
FIGS. 14A to 14C are cross sectional diagrams showing the manufacturing process of a TFT.

Please refer to FIG. 14A. A doping process is performed with an impurity element that imparts conductivity. Phosphorous (P) or arsenic (As) may be used as the impurity element for a n-channel type TFT, and boron (B) or gallium (Ga) may be used for a p-channel type TFT. The impurity doping processes for forming the n-channel type TFT and the p-channel type TFT are divided into two stages in Embodiment 7, and then carried out.

Impurity doping to form the n-channel type TFT is initially performed. The first impurity doping (phosphorous is used in Embodiment 7) is performed at a high acceleration voltage of approximately 80 keV, forming an n$^-$ region. The n$^-$ region is regulated to have a P ion concentration from $1 \times 10^{18}$ to $1 \times 10^{19}$ ions/cm$^2$.

The second impurity doping process is then performed at a low acceleration voltage of approximately 10 keV, forming an n$^+$ region. At this point the acceleration voltage is low, so the gate insulating film functions as a mask. Further, the doping process is regulated so that the n$^+$ region has a sheet resistance of 500 Ω or less (300 Ω or less desirable).

Thus, through the above processes, source region 633, drain region 634, low concentration impurity regions (LDD regions) 637, and channel forming region 640 are formed for the n-channel type TFT which constitutes the CMOS circuit. In addition, source region 635, drain region 636, low concentration impurity regions (LDD regions) 638 and 639, and channel forming regions 641 and 642 are determined for the n-channel type TFT which constitutes the pixel TFT. (See FIG. 14A.)

Note that in the state shown in FIG. 14A, the active layer of the p-channel type TFT, which constitutes the CMOS circuit, and the active layer of the n-channel type TFT have the same composition.

Figure 14B:
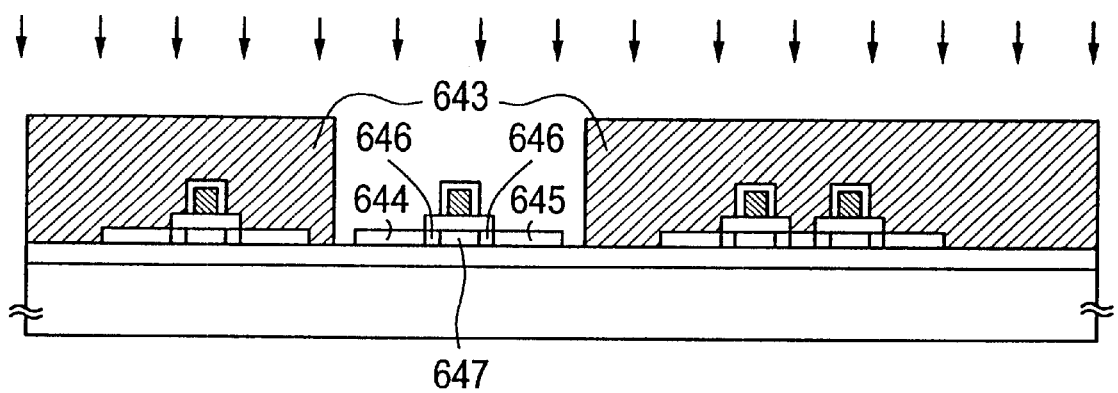

Next, as shown in FIG. 14B, a resist masks 643 are formed, covering the n-channel type TFTs, and a doping process is performed with an impurity ion that imparts p-type conductivity (boron is used in Embodiment 7).

This process is also divided into two steps, the same as the above impurity doping process. However, it is necessary to invert the n-channel type conductivity to p-channel type, so B (boron) ion is doped to a concentration several times the P ion doping concentration.

Thus, source region 644, drain region 645, low concentration impurity regions (LDD regions) 646, and channel forming region 647 are formed for the p-channel type TFT which constitutes the CMOS circuit. (See FIG. 14B.)

The gate electrodes are formed using an aluminum film containing 2 wt % of scandium in Embodiment 7, but the gate electrodes may also be formed using a polycrystalline silicon film. In this case the LDD regions are formed using sidewalls of SiO$_2$, SiN, etc.

Activation of the impurity ions is next performed with a combination of furnace annealing, laser annealing, and lamp annealing. At the same time, any damage received by the active layers during the doping process is restored.

Figure 14C:
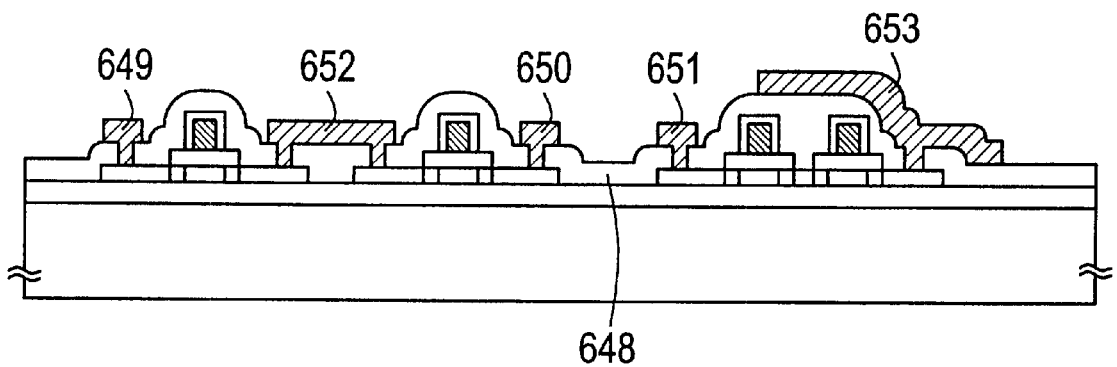

Please refer to FIG. 14C. Next, a laminate film from a silicon oxide film and a silicon nitride film is formed as a first interlayer insulating film 648. After forming contact holes, source electrodes 649 to 651, and drain electrodes 652 and 653 are formed, obtaining the state shown in FIG. 14C. Note that an organic resin film can be used as the first interlayer insulating film 648.

After obtaining the state shown in FIG. 14C, a second interlayer insulating film 654 is formed from an organic resin film to a thickness of between 0.5 and 3 μm. (See FIG. 15A.) Polyimide, acrylic, polyimide amide, etc., can be used as the organic resin film. The following can be given as the advantages of an organic resin film: simple film deposition; easily thickened film thickness; ability to reduce parasitic capacitance because the relative dielectric constant is low; and superior evenness. Note that organic resin films other than those listed above can be used.

A portion of the second interlayer insulating film 654 is removed next, and a black matrix 655 is formed from a film having light shielding characteristics. In Embodiment 7 titanium is used for the black matrix 655, and a storage capacitor 658 is formed between the pixel TFT drain electrode 653 and the black matrix 655. A resin film, etc., with a black colored pigment can also be used as the black matrix 655.

Next, a third interlayer insulating film 656 is formed from an organic resin film to a thickness of between 0.5 and 3 μm. Polyimide, acrylic, polyimide amide, etc., can be used as the organic resin film. Note that organic resin films other than those listed above can be used.

A contact hole is then formed in the second interlayer insulating film 654 and in the third interlayer insulating film 656, and a transparent pixel electrode 657 is formed to a thickness of 120 nm. Note that Embodiment 7 is an example of a transmission type active matrix type liquid crystal display device, so a transparent conductive film such as ITO is used as the conductive film that comprises the transparent pixel electrode 657.

The entire substrate is next heated in a hydrogen atmosphere at 350° C. for between 1 and 2 hours. By performing hydrogenation of all elements, dangling bonds (unpaired bonds) throughout the films (especially throughout the active layers) are compensated for. Thus a CMOS circuit and a pixel region can be manufactured on the same substrate by the above processes.

The manufacture of an active matrix type liquid crystal display device based on the active matrix substrate manufactured by the above processes is explained next.

Figure 15A:
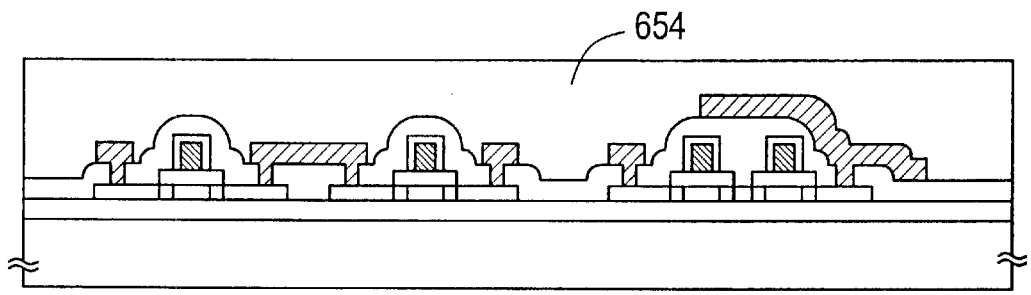
FIGS. 15A to 15C are cross sectional diagrams showing the manufacturing process of a TFT.
Figure 15B:
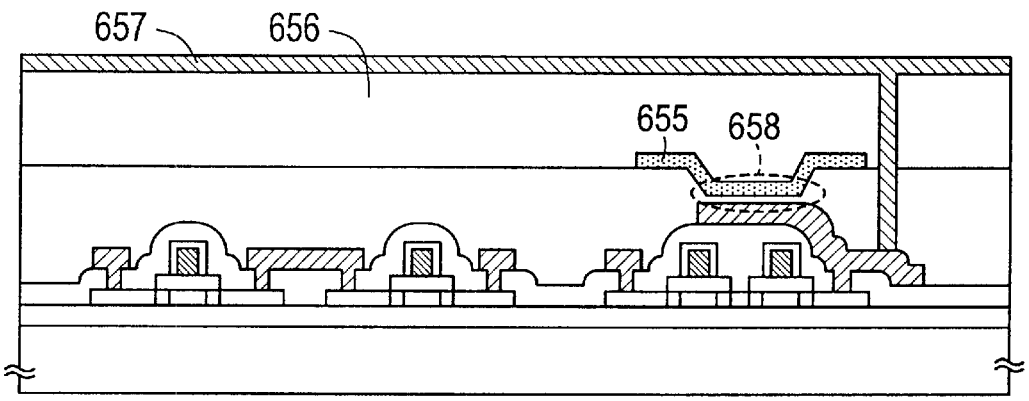

An orientation film 659 is formed on the active matrix substrate in the state of FIG. 15B. In Embodiment 7 polyimide is used for the orientation film 659. Next, an opposing substrate is prepared. The opposing substrate is formed by a glass substrate 660, an opposing electrode 661, and an orientation film 662.

Note that a polyimide film is used for the orientation film 662 in Embodiment 7, and that a rubbing process is performed after the orientation films are formed. Also note that a polyimide with a relatively small pre-tilt angle is used in Embodiment 7.

The active matrix substrate, formed by the above processes, and the opposing substrate are joined together using a sealant material, spacer, etc., (not shown) by a known cell construction process. Afterward, a liquid crystal 663 is injected between the substrates, and then completely sealed with an end-sealing material (not shown in the figures). A nematic liquid crystal is used as the liquid crystal 663 in Embodiment 7.

Figure 15C:
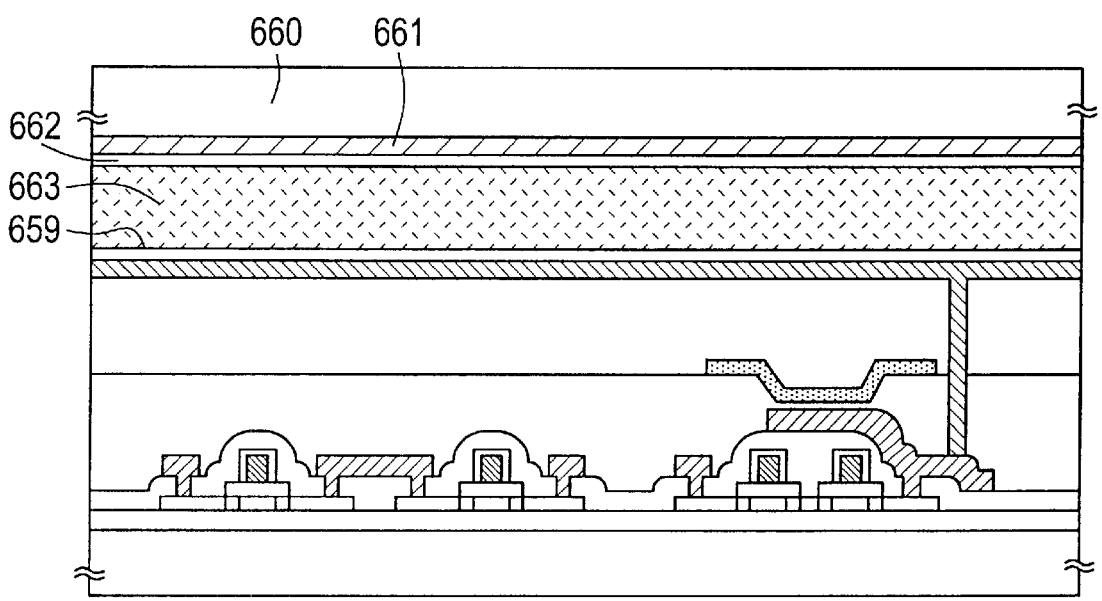

Thus the transmission type active matrix type liquid crystal display device as is shown in FIG. 15C is completed.

EMBODIMENT 8

A manufacturing process, differing from Embodiment 7, for the active matrix type liquid crystal display device of the above Embodiments 1 to 6 is explained in Embodiment 8.

Please refer to FIGS. 25A to 25E. First a 200 nm thick silicon oxide film 5002 is formed on a glass substrate 5001 as a base film. The base film may also be a silicon nitride film, or a laminate of a silicon oxide film and a silicon nitride film.

Next a 30 nm thick amorphous silicon (non-crystalline silicon film) is formed on the silicon oxide film 5002 by plasma CVD. After dehydrogenation processing, excimer laser annealing is performed, forming a polysilicon film (crystalline silicon film or polycrystalline silicon film).

A known laser crystallization technique or thermal crystallization technique may be used for the crystallization process. In Embodiment 8 a pulse oscillation type KrF excimer laser is processed into a linear shape and crystallization of the amorphous silicon film is performed.

Note that although a polysilicon film is obtained by crystallizing the initial film, an amorphous silicon film, by laser annealing in Embodiment 8, but a microcrystalline silicon film may be used as the initial film, or a polysilicon film may be directly deposited. Of course, laser annealing may also be performed on a directly deposited polysilicon film. Further, furnace annealing may be substituted for laser annealing.

The crystalline silicon film thus formed is then patterned, forming active layers 5003 and 5004 from island shaped silicon layers.

A gate insulating film 5005 is formed next from a silicon oxide film, covering the active layers 5003 and 5004, and gate wirings (including gate electrodes) 5006 and 5007 having a laminate structure of tantalum and tantalum nitride are formed on top. (See FIG. 25A.)

The gate insulating film 5005 film has a thickness of 100 nm. Of course, in addition to a silicon oxide film, a silicon oxynitride film and a laminate structure of a silicon oxide film and a silicon nitride film may be used. Further, other metals can be used for the gate wirings 5006 and 5007. However, considering later processing, it is desirable to use a material with a high etching selective ratio with respect to silicon.

Figure 25A:
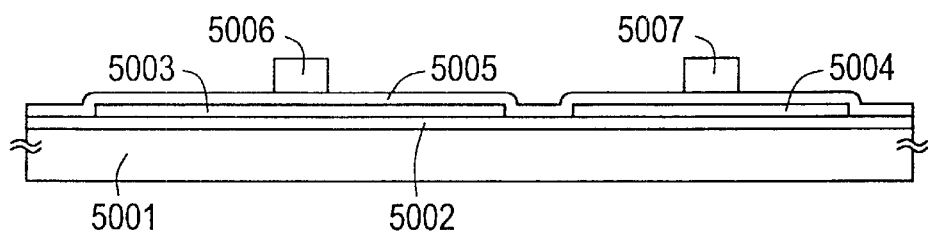
FIGS. 25A to 25E are cross sectional diagrams showing a manufacturing process of a TFT.
Figure 25B:
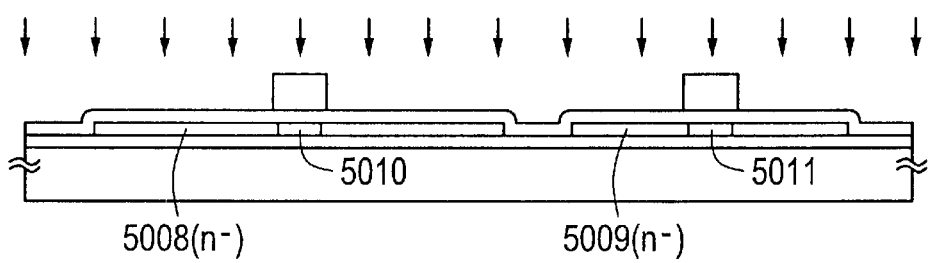

After thus obtaining the state of FIG. 25A, a first phosphorous doping process is performed. Doping is performed here through the gate insulating film 5005, so the acceleration voltage is set high to 80 KeV. In addition, the dose is regulated so that the length (width) of first impurity regions 5008 and 5009 formed here is 0.5 μm, with a phosphorous concentration of $1 \times 10^{17}$ atoms/cm$^3$. The phosphorous concentration at this point is denoted as n−. Note that arsenic may be used as a substitute for phosphorous.

In addition, the first impurity regions 5008 and 5009 are formed in a self aligning manner using the gate wirings 5006 and 5007 as masks. An intrinsic crystalline silicon layer remains under the gate wirings 5006 and 5007 at this point, forming channel forming regions 5010 and 5011. However, in practice there is also a portion of the dopant that rounds to reach under the gate wirings 5006 and 5007, so the gate wirings 5006 and 5007, and the first impurity regions 5008 and 5009 have an overlap structure. (See FIG. 25 B.)

Next an amorphous silicon layer with a thickness of between 0.1 and 1 μm (typically 0.2 to 0.3 μm) is formed, covering the gate wirings 5006 and 5007, and sidewalls 5012 and 5013 are formed by anisotropic etching. The width of the sidewalls 5012 and 5013 (the thickness as seen from the inside wall of the gate wiring) is 0.2 μm. (See FIG. 25C.)

Note that an amorphous silicon layer with no doped impurities is used in Embodiment 8, so sidewalls of an intrinsic silicon layer are formed.

Figure 25C:
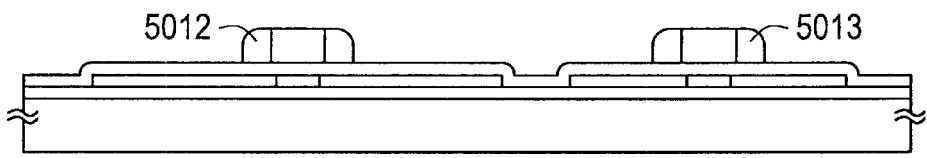

After obtaining the state of FIG. 25C, a second phosphorous doping process is performed. The acceleration voltage is set to 80 KeV in this case as well, the same as for the first doping process. Further, the dose is regulated so that a phosphorous concentration of $1 \times 10^{18}$ atoms/cm$^3$ is included in second impurity regions 5014 and 5015 formed here. The phosphorous concentration at this point is denoted as n.

Figure 25D:
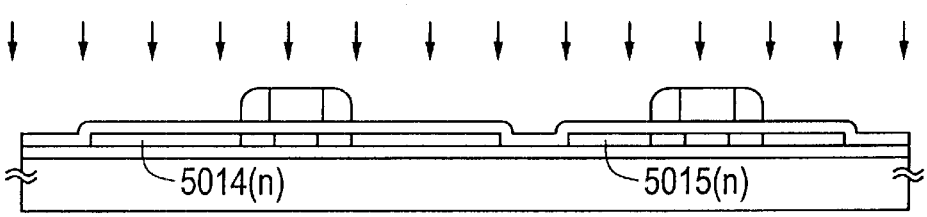

Note that the first impurity regions 5008 and 5009 remain only under the sidewalls 5012 and 5013 with the doping process shown in FIG. 25D. The first impurity regions 5008 and 5009 function as 1st LDD regions.

Phosphorous is also doped into the sidewalls 5012 and 5013 in the process of FIG. 25D. Actually, the acceleration voltage is high, so phosphorous is distributed such that the tail of the concentration profile extends to the inside of the sidewalls. The resistive component of the sidewalls can be regulated by this phosphorous. However, if there is extreme dispersion in the phosphorous concentration distribution, the gate voltage applied to the second impurity region 5014 cannot be stopped from fluctuating for each of the elements, so precise control is necessary at the time of doping.

Next, resist masks 5016, covering a portion of the NTFT, and 5017, covering the entire PTFT, are formed. Then the gate insulating film 5005 is dry etched in this state, forming a processed gate insulating film 5018. (See FIG. 25E.)

At this point the length of the portion of the gate insulating film 5018 which projects beyond the sidewall 5012 (the length of the portion of the gate insulating film 5018 which contacts the second impurity region 5014) determines the length (width) of the second impurity region 5014. Therefore, it is necessary to perform mask alignment of the resist mask 5016 with good precision.

Figure 25E:
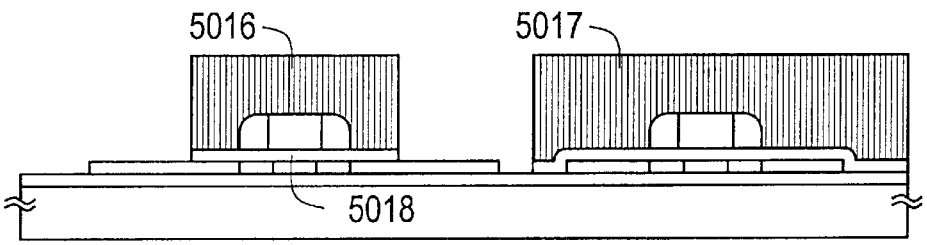
Figure 26A:
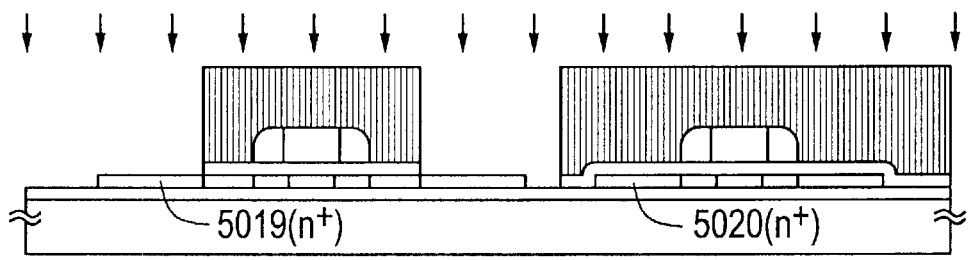
FIGS. 26A to 26D are cross sectional diagrams showing the manufacturing process of a TFT.

A third phosphorous doping process is performed after obtaining the state of FIG. 25E. The acceleration voltage is set low to 10 KeV because this time the exposed active layer is to be doped with phosphorous. Note that the dose is regulated so that a phosphorous concentration of $5 \times 10^{20}$ atoms/cm$^3$ is included in a third impurity region 5019 formed here. The phosphorous concentration at this point is denoted by n+. (See FIG. 26A.)

Phosphorous is not doped into the areas shielded by the resist masks 5016 and 5017, so the second impurity regions 5014 and 5015 remain as is in those areas. The second impurity region 5014 is therefore defined, and at the same time the third impurity region 5019 is defined.

The second impurity region 5014 functions as a 2nd LDD region, and the third impurity region 5019 functions as a source region or a drain region.

The resist masks 5016 and 5017 are removed next, and a resist mask 5021 is newly formed, covering the entire NTFT. Then the sidewall 5013 of the PTFT is first removed, and the gate insulating film 5005 is dry etched, forming a gate insulating film 5022 with the same shape as the gate wiring 5007. (See FIG. 26B.)

Figure 26B:
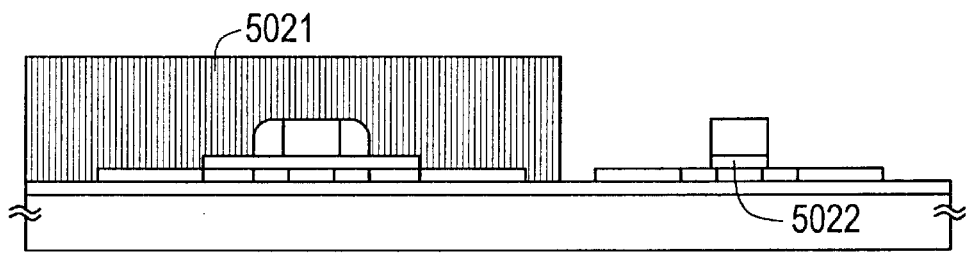

A boron doping process is performed after obtaining the state of FIG. 26B. The acceleration voltage is set to 10 KeV, and the dose is regulated so that a boron concentration of $3 \times 10^{20}$ atoms/cm$^3$ is included in a fourth impurity region 5023 formed here. The boron concentration at this point is denoted by p++. (See FIG. 26C.)

Boron is doped rounding to reach under the gate wiring 5007 at this time, so the channel forming region 5011 is formed on the inside of the gate wiring 5007. Further, the first impurity region 5009 and the second impurity region 5015 formed on the PTFT side are inverted to p-type by boron in this process. Therefore, in practice the resistance value of the portions that are originally the first impurity regions and the second impurity regions change, but this does not become a problem by doping boron at a sufficiently high concentration.

Thus the fourth impurity region 5023 is defined. The fourth impurity region 5023 is formed completely in a self-aligning manner using the gate wiring 5007 as a mask, and functions as a source region or a drain region. An LDD region and an offset region are not formed for the PTFT in Embodiment 8, but this will not become a problem because PTFTs have high reliability from the beginning. On the contrary, not forming an LDD region, etc., can provide gains in the on current, so there are cases where this is advantageous.

Figure 26C:
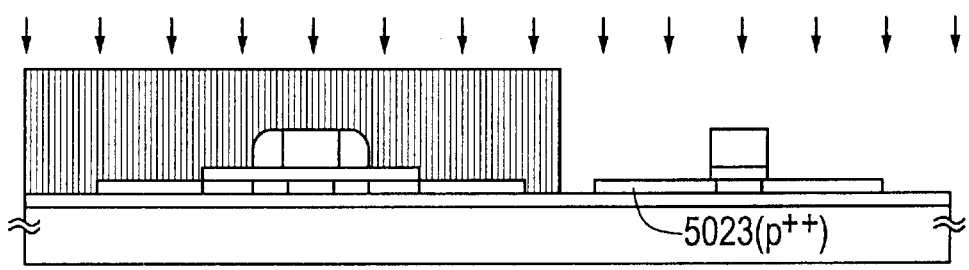

Thus a channel forming region, first impurity regions, second impurity regions, and third impurity regions in the NTFT active layer, and a channel forming region and a fourth impurity region in the PTFT active layer, are finally formed as shown in FIG. 26C.

A first interlayer insulating film 5024 is formed to a thickness of 1 µm after obtaining the state of FIG. 26C. A silicon oxide film, a silicon nitride film, a silicon oxynitride film, an organic resin film, or a laminate of any of these films can be used as the first interlayer insulating film 5024. An acrylic resin film is employed in Embodiment 8.

Source wiring 5025 and 5026, and a drain wiring 5027 are formed from a metallic material after forming the first interlayer insulating film 5024. A three layer wiring structure of a titanium-containing aluminum film, sandwiched between titanium, is used in Embodiment 8.

In addition, by using a BCB (benzocyclobutene) resin film as the first interlayer insulating film, the evenness is high, and at the same time it is possible to use copper as the wiring material. Copper has a low wiring resistance, so it is extremely effective as a wiring material.

A silicon nitride film 5028 with a thickness of 50 nm is formed as a passivation film after the source wirings and drain wiring are formed. A second interlayer insulating film 5029 is further formed on top as a protecting film. It is possible to use the same materials for the second interlayer insulating film 5029 as those that can be used for the first interlayer insulating film 5024. A laminate structure of a 50 nn thick silicon oxide film and an acrylic resin film formed thereon is employed in Embodiment 8.

Figure 26D:
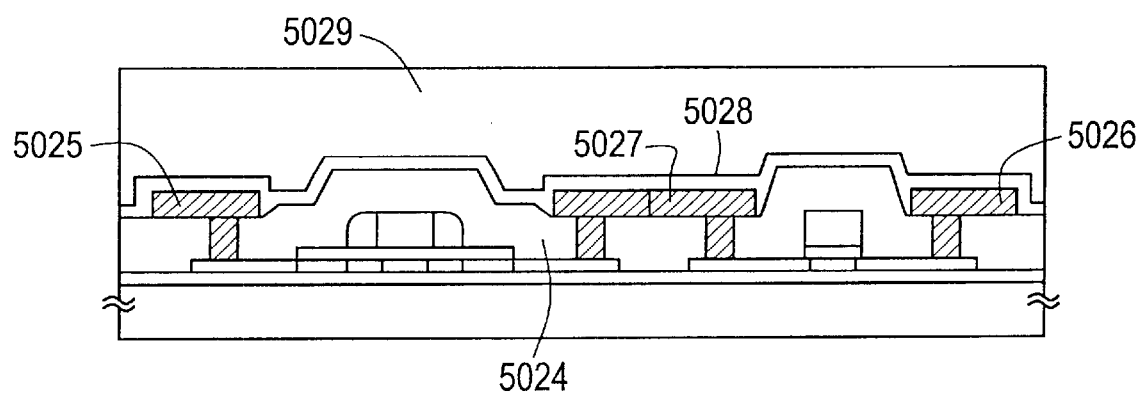

A CMOS circuit with a structure as shown in FIG. 26D is thus completed through the above processes. The NTFT has superior reliability in the CMOS circuit formed in accordance with Embodiment 8, so the reliability of the entire circuit is greatly raised. Furthermore, the NTFT and PTFT characteristic balance (the balance of electrical characteristics) is superior with a structure in accordance with Embodiment 8.

Note that a pixel TFT can be similarly comprised of the NTFT.

A contact hole is opened to form a pixel electrode connected to the pixel TFT drain electrode after obtaining the state of FIG. 26D. Then a third interlayer film is formed, and an orientation film is formed. In addition, a black matrix may be formed if necessary.

Next, an opposing substrate is prepared. The opposing substrate is structured by a glass substrate, an opposing electrode from a transparent conductive film, and an orientation film.

Note that a polyimide film is used for the orientation film in Embodiment 8, and that a rubbing process is performed after forming the orientation film. Note also that a polyimide which possesses a relatively large pre-tilt angle is used for the orientation film in Embodiment 8.

Next, a known cell construction process is used to join together the active matrix substrate formed by the above processes and the opposing substrate, by using a sealant material, spacers, etc. Afterward, a liquid crystal is injected into the space between the two substrates, which is then completely sealed by an end-sealing material. A nematic liquid crystal is used in Embodiment 8.

Thus the transmission type active matrix type liquid crystal display device is completed.

EMBODIMENT 9

An example in which the crystalline semiconductor film, which serves as the active layer in Embodiments 7 and 8, is formed by a thermal crystallization method using a catalytic element, is shown in Embodiment 9. It is desirable to use the techniques described in Japanese Patent Application Laid-open No. Hei 7-130652 and Japanese Patent Application Laid-open No. Hei 8-78329, by the applicant of the present invention, when using a catalytic element.

Figure 27A:
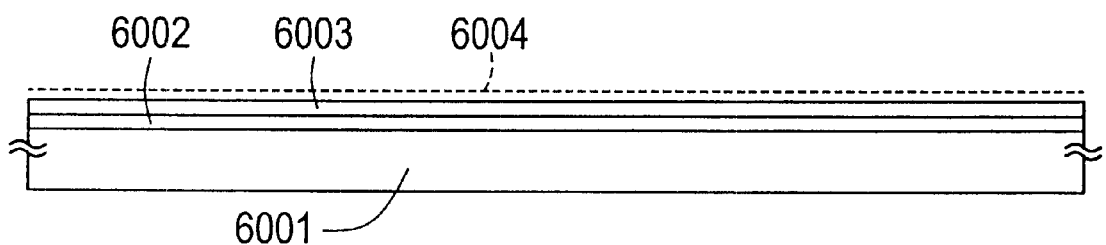
FIGS. 27A and 27B are cross sectional diagrams showing a manufacturing process of a TFT.
Figure 27B:
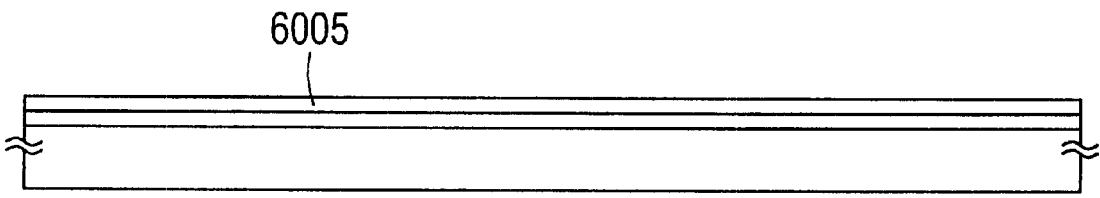

An example of the case where the technique described in Japanese Patent Application Laid-open No. Hei 8-78329 is applied to the present invention is shown in FIGS. 27A and 27B. First, a silicon oxide film 6002 is formed on a silicon substrate 6001 by thermal oxidation, and an amorphous silicon film 6003 is formed on top of that. Further, a nickel acetate salt solution, containing 10 ppm nickel by weight, is applied, forming a nickel containing layer 6004. (See FIG. 27A.)

After a dehydrogenation process at 500° C. for one hour, a heat treatment is next performed at 500 to 650° C. for between 4 and 12 hours (at 550° C. for 8 hours in Embodiment 9), forming a polysilicon film 6005. The polysilicon film 6005 thus obtained has superior crystallinity. (See FIG. 27B.)

Afterward the polysilicon film 6005 is patterned into an active layer, and a TFT is manufactured through the same processes as those in Embodiments 7 and 8.

Note that in addition to nickel (Ni), in the above two techniques elements such as germanium (Ge), iron (Fe), palladium (Pd), tin (Sn), lead (Pb), cobalt (Co), platinum (Pt), copper (Cu), and gold (Au) may be used.

EMBODIMENT 10

Another example of a manufacturing method for the active matrix type liquid crystal display device of Embodiment 8 is explained in Embodiment 10.

Figure 28A:
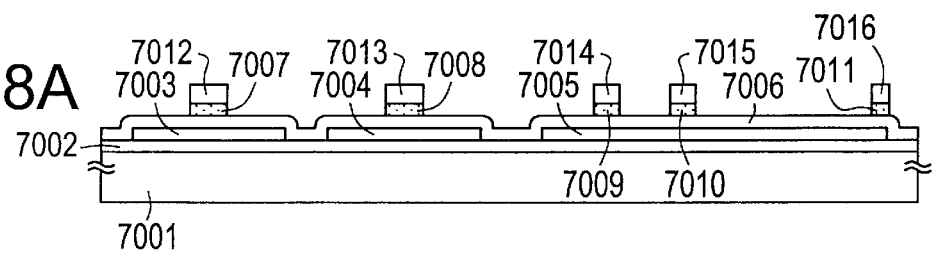
FIGS. 28A to 28E are cross sectional diagrams showing a manufacturing process of TFT.
Figure 28B:
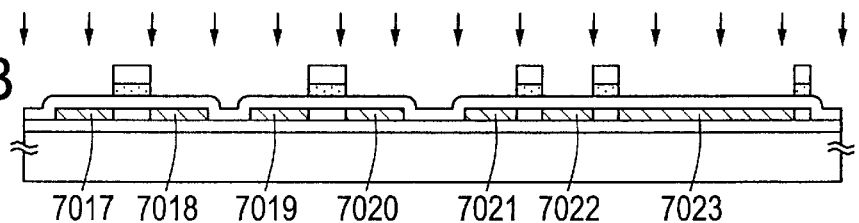
Figure 28C:
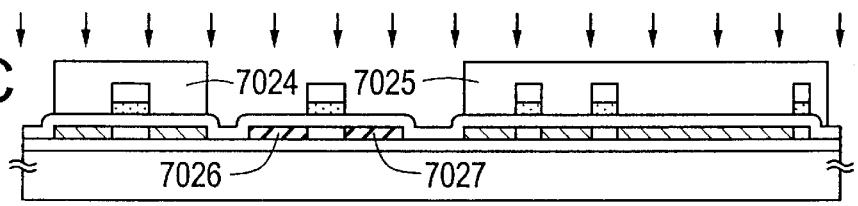
Figure 28D:
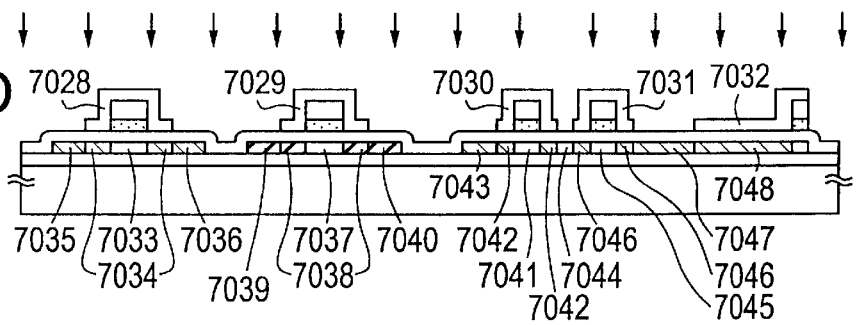
Figure 28E:
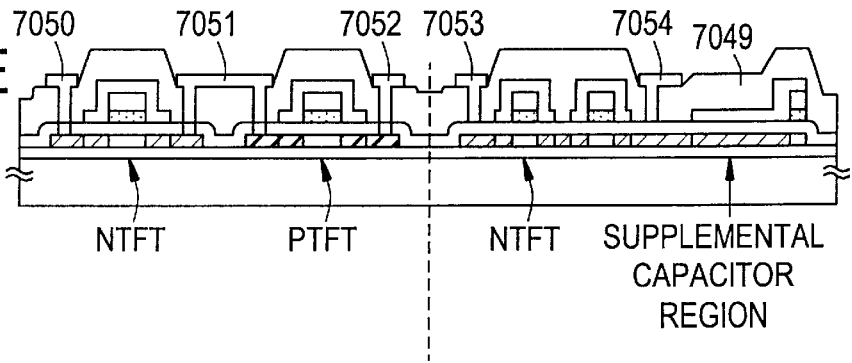
Figure 29A:
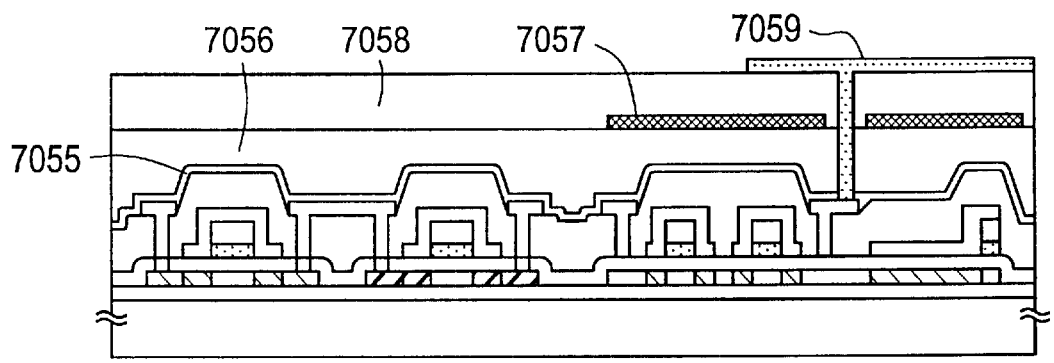
FIGS. 29A and 29B are cross sectional diagrams showing the manufacturing process of a TFT.
Figure 29B:
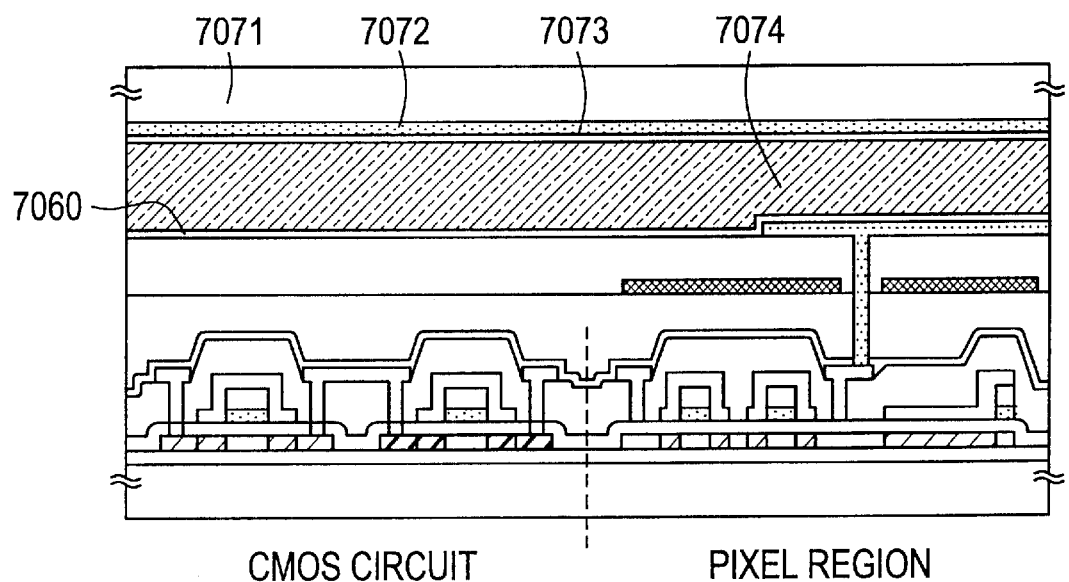

Please refer to FIGS. 28A to 28E, and to FIGS. 29A and 29B. First, a non-alkaline glass substrate, typically a Corning 1737 glass substrate, is used as a substrate 7001. Then a base film 7002 comprising silicon oxide with a thickness of 200 nm is formed on the surface of the substrate 7001 on which a TFT will be formed. The base film 7002 may also be a laminate of silicon oxide films, or may be a single silicon oxide film.

Next, a 50 nm thick amorphous silicon film is formed by plasma CVD on the base film 7002. Dehydrogenation is desirably performed by heating at between 400 and 500° C., although this depends on the hydrogen content in the amorphous silicon film. The hydrogen content in the amorphous silicon film is reduced to 5 atm % or lower, and a crystallization process is performed to form a crystalline silicon film.

A known laser crystallization technique or thermal crystallization technique may be used for this crystallization process. In Embodiment 10, pulse oscillation type KrF excimer laser beams are gathered into a linear shape and irradiated on the amorphous silicon film, forming the crystalline silicon film. Note that the initial film used in Embodiment 10 is an amorphous silicon film, which is crystallized by laser annealing to obtain a polysilicon film, but a microcrystalline silicon film or a directly deposited polysilicon film may also be used. The deposited polysilicon film may of course be subjected to laser annealing. Further, furnace annealing may be substituted for laser annealing. In addition, the method explained above in Embodiment 9 may be used.

The crystalline silicon film thus formed is then patterned, forming island shaped semiconductor layers 7003, 7004, and 7005.

Next, a gate insulating film 7006 containing silicon oxide or silicon oxide as its major constituent is formed, covering the semiconductor layers 7003, 7004, and 7005. A 100 nm thick silicon oxynitride film is formed by plasma CVD here. Then, although not explained in FIGS. 28A to 28E, a 10 to 200 nm thick (for example, 50 nm) tantalum (Ta) film is formed as a first conductive layer, and additionally a 100 to 1000 nm thick (for example, 200 nm) aluminum (Al) film is formed as a second conductive layer, both by sputtering. The first conductive layer and the second conductive layer constitute first gate electrodes on the surface of the gate insulating film 7006. Then first conductive films 7007 to 7010 and second conductive films 7012 to 7015, which constitute the first gate electrodes, are formed by using a known patterning technique.

When using aluminum for the second conductive layers which constitute the first gate electrodes, pure aluminum may be used, and aluminum alloys with an element, chosen from titanium, silicon, and scandium, doped at between 0.1 and 5 atm % may also be used. In addition, although not shown in the figure, when using copper it is desirable to form a silicon nitride film on the surface of the gate insulating film 7006.

Further, FIGS. 28A to 28E shows the structure in which a supplemental capacitor region is formed on the drain side of the n-channel TFT, which constitutes the pixel region. At this time wiring electrodes 7011 and 7016 on the supplemental capacitor region are formed from the same material as that of the first gate electrodes.

After thus forming the structure shown in FIG. 28A, a first n-type impurity doping process is performed. Phosphorous (P), arsenic (As), antimony (Sb), etc., are known as impurity elements that impart n-type to a crystalline semiconductor material, and phosphorous is used here in an ion doping process which uses phosphine ($PH_3$). The acceleration voltage is set as high as 80 KeV for this process in order to dope phosphorous through the gate insulating film 7006, into the semiconductor layer thereunder. Further, is the impurity region thus formed will, as will be shown later, form first impurity regions 7034, 7042, and 7046 on the n-channel type TFT, and functions as an LDD region. Therefore it is desirable that the phosphorous concentration in this region be in the range of $1 \times 10^{16}$ to $1 \times 10^{19}$ atoms/cm$^3$, and it is $1 \times 10^{18}$ atoms/cm$^3$ here.

It is necessary to activate the impurity element doped throughout the semiconductor layer by laser annealing or heat treatment. This process may be performed after the impurity doping process that forms the source region and the drain region, but it is effective to activate by laser annealing at this stage.

The first conductive layers 7007 to 7010, the second conductive layers 7012 to 7015, which constitute the first gate electrode, and wiring electrodes 7011 and 7016 function as masks against the phosphorous doping process. As a result, no or little phosphorous is doped into the region directly under the first gate electrode of the semiconductor layer, which exists through the gate insulating film. Low concentration impurity regions 7017 to 7023, into which phosphorous has been doped, are then formed as shown in FIG. 28B.

Next, the regions where the n-channel type TFT is formed are covered with resist masks 7024 and 7025, and a doping process is performed to impart p-type conductivity on only the region where the p-channel type TFT is formed, by using the photoresist films as masks. Boron (B), aluminum (Al), and Gallium (Ga) are known as such p-type imparting impurity elements, and boron is doped as the impurity element here by using diborane ($B_2H_6$) in an ion doping process. The acceleration voltage is again set to 80 KeV here as boron is doped to a concentration of $2\times10^{20}$ atoms/cm$^3$. High concentration boron doped regions 7026 and 7027 are thus formed as shown in FIG. 28C. These regions will is later become the p-channel type TFT source and drain regions.

After then removing the resist masks 7024 and 7025, a process is performed to form the second gate electrodes. Tantalum (Ta) is used as the second gate electrode material here, and is formed to a thickness of between 100 and 1000 nm, for example, 200 nm. Patterning is then performed using a known technique, forming second gate electrodes 7028 to 7031. The second gate electrodes are patterned at this time to have a thickness of 5 μm. As a result, the second gate electrodes are formed with a region that contacts the gate insulating film at each length of 1.5 μm at both sides of the first gate electrodes.

In addition, the supplemental capacitor region is formed on the drain side of the n-channel type TFT, which constitutes the pixel region, but the supplemental capacitor electrode 7032 is formed at the same time as the second gate electrodes.

A second n-type imparting impurity element doping process is then performed, using the second gate electrodes 7028 to 7031 and the supplemental capacitor electrode 7032 as masks. An ion doping process using phosphine ($PH_3$) is also performed here. Phosphorous must pass through the gate insulating film 7006 to be doped into the semiconductor layers underneath, so the acceleration voltage is also set as high as 80 KeV. The regions where phosphorous is doped here function as source regions 7035 and 7043, and drain regions 7036 and 7047, on the n-channel type TFT, so it is desirable to have a phosphorous concentration from $1\times10^{19}$ to $1\times10^{21}$ atoms/cm$^3$. The concentration is $1\times10^{20}$ atoms/cm$^3$ here.

In addition, although not shown in the figures, phosphorous may be doped directly by removing the gate insulating film which covers the source regions 7035 and 7043, and the drain regions 7036 and 7047, thus exposing the semiconductor layers in these regions. The acceleration voltage for ion doping can be reduced to 10 KeV if this process is added, and phosphorous can be doped with good efficiency.

Further, phosphorous is doped to the same concentration also in a source region 7039 and a drain region 7040 on the p-channel type TFT. However, boron has been doped by the previous process to twice the concentration of phosphorous, so the conductivity type is not inverted, and there are no problems related to the operation of the p-channel type TFT.

It is necessary to perform an activation process because the impurity elements doped at various concentrations to impart n-type or p-type conductivity are not active or effective in this state. Thermal annealing using an electric furnace, laser annealing using the above stated excimer laser, and rapid thermal annealing (RTA) using a halogen lamp can be used for this process.

In thermal annealing, activation is made by heating at 550° C. for 2 hours in a nitrogen environment. Aluminum is used for the second conductive layers which constitute the first gate electrodes in Embodiment 10. However, since the first conductive films and the second gate electrodes, formed from tantalum, are formed covering the aluminum, the tantalum functions as a blocking layer, and therefore aluminum can be prevented from diffusing into other regions. In laser annealing, activation is made by irradiation of pulse oscillation type KrF excimer laser beams which are gathered into a linear shape. Further, an even better result can be obtained by performing thermal annealing after laser annealing. Also, this process also has annealing effect, improving the crystallinity in regions of which crystallinity has been damaged by ion doping.

The gate electrodes, which have the second gate electrodes covering the first gate electrodes, are thus formed by the above processes, and the source region and the drain region are formed on both sides of the second gate electrode of the n-channel type TFT. Further, the structure is formed in a self-aligning manner in which the first impurity region, which is formed in the semiconductor layer through the gate insulating film, and the region where the second gate electrode contacts the gate insulating film, overlap with each other. The p-channel type TFT, on the other hand, has the source region and a portion of the drain region which are formed to overlap the second gate electrode, but this does not become a problem during actual use.

A first interlayer insulating film 7049 is next formed to a thickness of 1000 nm after obtaining the state of FIG. 28D. A silicon oxide film, a silicon nitride film, a silicon oxynitride film, an organic resin film, or a laminate of any of these films can be used as the first interlayer insulating film 7049. Although not shown in the figures, a two layer structure is used in Embodiment 10, in which a 50 nm silicon nitride film is formed first, followed by a 950 nm thick silicon oxide film.

The first interlayer insulating film 7049 is next patterned to form contact holes in each of the source regions and drain regions on the TFT. Then source electrodes 7050, 7052, and 7053, and drain electrodes 7051 and 7054 are formed. Although not shown in the figures, in Embodiment 10 these electrodes are formed by patterning a three layer laminate structure of a 100 nm titanium film, a 300 nm titanium containing aluminum film, and a 150 nm titanium film, formed in succession by sputtering.

The CMOS circuit and the pixel region are formed on the substrate 7001, as shown in FIG. 28E. In addition, the supplemental capacitor region is formed at the same time on the drain side of the pixel region n-channel type TFT. Thus the active matrix substrate is manufactured as above.

The manufacturing process of an active matrix type liquid crystal display device is next explained using FIGS. 29A and 29B, based on the CMOS circuit and the pixel region formed on the same substrate by the above processes. First, the source electrodes 7050, 7052, and 7053, the drain electrodes 7051 and 7054, and a passivation film 7055, which covers the first interlayer insulating film 7045, are formed on substrate in the state of FIG. 28E. The passivation film 7055 is formed from a 50 nm thick silicon nitride film. In addition, a second interlayer insulating film 7056 is formed from an organic resin to about a 1000 nm thickness. Polyimide, acrylic, polyimide amide, etc., can be used as the organic resin film. The advantages of using an organic resin film include a simple method of deposition, a lower parasitic capacity owing to a low dielectric constant, and superior evenness. Note that organic resins other than those given above can be used. A thermal polymerization type polyimide is used here, so it is baked at 300° C. after being applied to the substrate.

Next, a light shielding layer 7057 is formed on a portion of the second interlayer insulating film 7056. The shielding layer 7057 may be formed from a metallic film or an organic resin film containing pigments. A titanium film is formed by sputtering here.

A third interlayer insulating film 7058 is formed after forming the shielding film 7057. It is desirable to form the third interlayer insulating film 7058 by using an organic resin, similar to the second interlayer insulating film 7056. Then a contact hole that reaches the drain electrode 7054 is formed through the second interlayer insulating film 7056 and the third interlayer insulating film 7058 to form a pixel electrode 7059. A is transparent conductive film may be used for the pixel electrode 7059 in a transmission type liquid crystal display device, while a metallic film may be used for the case of a reflection type liquid crystal display device. A transmission type liquid crystal display device is used here, so an indium-tin oxide film (ITO film) is formed by sputtering to a thickness of 100 nm, forming the pixel electrode 7059.

An orientation film 7060 is formed after obtaining the state of FIG. 29A. A polyimide resin is often used for the orientation film of a normal liquid crystal display element. An opposing electrode 7072 and an orientation film 7073 are formed on an opposing substrate 7071. After forming the orientation film, a rubbing process is performed to create a parallel orientation in which the liquid crystal molecules hold a fixed pre-tilt angle.

After passing through the above processes, the substrate, on which the pixel region and CMOS circuit have been formed, and the opposing substrate are joined together with a known cell construction process using a sealant material, spacers (both not shown in the figures), etc. Afterward a liquid crystal material (nematic liquid crystal) 7074 is injected into the space between the substrates, which are then completely sealed by an end-sealing material (not shown). Thus the active matrix type liquid crystal display device of FIG. 29B is completed.

EMBODIMENT 11

A nematic liquid crystal is used in Embodiments 1 to 10, but a ferroelectric liquid crystal may also be used. There are no limitations on the liquid crystal material in Embodiment 11. Further, the driving circuit of the present invention can be used in a semiconductor display device which employs any type of liquid crystal material of which the optical parameters change in accordance with the voltage.

EMBODIMENT 12

A top gate type thin film transistor is explained in Embodiments 7 and 8, but a bottom gate type transistor may also be used in the present invention.

EMBODIMENT 13

Si is used in the active layer of the TFT in Embodiments 7 and 8, but a semiconductor film containing Ge or $Si_xGe_{1-x}$ may be used in the thin film transistor which is used in the semiconductor display device of the present invention.

EMBODIMENT 14

Figure 30:
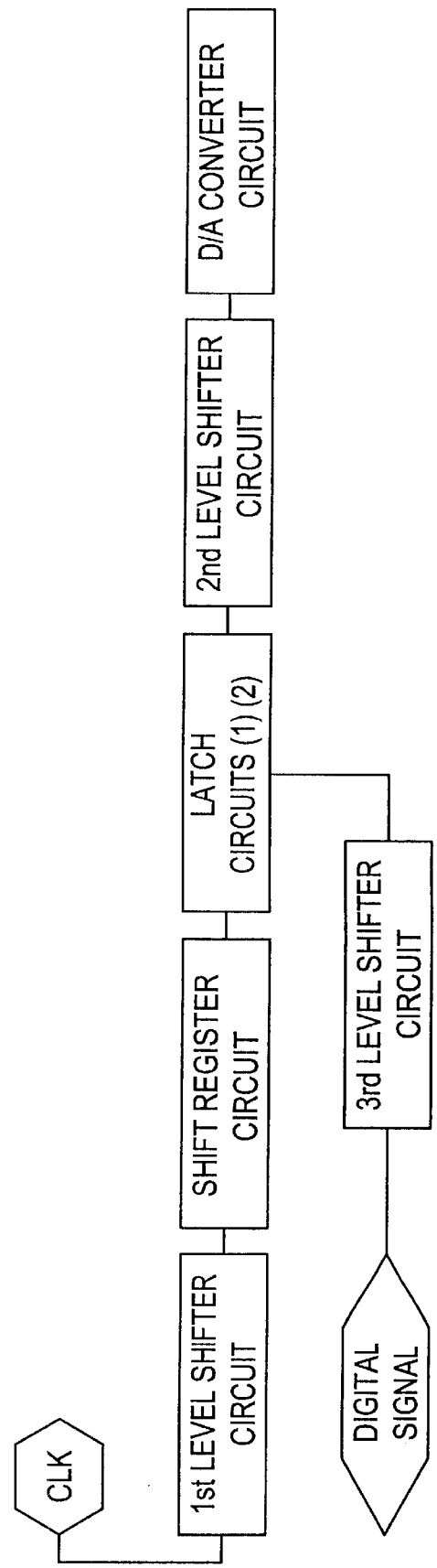
FIG. 30 is a block diagram of a source signal line side driving circuit of the digital drive system of the present invention.

Embodiment 14 is an example of the present invention applied to a source signal line side driving circuit of a digital drive type active matrix type liquid crystal display device. FIG. 30 is a block diagram of an example of the digital drive type source signal line side driving circuit of Embodiment 14.

A first level shifter circuit, a third level shifter circuit, a shift register circuit, a first latch circuit (latch circuit 1), a second latch circuit (latch circuit 2), a second level shifter circuit, and a D/A converter circuit are formed in the order shown in FIG. 30 for the digital drive type source signal line side driving circuit of Embodiment 14.

Figure 31:
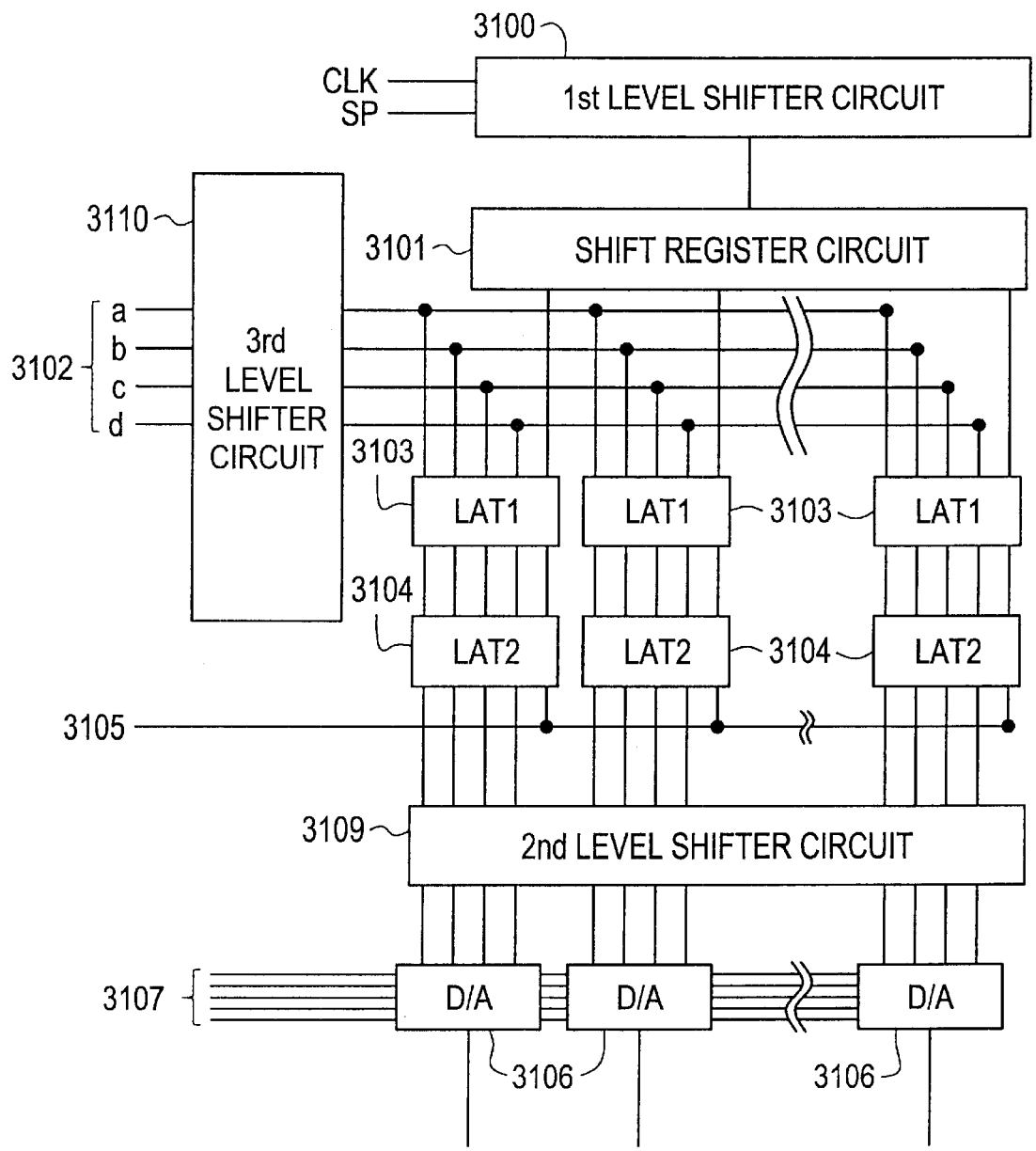
FIG. 31 is a circuit diagram of a source signal line side driving circuit of the digital drive system of the present invention.

An example of a detailed circuit diagram of the digital drive type source signal line side driving circuit of FIG. 30 is shown in FIG. 31. The example here is an active matrix type liquid crystal display device for the case of a 4 bit digital drive system.

A first level shifter circuit 3100, a shift register circuit 3101, digital decoder address lines 3102a to 3102d, first latch circuits (LAT1) 3103, second latch circuits (LAT2) 3104, a latch pulse line 3105, D/A converter circuits 3106, gradation voltage lines 3107, source signal lines 3108, a second level shifter circuit 3109, and a third level shifter circuit 3110 are arranged as shown in FIG. 31. Note that four latch circuits are grouped together and shown as the latch circuits 3103 and 3104 (LAT1 and LAT2) for convenience. In addition, for convenience's sake, a level shifter circuit that increases the voltage amplitude level of a clock signal, and a level shifter circuit that increases the voltage amplitude level of a start pulse signal are grouped together and shown as the first level shifter circuit 3100.

A clock signal CLK is input to the first level shifter circuit 3100 from external to the source signal line side driving circuit. The voltage amplitude level of the clock signal is as low as possible within the range in which the first level shifter circuit 3100 can operate because of the demand to suppress unwanted radiation to a level at which it does not become a problem. In addition, this is necessary in order to suppress power consumption.

The clock signal input to the first level shifter circuit 3100 is made higher in voltage and then output. It is necessary that the voltage amplitude level of the clock signal at this time be increased to a voltage amplitude level at which the shift register circuit 3101 TFT is not damaged by punch through or hot electrons due to the short channel effect, and at which the TFT, with a manufacturable channel length, can operate.

The clock signal, with its voltage amplitude level increased by the first level shifter circuit 3100, is input to the shift register circuit 3101. In addition, the start pulse signal, with its voltage amplitude level increased by the first level shifter circuit 3100, is input to shifter register circuit 3101 through the line shown in FIG. 31. The shift register circuit 3101 starts operation based on the clock signal input to the shift register circuit 3101, and in accordance with the start pulse signal (SP) also input to the shift register circuit 3101, and creates a timing signal that determines the timing for writing a digital signal to the first latch circuit 3103.

The digital signal (digital gradation signal) is input to the third level shifter circuit 3110 through the digital decoder address lines 3102a to 3102d. The input digital signal is made higher in voltage and then output. It is necessary to increase the voltage amplitude level of the digital signal at this time to a voltage amplitude level at which the shift register circuit 3101 TFT is not damaged by punch through or hot electrons due to the short channel effect, and at which the TFT, with a manufacturable channel length, can operate. The digital signal that has been made higher in voltage and then output is written in order to the first latch circuit 3103 in accordance with the timing signal created by the shift register circuit 3101. The most significant bit (MSB) of the digital signal is input from the digital decoder address line 3102a, and the least significant bit (LSB) of the digital signal is input from the digital decoder address line 3102b.

After the writing of the digital signal is completed with respect to the first latch circuit 3103, the digital signal written into the first latch circuit 3103 is transmitted and written to the second latch circuit 3104, simultaneous with a latch pulse which flows in the latch pulse line 3105 in time with the operation timing of the shift register circuit 3101.

The writing of another digital signal to the first latch circuit 3101, which is again supplied by the digital decoder, is performed in order and in accordance with a signal from the shift register circuit 3101, after the transmission of the previous digital signal to the second latch circuit 3104 is complete.

During the second one-line period, the digital signal with a voltage amplitude level corresponding to the digital signal transmitted to the second latch circuit 3104, in time with the start of the second one-line period, is input to the second level shifter circuit 3104.

The digital signal input to the second level shifter circuit 3109 is made higher in voltage. It is necessary for the digital signal to be increased at this time to a voltage amplitude level that includes a certain fixed margin voltage.

The margin voltage is in order to convert the digital signal input to the D/A converter circuit 3106 to an analog signal. The size of the margin voltage is dependent upon the voltage of the largest analog signal output from the D/A converter circuit 3106.

The digital signal with voltage increased by the second level shifter circuit 3109 is input to the D/A converter circuit 3106 and converted to an analog signal, and the analog signal is supplied to the source signal lines 3108 corresponding to a one-line period interval. Switching of corresponding pixel TFTs is performed in accordance with a selection signal from the shift register circuit in a gate signal line side driving circuit, and the liquid crystal molecules are driven.

By repeatedly performing the above operations for the number of scanning lines, one screen (one frame) is formed. In general, the writing of 60 frames of images per second is performed in an active matrix type liquid crystal display device.

As such, by forming level shifter circuits before and after a shift register circuit in a digital drive type source signal line side driving circuit with the present invention, a clock signal which has a voltage amplitude level low enough so that the shift register circuit TFT is not damaged by punch through or hot electrons due to the short channel effect, and high enough so that a TFT with a manufacturable channel length will operate, can be input to the shift register circuit. As a result, the shift register circuit can be operated at higher speed.

In addition, even if the voltage amplitude level of the clock signal input from external to the source signal line side driving circuit is reduced as much as possible within the range in which the level shifter circuit can operate, high-speed operation of the shift register circuit is possible, so power consumption and unwanted radiation can be suppressed to such an extent that they do not become problems.

Further, the frequency of a digital signal is several tens of MHz larger than the frequency of an image signal of an analog type driving circuit, so unwanted radiation becomes a problem. Therefore it is desirable to reduce the voltage of the digital signal, but if the voltage amplitude level of the digital signal is lower than the gradation voltage, it becomes difficult to convert the digital signal into an analog signal by the D/A converter. With the present invention, it is possible to reduce the voltage amplitude level of a digital signal, input to a latch circuit from external to a digital drive type source signal line side driving circuit, as much as possible within the range at which a level shifter circuit can operate. Therefore, the voltage of the digital signal input to the latch circuit can be suppressed, and it is possible to suppress unwanted radiation and power consumption.

An example of the present invention applied to a digital circuit source signal line side driving circuit is explained in Embodiment 14, but the present invention is not limited to the preferred embodiment of Embodiment 14. It is also possible to use the present invention in a digital circuit gate signal line side driving circuit, and additionally in both a digital circuit source signal line side driving circuit and a digital circuit gate signal line side driving circuit.

EMBODIMENT 15

In addition to nematic liquid crystals, it is possible to use many kinds of liquid crystals for the liquid crystal display devices of the present invention. For example, it is possible to use the liquid crystals disclosed in: Furue, H. et al., "Characteristics and Driving Scheme of Polymer-Stabilized Monostable FLCD Exhibiting Fast Response Time and High Contrast Ratio with Gray-Scale Capability", SID, 1998; Yoshida, T. et al., "A Full-Color Thresholdless Antiferroelectric LCD Exhibiting Wide Viewing Angle with Fast Response Time", SID Digest, 841, 1997; Inui, S. et al., "Thresholdless Antiferroelectricity in Liquid Crystals and its Application to Displays", J. Mater. Chem., 6(4), p. 671–3, 1996; and in U.S. Pat. No. 5,594,569.

Figure 33:
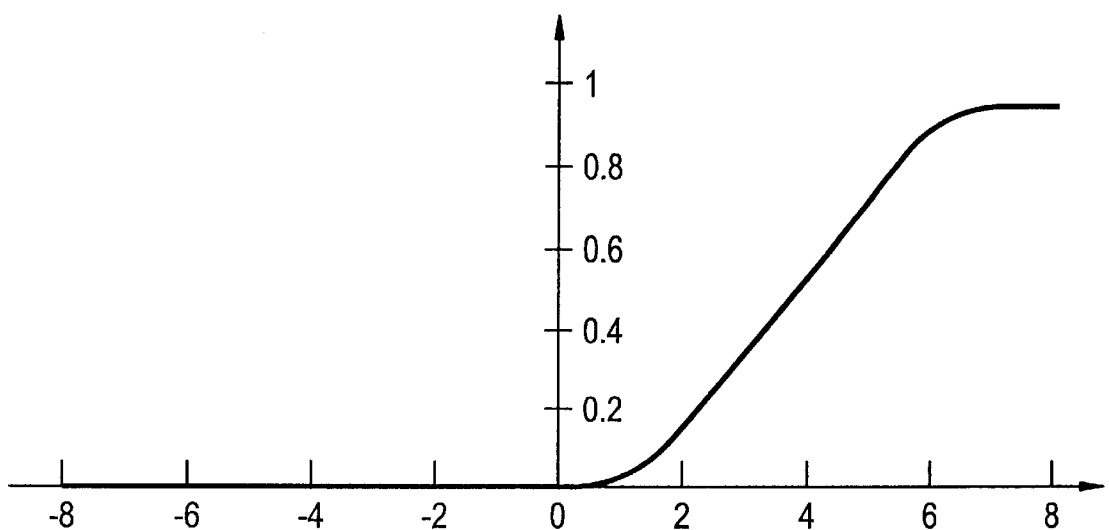
FIG. 33 is a diagram showing the electro-optical characteristics of a mono-stable FLC.

The resulting electro-optical characteristics of a monostable FLC are shown in FIG. 33. In the drawings, a ferroelectric liquid crystal (FLC) exhibiting a phase transition system of an isotropic phase—cholesteric phase—chiralsmectic phase is used to perform a phase transition between the cholesteric phase and the chiralsmectic phase, while applying a DC voltage, and the cone edge is made to nearly conform with the is rubbing direction. The display mode of a ferroelectric liquid crystal like that shown in FIG. 33 is called "half-V switching mode." The vertical axis of the graph shown in FIG. 33 is the transmittance (in arbitrary units), and the horizontal axis is the applied voltage. Details regarding the "half-V switching mode" may be found in: Terada, et al., "Half-V Switching Mode FLCD", Proceedings of the 46th Applied Physics Association Lectures, p. 1316, March 1999; and in Yoshihara, et al., "Time Partition Full Color LCD with Ferroelectric Liquid Crystal", Liquid Crystals, vol. 3, no. 3, p. 190.

As shown in FIG. 33, it is apparent that if this type of ferroelectric mixed liquid crystal is used, it is possible to have a low voltage drive and a gradation display. A ferroelectric liquid crystal that shows these electro-optical characteristics can be used for the liquid crystal display device of the present invention.

In addition, a liquid crystal that exhibits an anti-ferroelectric phase in a certain temperature range is called an anti-ferroelectric liquid crystal (AFLC). Among mixed liquid crystals, which have an anti-ferroelectric liquid crystal, there is one so-called thresholdless antiferroelectric mixed liquid crystal that shows electro-optical response characteristics in which the transmittance continuously changes in response to the electric field. Some thresholdless antiferroelectric mixed liquid crystals show V-type electro-optical response characteristics, and also have been found one that has a drive voltage of approximately ±2.5 V (when the cell thickness is between 1 and 2 $\mu$m).

Further, in general the spontaneous polarization of a thresholdless antiferroelectric mixed liquid crystal is large, and the dielectric constant of the liquid crystal itself is high. Thus, a relatively large storage capacitor is required for pixels when a thresholdless antiferroelectric mixed liquid crystal is used for a liquid crystal display device. Therefore it is desirable to use a thresholdless antiferroelectric mixed liquid crystal that has a smaller spontaneous polarization.

Note that by using this type of thresholdless antiferroelectric mixed liquid crystal for the liquid crystal display devices of the present invention, a low drive voltage can be realized, so low power consumption can also be realized.

EMBODIMENT 16

This example demonstrates a process for producing an active matrix type EL (electroluminescence) display device according to the invention of the present application.

Figure 34A:
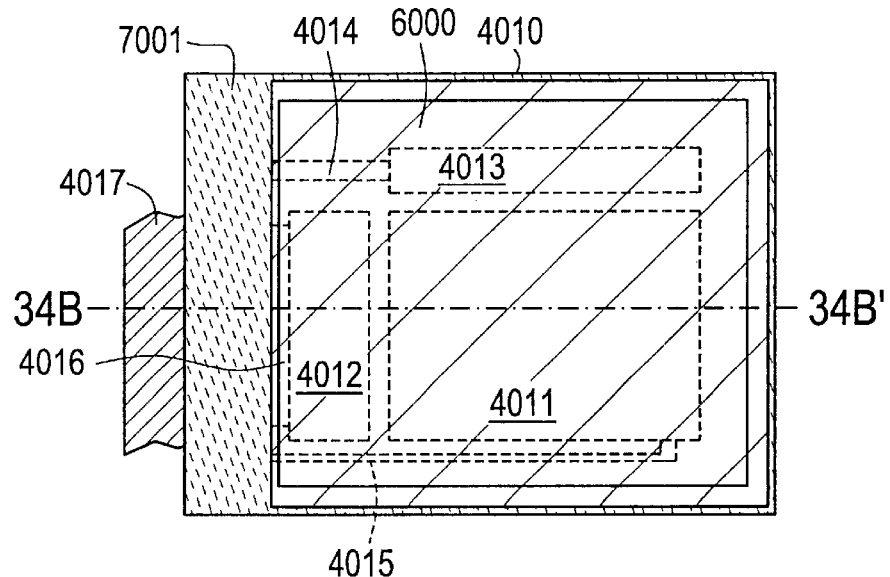
FIGS. 34A to 34B are views showing a structure of an active matrix type EL display panel.

FIG. 34A is a top view showing an EL display device, which was produced according to the invention of the present application. In FIG. 34A, there are shown a substrate 4010, a pixel region 4011, a source signal line side driving circuit 4012, and a gate signal line side driving circuit 4013, each driving circuit connecting to wirings 4014–4016 which reach FPC 4017 leading to external equipment.

The pixel region, preferably together with the driving circuit, is enclosed by a covering material 6000, a sealing material (or housing material) 7000, and an end-sealing material (or second sealing material) 7001.

Figure 34B:
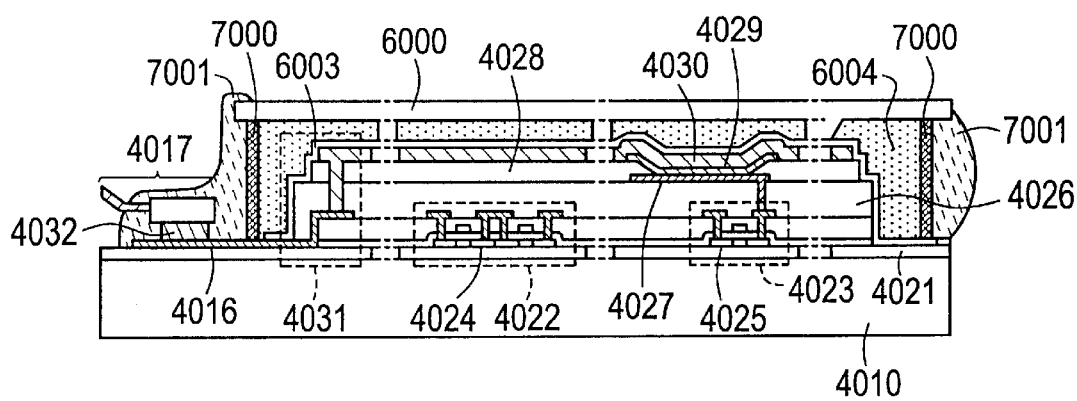

FIG. 34B is a sectional view showing the structure of the EL display device in this Example. There is shown a substrate 4010, a base film 4021, a TFT 4022 (CMOS circuit consisting of an n-channel type TFT and a p-channel type TFT) for the driving circuit, and a TFT 4023 for the pixel region to control current to the EL element. These TFTs may be formed using conventional structure such as bottom gate or top gate structure.

Incidentally, the present invention is used in the source signal line driving circuit 4012 or the gate signal line driving circuit 4013.

Upon completion of TFT 4022 (for the driving circuit) and TFT 4023 (for the pixel region) according to the invention of the present application, a pixel electrode 4027 is formed on the interlayer insulating film (planarizing film) 4026 made of a resin. This pixel electrode 4027 is electrically connected to the drain of TFT 4023 for the pixel region. When the pixel electrode comprises a transparent conductive film, a p-channel type TFT is used as the TFT for the pixel region. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as a hole injection layer, a hole transport layer, a light emitting layer, an electron transport layer, and an electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

A cathode 4030 is formed on the EL layer 4029. Prior to this step, it is desirable to clear moisture and oxygen as much as possible from the interface between the EL layer 4029 and the cathode 4030. This object may be achieved by forming the EL layer 4029 and the cathode 4030 subsequently in a vacuum, or by forming the EL layer 4029 in an inert atmosphere and then forming the cathode 4030 in the same atmosphere without exposing to air. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of µm sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

In this embodiment, the covering material 6000 is adhered after disposing the filling material 6004, and the sealing material 7000 is attached so as to cover the side face (an exposed-face) of the filling material. However, the filling material 6004 can be disposed after attaching the cover material 6000 and the sealing material 7000. In this case, an opening is formed for injecting the filling material into a space between the substrate 4010, the covering material 6000 and the sealing material 7000. Then the space is evacuated (less than $10^{-2}$ Torr) and the opening is immersed in the filling material tank. And the filling material fills the space by making the outside pressure of the space higher than the inside pressure of the space.

EMBODIMENT 17

Figure 35A:
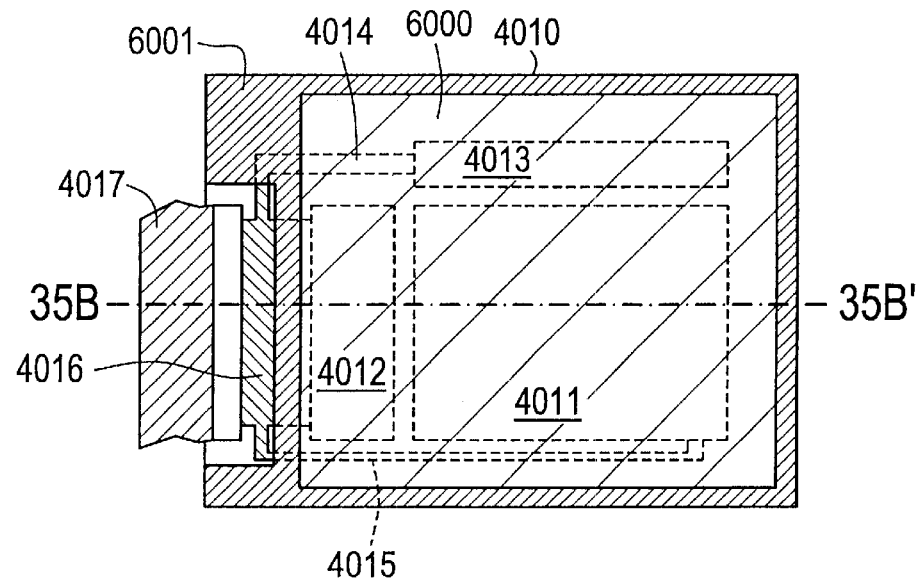
FIGS. 35A to 35B are views showing a structure of an active matrix type EL display panel.
Figure 35B:
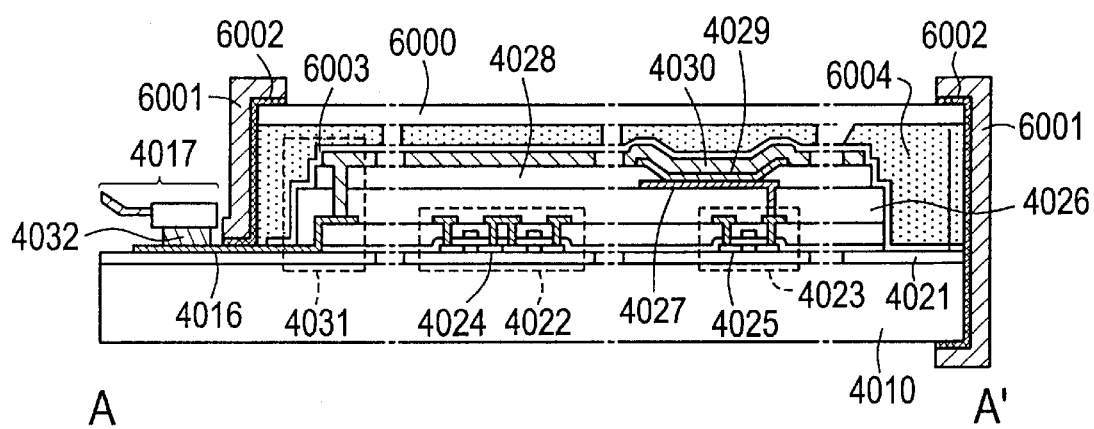

In this embodiment, another active matrix type EL display device having a different structure from the embodiment 16 is explained, as shown in FIGS. 35A and 35B. The same reference numerals in FIGS. 35A and 35B as in FIGS. 34A and 34B indicate same constitutive elements, so an explanation is omitted.

FIG. 35A shows a top view of the EL module in this embodiment and FIG. 35B 1s shows a sectional view of A–A' of FIG. 35A.

According to Embodiment 16, the passivation film 6003 is formed to cover a surface of the EL element.

The filling material 6004 is formed to cover the EL element and also functions as an adhesive to adhere to the covering material 6000. As the filling material 6004, PVC 20 (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of µm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 6004. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

In this embodiment, the covering material 6000 is adhered after disposing the filling material 6004, and the sealing material 7000 is attached so as to cover the side face (an exposed face) of the filling material. However, the filling material 6004 can be disposed after attaching the cover material 6000 and the sealing material 7000. In this case, an opening is formed for injecting the filling material into a space between the substrate 4010, the covering material 6000 and the sealing material 7000. Then the space is evacuated (less than $10^{-2}$ Torr) and the opening is immersed in the filling material tank. And the filling material fills the space by making the outside pressure of the space higher than the inside pressure of the space.

EMBODIMENT 18

Figure 36:
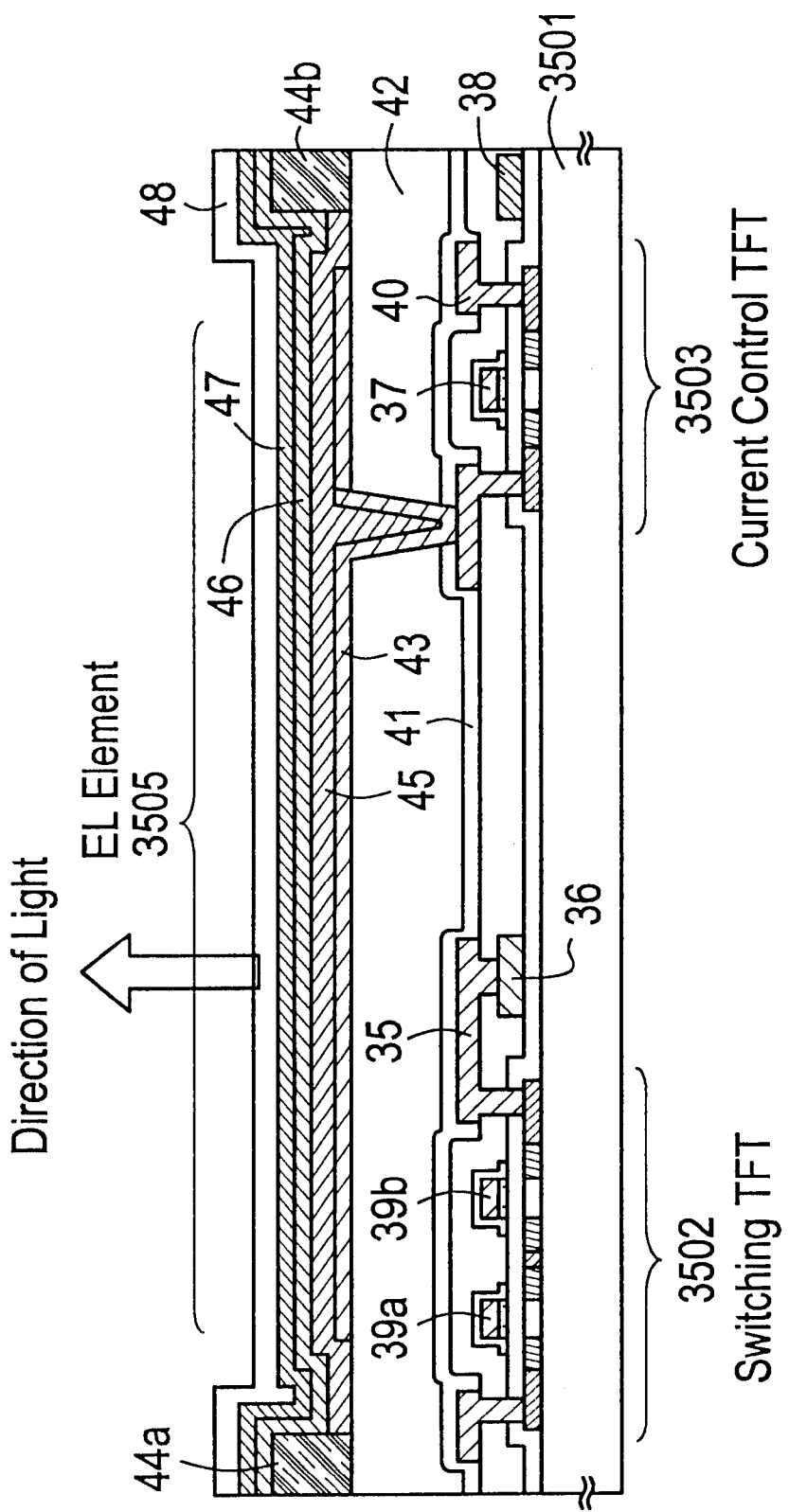
FIG. 36 is a view showing a cross section of a pixel region in the an active matrix type EL display panel.
Figure 37A:
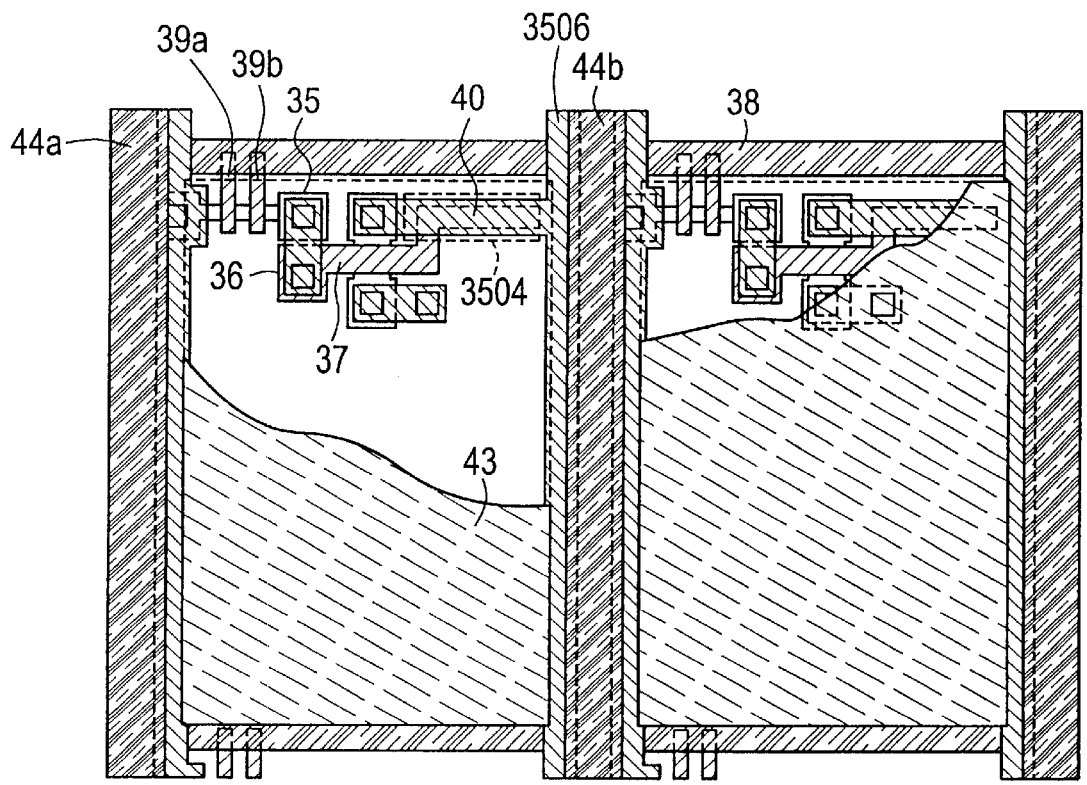
FIGS. 37A to 37B are views showing a structure of the pixel region in an active matrix type EL display panel and a circuit structure for the pixel region, respectively.
Figure 37B:
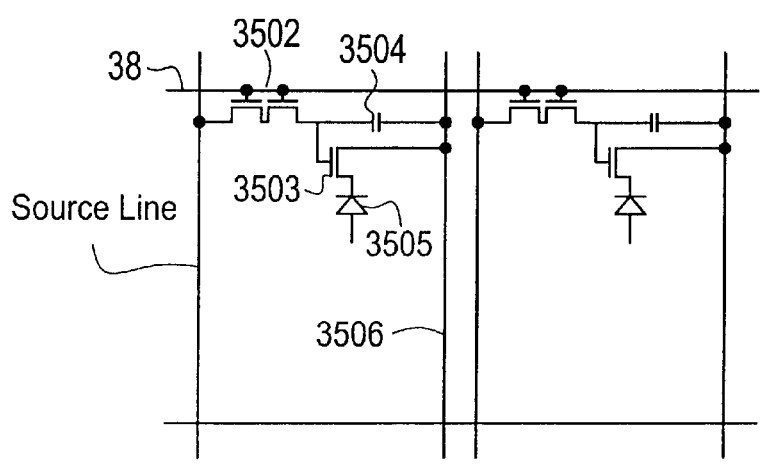

This example can be applied to the EL display panel having a structure as shown in Embodiment 16 and 17. FIG. 36 shows the cross section of the pixel region; FIG. 37A shows the top view thereof; and FIG. 37B shows the circuit structure for the pixel region. In FIG. 36, FIG. 37A and FIG. 37B, the same reference numerals are referred to for the same portions, as being common thereto.

In FIG. 36, the switching TFT 3502 formed on the substrate 3501 is a conventional NTFT. In this Embodiment, it has a double-gate structure, but its structure and fabrication process do not so much differ from the structures and the fabrication processes illustrated hereinabove, and their description is omitted herein. However, the double-gate structure of the switching TFT 3502 has substantially two TFTs as connected in series, and therefore has the advantage of reducing the off-current to pass therethrough. In this Embodiment, the switching TFT 3502 has such a double-gate structure, but is not limitative. It may have a single-gate structure or a triple-gate structure, or even any other multi-gate structure having more than three gates. As the case may be, the switching TFT 3502 may be PTFT of the invention.

The current-control TFT 3503 is a conventional NTFT. The drain wire 35 in the switching TFT 3502 is electrically connected with the gate electrode 37 of the current-control TFT, via the wire 36 therebetween. The wire indicated by 38 is a gate wire for electrically connecting the gate electrodes 39a and 39b in the switching TFT 3502.

The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which an LDD region is so constructed that the gate electrode overlaps with the drain area is in the current-control TFT, via a gate insulating film therebetween.

In this Embodiment, the current-control TFT 3503 is illustrated to have a singlegate structure, but it may have a multi-gate structure with plural TFTs connected in series. In addition, plural TFTs may be connected in parallel so that the channel forming region is substantially divided into plural sections. In the structure of that type, heat radiation can be effected efficiently. The structure is advantageous for protecting the device with it from thermal deterioration.

As in FIG. 37A, the wire to be the gate electrode 37 in the current-control TFT 3503 overlaps with the drain wire 40 therein in the region indicated by 3504, via an insulating film therebetween. In this state, the region indicated by 3504 forms a capacitor. The capacitor 3504 functions to retain the voltage applied to the gate electrode in the current-control TFT 3503. The drain wire 40 is connected with the current supply line (power line) 3506, from which a constant voltage is all the time applied to the drain wire 40.

On the switching TFT 3502 and the current-control TFT 3503, a first passivation film 41 is formed. On the film 41, formed is a planarizing film 42 of an insulating resin. It is extremely important that the difference in level of the layered portions in TFT is removed through planarization with the planarizing film 42. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 43 indicates a pixel electrode (a cathode in the EL device) of an conductive film with high reflectivity. The pixel electrode 43 is electrically connected with the drain region in the current-control TFT 3503. It is preferable that the pixel electrode 43 is of a low-resistance conductive film of an aluminum alloy, a copper alloy or a silver alloy, or of a laminate of those films. Needless-to-say, the pixel electrode 43 may have a laminate structure with any other conductive films.

In the recess (this corresponds to the pixel) formed between the banks 44a and 44b of an insulating film (preferably of a resin), the light-emitting layer 45 is formed. In the illustrated structure, only one pixel is shown, but plural light-emitting layers could be separately formed in different pixels, corresponding to different colors of R (red), G (green) and B (blue). The organic EL material for the light-emitting layer may be any δ-conjugated polymer material. Typical polymer materials usable herein include poly-paraphenylenevinylene (PVV) materials, polyvinylcarbazole (PVK) materials, polyfluorene materials, etc.

Various types of PVV-type organic EL materials are known, such as those disclosed in H. Shenk, H. Becker, O. Gelsen, E. Klunge, W. Kreuder, and H. Spreitzer; Polymers for Light Emitting Diodes, Euro Display Proceedings, 1999, pp. 33–37 and in Japanese Patent Laid-Open No. 10–92576 (1998). Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this embodiments to demonstrate an embodiment of using polymer materials to form light-emitting layers, which, however, is not limitative. Low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 46 of PEDOT (polythiophene) or PAni (polyaniline) is formed on the light-emitting layer 45 to give a laminate structure for the EL layer. On the hole injection layer 46, formed is an anode 47 of a transparent conductive film. In this Embodiment, the light having been emitted by the light-emitting layer 45 radiates therefrom in the direction toward the top surface (that is, in the upward direction of TFT). Therefore, in this, the anode must transmit light. For the transparent conductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent conductive film for the anode is of a material capable of being formed into a film at as low as possible temperatures.

When the anode 47 is formed, the EL device 3505 is finished. The EL device 3505 thus fabricated herein indicates a capacitor comprising the pixel electrode (cathode) 43, the light-emitting layer 45, the hole injection layer 46 and the anode 47. As in FIG. 37A, the region of the pixel electrode 43 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 48 is formed on the anode 47. For the second passivation film 48, preferably used is a silicon nitride film or a silicon nitride oxide film. The object of the film 48 is to insulate the EL device from the outward environment. The film 48 has the function of preventing the organic EL material from being degraded through oxidation and has the function of preventing it from degassing. With the second passivation film 48 of that type, the reliability of the EL display device is improved.

As described hereinabove, the EL display panel of the invention fabricated in this Embodiment has a pixel region for the pixel having the constitution as in FIG. 36, and has the switching TFT through which the off-current to pass is very small to a satisfactory degree, and the current-control TFT resistant to hot carrier injection. Accordingly, the EL display panel fabricated herein has high reliability and can display good images.

The constitution of this Embodiment can be combined with any constitution of Embodiments 1 to 17 in any desired manner.

EMBODIMENT 19

This Embodiment is to demonstrate a modification of the EL display panel of Embodiment 18, in which the EL device 3505 in the pixel region has a reversed structure. For this Embodiment, referred to is FIG. 38. The constitution of the EL display panel of this Embodiment differs from that illustrated in FIG. 36 only in the EL device portion and the current-control TFT portion. Therefore, the description of the other portions except those different portions is omitted herein.

Figure 38:
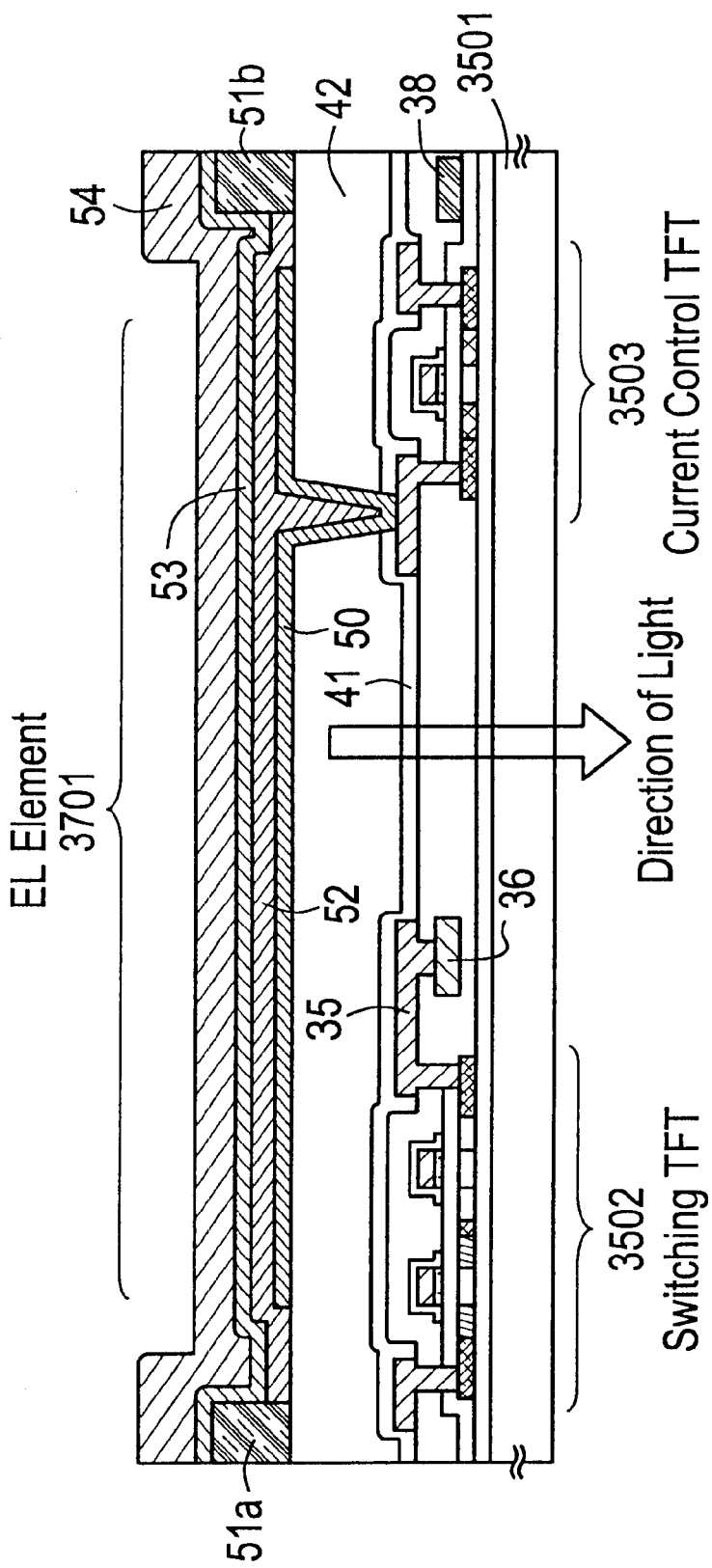
FIG. 38 is a view showing a structure of a pixel region in an active matrix type EL display panel.

In FIG. 38, the current-control TFT 3701 may be a conventional PTFT

In this Embodiment, the pixel electrode (anode) 50 is of a transparent conductive film. Concretely, used is an conductive film of a compound of indium oxide and zinc oxide. Needless-to-say, also usable is an conductive film of a compound of indium oxide and tin oxide.

After the banks 51a and 51b of an insulating film have been formed, a light-emitting layer 52 of polyvinylcarbazole is formed between them in a solution coating method. On the light-emitting layer 52, formed are an electron injection layer 53 of acetylacetonatopotassium, and a cathode 54 of an aluminum alloy. In this case, the cathode 54 serves also as a passivation film. Thus is fabricated the EL device 3701.

In this Embodiment, the light having been emitted by the light-emitting layer radiates in the direction toward the substrate with TFT formed thereon, as in the direction of the arrow illustrated.

The constitution of this Embodiment can be combined with any constitution of Embodiments 1 to 17 in any desired manner.

EMBODIMENT 20

This Embodiment is to demonstrate modifications of the pixel with the circuit structure of FIG. 37B. The modifications are as in FIG. 39A to FIG. 39C. In this Embodiment illustrated in those FIG. 38A to FIG. 38C, 3801 indicates the source signal line for the switching TFT 3802; 3803 indicates the gate signal line for the switching TFT 3802; 3804 indicates a current-control TFT; 3805 indicates a capacitor; 3806 and 3808 indicate current supply lines; and 3807 indicates an EL element.

Figure 39A:
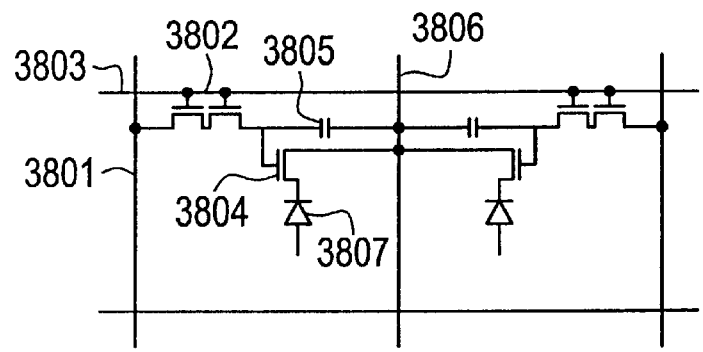
FIGS. 39A to 39C are views showing circuit structures for pixel regions in active matrix type EL display panels.

In the embodiment of FIG. 39A, the current supply line 3806 is common to the two pixels. Specifically, this embodiment is characterized in that two pixels are lineal-symmetrically formed with the current supply line 3806 being the center between them. Since the number of current supply lines can be reduced therein, this embodiment is advantageous in that the pixel region can be much finer and thinner.

Figure 39B:
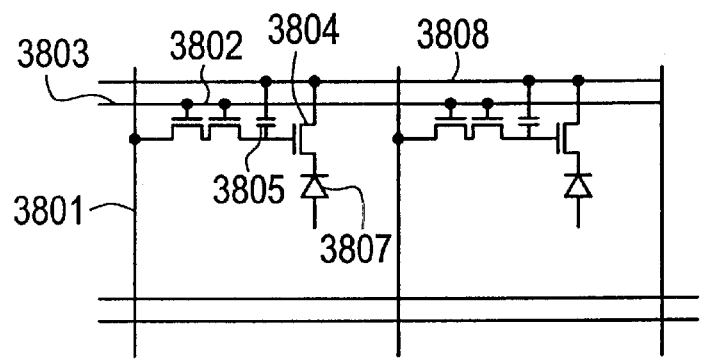

In the embodiment of FIG. 39B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this embodiment is advantageous in that the pixel pattern can be much finer and thinner.

Figure 39C:
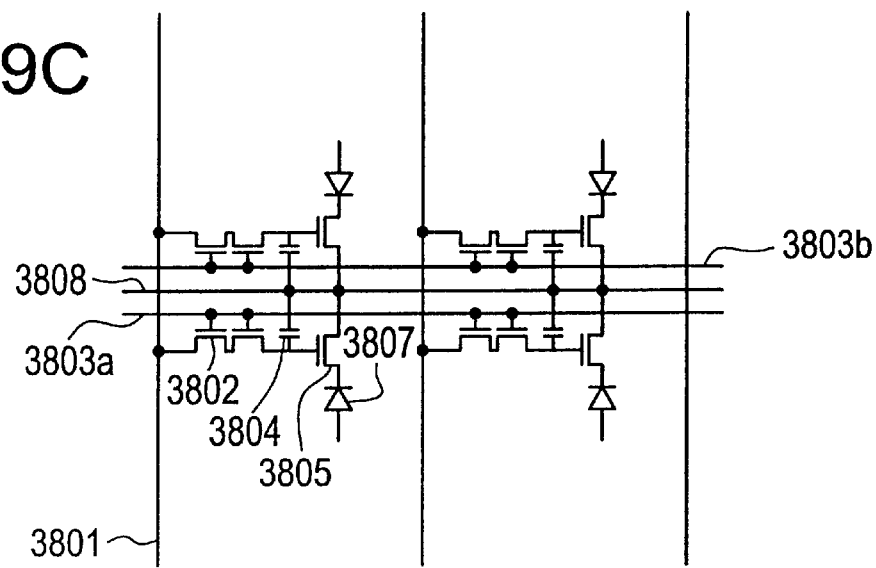

The structure of the embodiment of FIG. 39C is characterized in that the current supply line 3808 is formed in parallel to the gate wires 3803, like in FIG. 39B, and that two pixels are lineal-symmetrically formed with the current supply line 3808 being the center between them. In this, it is also effective to provide the current supply line 3808 in such a manner that it overlaps with any one of the gate wires 3803. Since the number of current supply lines can be reduced therein, this embodiment is advantageous in that the pixel pattern can be much finer and thinner.

The constitution of this Embodiment can be combined with any constitution of Embodiments 1 to 17 in any desired manner.

EMBODIMENT 21

The embodiment of Embodiment 18 illustrated in FIG. 37A and FIG. 37B is provided with the capacitor 3504 which acts to retain the voltage applied to the gate in the current-control TFT 3503. In the embodiment, however, the capacitor 3504 may be omitted.

In the embodiment of Embodiment 18, the current-control TFT 3503 is NTFT, and the LDD region is so formed that it overlaps with the gate electrode via the gate insulating film therebetween. In the overlapped region, formed is a parasitic capacitance generally referred to as a gate capacitance. The embodiment of this Embodiment is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also in the embodiments of Embodiment 20 illustrated in FIG. 39A, FIG. 39B and FIG. 39C, the capacitor 3805 can be omitted.

The constitution of this Embodiment can be combined with any constitution of Embodiment 1 to 20 in any desired manner.

EMBODIMENT 22

There are various uses for electronic equipment that uses a semiconductor display device (typically an active matrix liquid crystal display device, an active matrix type EL display device, or an active matrix type EC display device) manufactured in accordance with the present invention. Electronic equipment into which a semiconductor display device that uses a driving circuit manufactured in accordance with the present invention is incorporated.

The following can be given as examples of this type of electronic equipment: video cameras; still cameras; digital cameras; projectors (rear type and front type); head mount displays (goggle type displays); game machines; car navigation systems; personal computers; portable information terminals (such as mobile computers, portable telephones, and electronic books), etc. Some examples of these are shown in FIGS. 16A–16E, 17A–17B, and 32A to 32C.

Figure 16A:
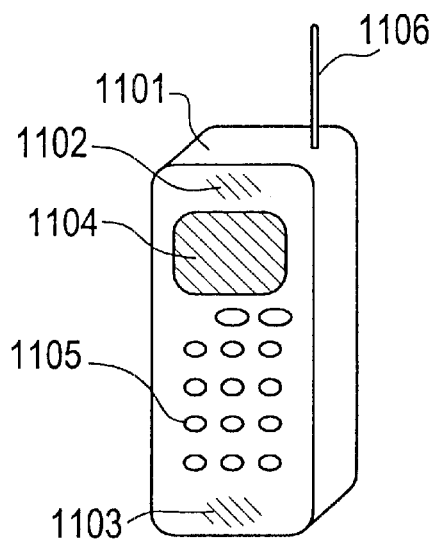
FIGS. 16A to 16E are structural diagrams of electronic equipment using the present invention.

FIG. 16A is a portable telephone, and is composed of a main body 1101, a sound output section 1102, a sound input section 1103, a semiconductor display device 1104, operation switches 1105, and an antenna 1106. The present invention can be applied to the semiconductor display device 1104, to the sound input section 1103, and to other signal control circuits.

Figure 16B:
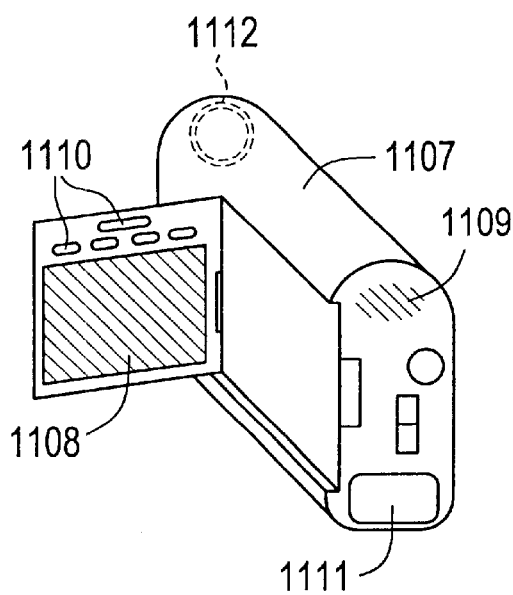

FIG. 16B is a video camera, and is composed of a main body 1107, a semiconductor display device 1108, a sound input section 1109, operation switches 1110, a battery 1111, and an image receiving section 1112. The present invention can be applied to the semiconductor display device 1108, to the sound input section 1109, and to other signal control circuits.

Figure 16C:
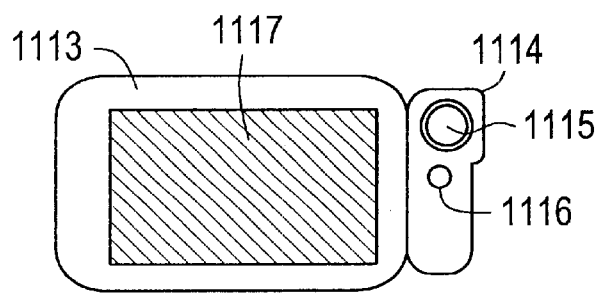

FIG. 16C is a mobile computer, and is composed of a main body 1113, a camera section 1114, an image receiving section 1115, operating switches 1116, and a semiconductor display device 1117. The present invention can be applied to the semiconductor display device 1117 and to other signal control circuits.

Figure 16D:
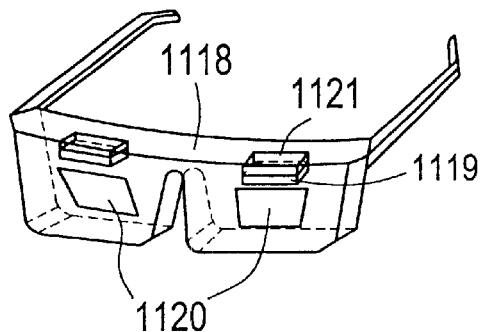

FIG. 16D is a head mount display, and is composed of a main body 1118, semiconductor display devices 1119, mirrors 1120, and back lights 1121. The present invention can be applied to the semiconductor display device 1119 and to other signal control circuits.

Figure 16E:
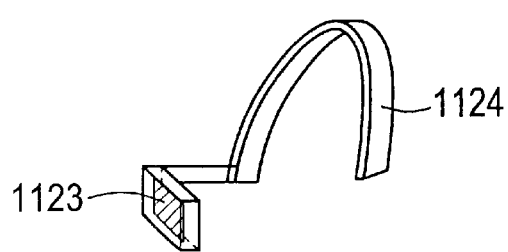

FIG. 16E is a head mount display device, and is composed of a semiconductor display device 1123, and a band section 1124. The head mount display device shown in FIG. 16E is equipped with only one semiconductor display device. The present invention can be applied to the semiconductor display device 1123 and to other signal control circuits.

Figure 17A:
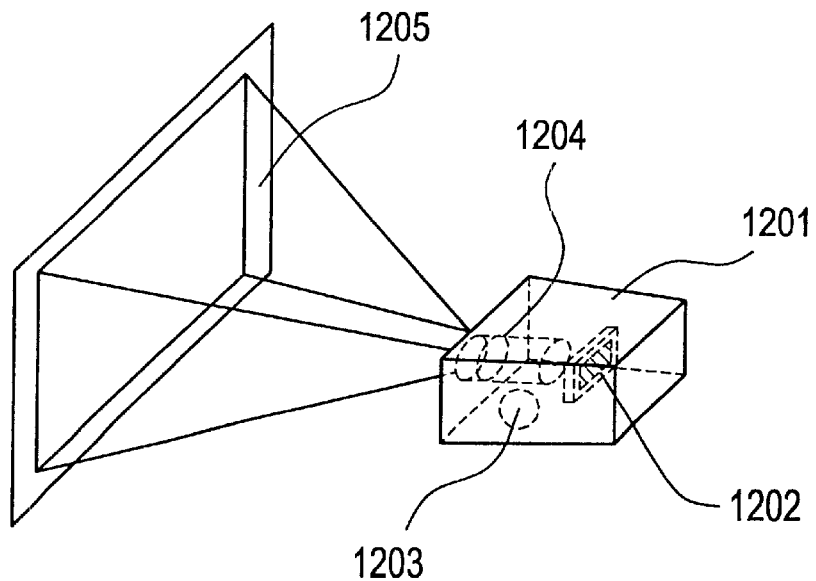
FIGS. 17A and 17B are structural diagrams of electronic equipment using the present invention.

FIG. 17A is a rear type projector, and is composed of a main body 1201, a semiconductor display device 1202, a light source 1203, an optical system 1204, and a screen 1205. Note that it is desirable to be cable of changing the screen angle of a rear type projector, with the main body fixed, depending upon the location of the viewer. Note also that by using three semiconductor display devices 1202 (corresponding to R, G, and B light, respectively) a rear type projector with higher resolution and higher definition can be realized.

Figure 17B:
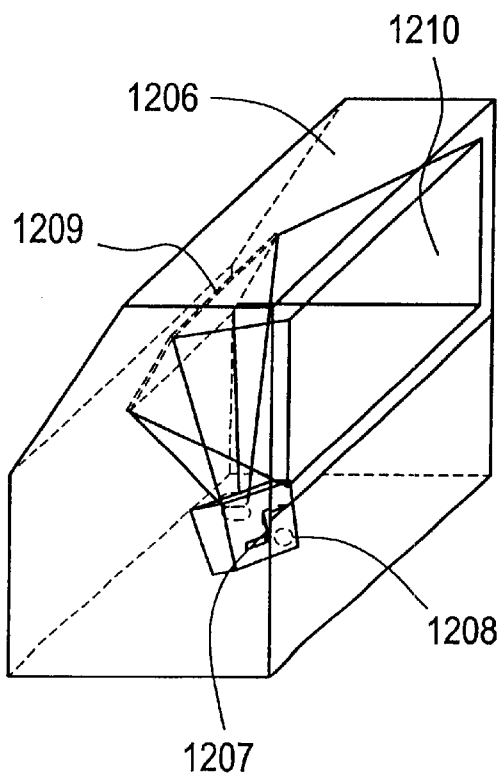
Figure 18:
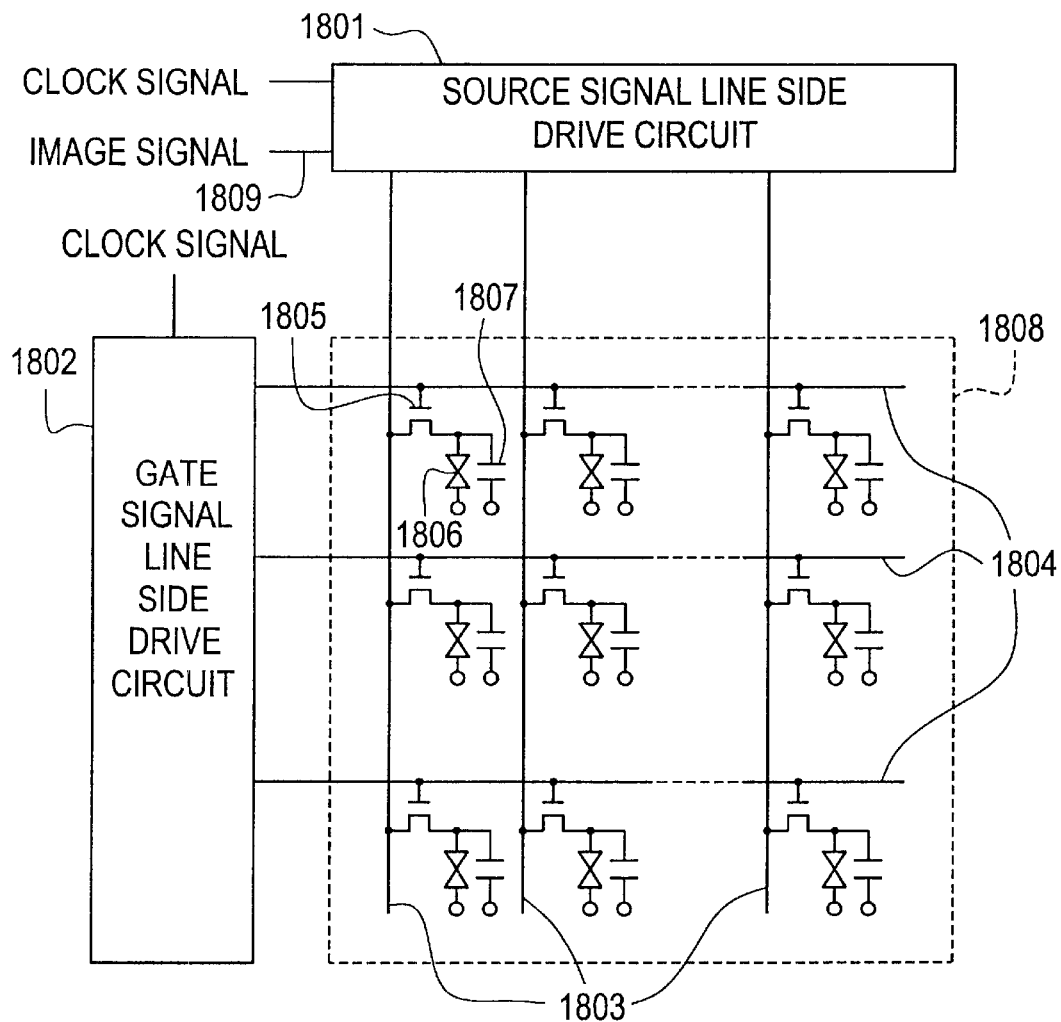
FIG. 18 is an outline diagram of an active matrix display device.
Figure 20:
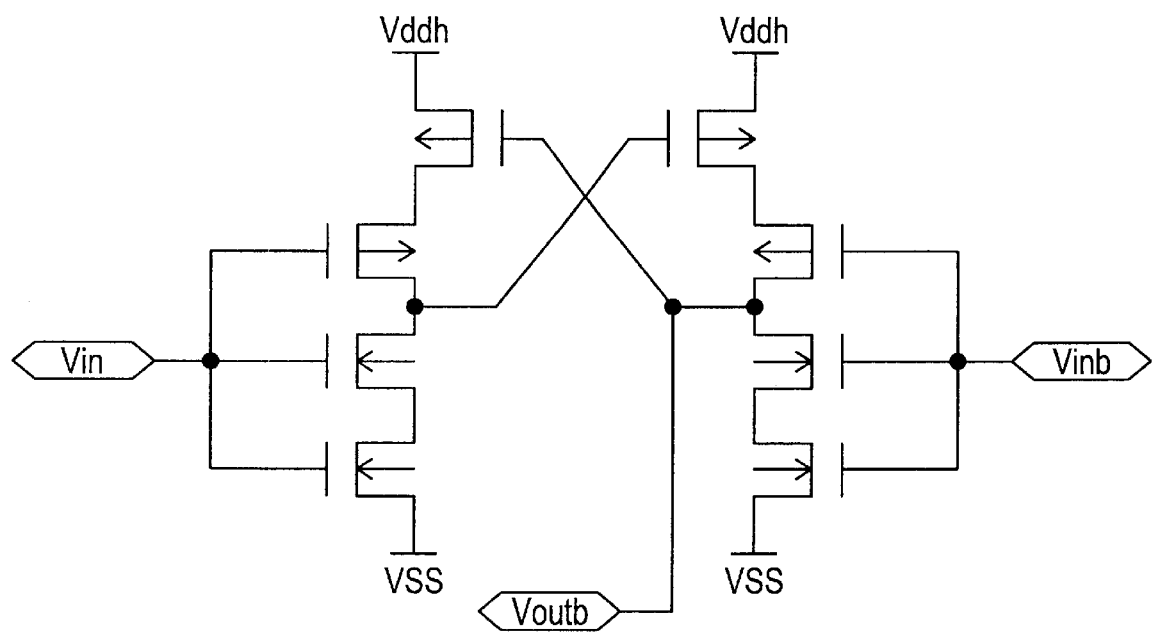
FIG. 20 is an equivalent circuit diagram of a level shifter circuit.
Figure 21:
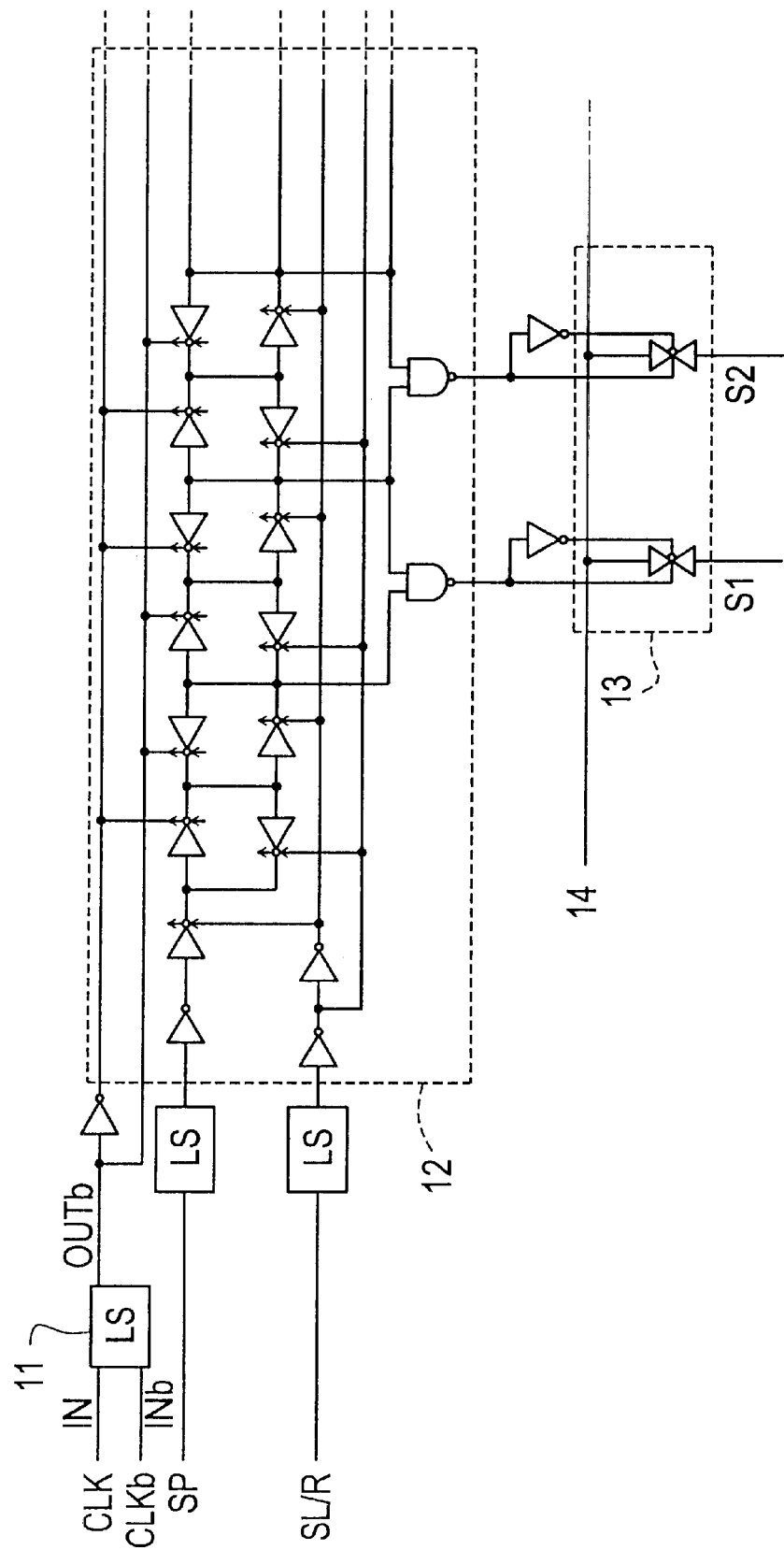
FIG. 21 is a circuit diagram of a conventional source signal line side driving circuit.
Figure 22:
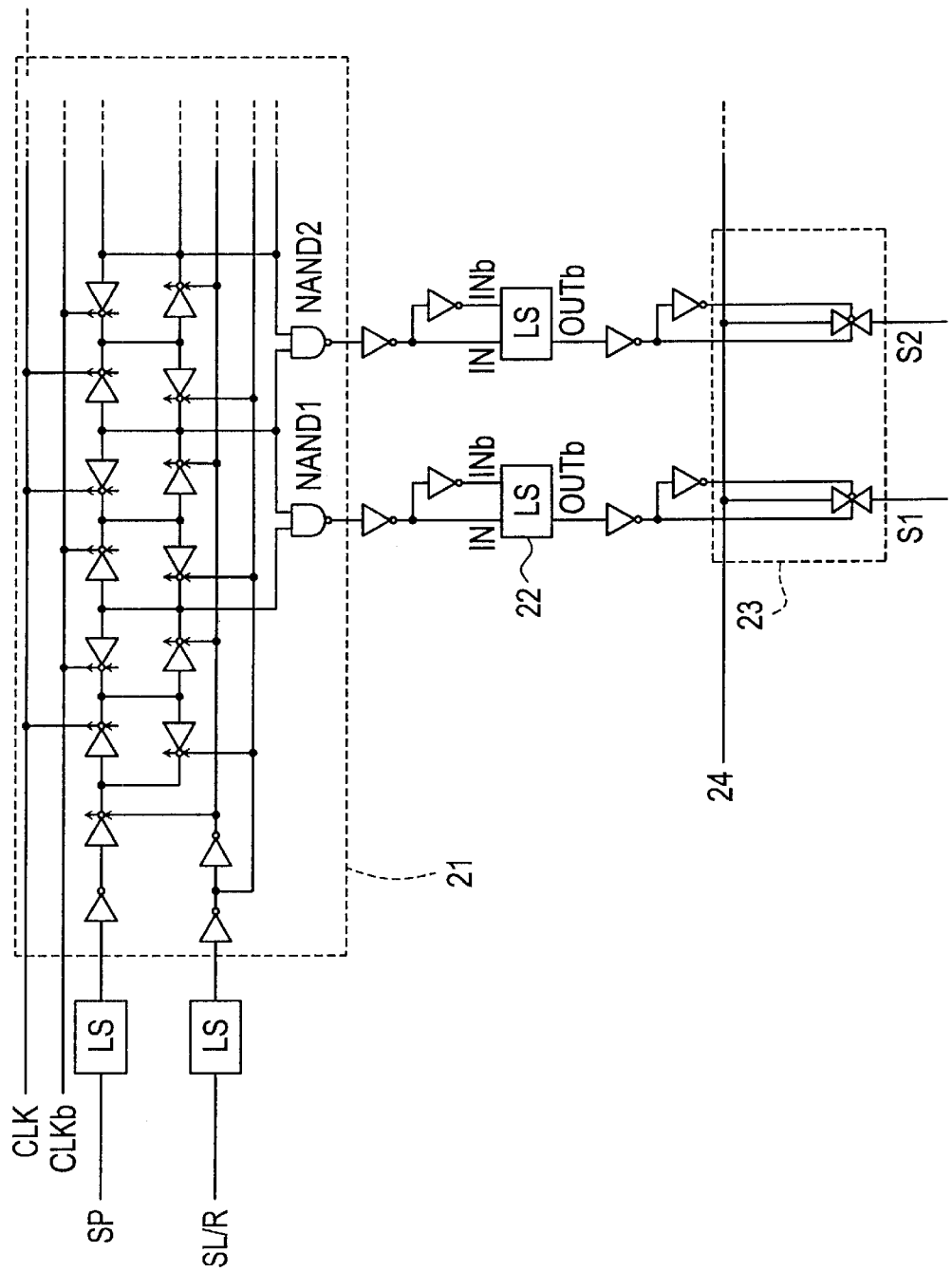
FIG. 22 is a circuit diagram of a conventional source signal line side driving circuit.
Figure 23:
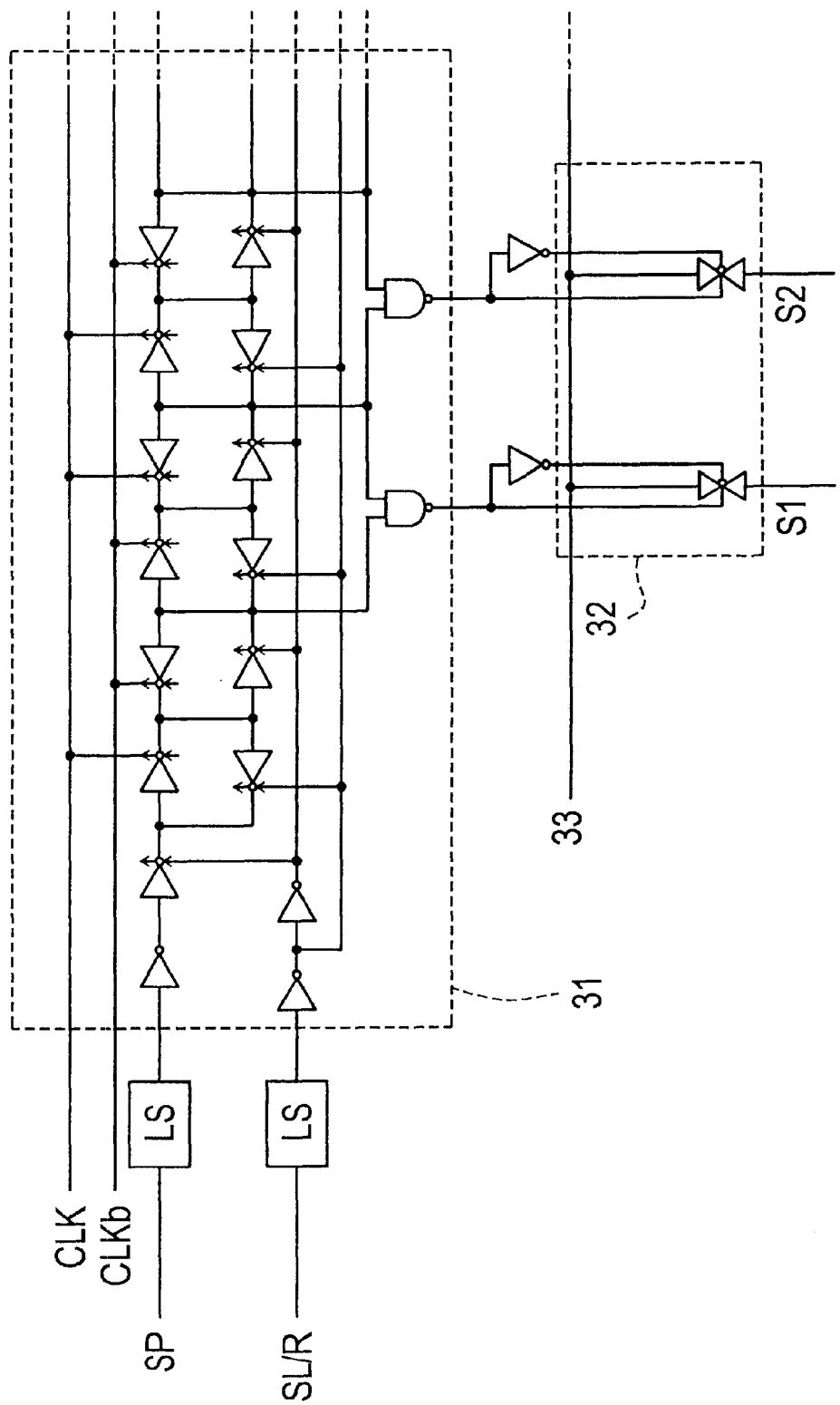
FIG. 23 is a circuit diagram of a conventional source signal line side driving circuit.

FIG. 17B is a front type projector, and is composed of a main body 1206, a semiconductor display device 1207, a light source 1208, a reflector 1209, and a screen 1210. Note that by using three semiconductor display devices 1207 (corresponding to R, G, and B light, respectively) a front type projector with higher resolution and higher definition can be realized.

Figure 32A:
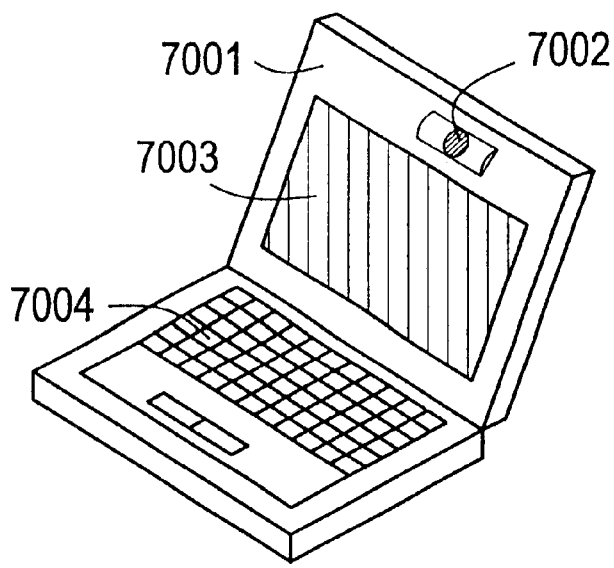
FIGS. 32A to 32C are structural diagrams of electronic equipment using the present invention.

FIG. 32A is a personal computer, and is composed of a main body 7501, an image input section 7502, a display device 7503, and a keyboard 7504. The present invention can be applied to the image input section 7502, to the semiconductor display device 7503, and to other signal control circuits.

Figure 32B:
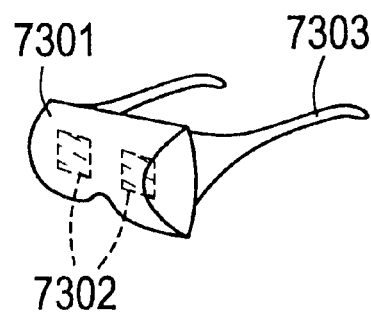

FIG. 32B is a goggle type display, and is composed of a main body 7301, a semiconductor display device 7302, and an arm section 7303. The present invention can be applied to the semiconductor display device 7302, and to other signal control circuits.

Figure 32C:
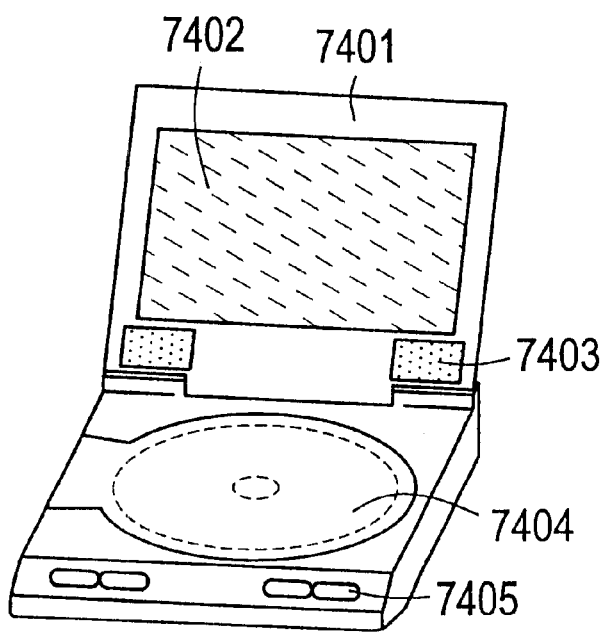

FIG. 32C is a player which uses a recording medium on which a program is recorded (hereafter referred to as a recording medium), and is composed of a main body 7401, a semiconductor display device 7402, a speaker section 7403, a recording medium 7404, and operation switches 7405. Note that music appreciation, film appreciation, games, and the use of the Internet can be performed with this device used by a DVD (digital versatile disk), a CD, etc., as a recording medium. The present invention can be applied to the semiconductor display device 7402, and to other signal control circuits.

As shown above, the present invention's applicable range is extremely wide, and it can be applied to electronic equipment in all fields. Further, the semiconductor display device of Embodiment 22 can be realized with a composition that uses a combination with any of Embodiments 1 to 21.

With the present invention, by arranging level shifter circuits both before and after the shift register circuit, the clock signal of such a voltage amplitude level that the shift register circuit TFT is not damaged due to punch through or hot electrons caused by the short channel effect, and that a TFT with a manufacturable channel length operates allows the shift register circuit to operate. As a result, high-speed operation can be performed without damage to the shift register circuit, and it is possible to drive the liquid crystals in a saturation state. In addition, even if the voltage amplitude level of the clock signal input from external to the source signal line side driving circuit is reduced as much as possible within the range in which the level shifter circuit can operate, high-speed operation of the shift register circuit is possible, so power consumption and unwanted radiation can be suppressed to such an extent that they do not become problems.

What is claimed is:
1. A method of operating a semiconductor device comprising:
increasing a voltage of a signal which is input to a first level shifter circuit, to a voltage amplitude level at which it is sufficient for a shift register circuit to operate, and inputting increased signal to the shift register circuit;
creating a timing signal by the shift register circuit, based on the input signal from the first level shifter, and inputting the timing signal to a second level shifter circuit;
increasing a voltage amplitude level of the timing signal by the second level shifter circuit, and inputting the timing signal to a sampling circuit; and
sampling image signals in accordance with the timing signal by the sampling circuit, and supplying sampled signals to source signal lines.

2. A method according to claim 1, wherein the semiconductor device comprising an electroluminescence display device.

3. A method according to claim 1, wherein the semiconductor device is an electronic equipment selected from the group consisting of a video camera, a still camera, a digital camera, a head mount display, a game machine, a car navigation system, a personal computer, a portable information terminal, a mobile computer, a portable telephone, and an electronic book.

4. A method of operating a semiconductor device comprising:
increasing a voltage of a clock signal which is input to a first level shifter circuit, to a voltage amplitude level at which it is sufficient for a shift register circuit to operate, and inputting increased signal to the shift register circuit;
creating a timing signal by the shift register circuit, based on the signal from the first level shifter, and inputting the timing signal to a second level shifter circuit;
increasing a voltage amplitude level of the timing signal to a certain fixed margin voltage in addition to a saturation voltage of a liquid crystal by the second level shifter circuit, and inputting the timing signal to a sampling circuit; and
sampling image signals in accordance with the timing signal from the second level shifter by the sampling circuit, and supplying sampled signals to source signal.

5. A method according to claim 4, wherein the semiconductor device comprising an electroluminescence display device.

6. A method according to claim 4, wherein the semiconductor device is an electronic equipment selected from the group consisting of a video camera, a still camera, a digital camera, a head mount display, a game machine, a car navigation system, a personal computer, a portable information terminal, a mobile computer, a portable telephone, and an electronic book.

7. A method of operating a semiconductor device comprising:
increasing a voltage of a signal which is input to a first level shifter circuit, to a voltage amplitude level at which it is sufficient for a shift register circuit to operate, and inputting increased signal to the shift register circuit;
creating a selection signal by the shift register circuit, based on the signal from the first level shifter, and inputting the selection signal to a second level shifter circuit; and increasing a voltage amplitude level of the selection signal by the second level shifter circuit to a voltage amplitude level at which it is sufficient for all pixel TFTs to operate, and supplying the increased selection signal to gate signal lines.

8. A method according to claim 7, wherein the selection signal from the second level shifter circuit is supplied to the gate signal lines directly.

9. A method according to claim 7, wherein the selection signal from the second level shifter circuit is supplied to the gate signal lines via a buffer circuit.

10. A method according to claim 7, wherein the semiconductor device comprising an electroluminescence display device.

11. A method according to claim 7, wherein the semiconductor device is an electronic equipment selected from the group consisting of a video camera, a still camera, a digital camera, a head mount display, a game machine, a car navigation system, a personal computer, a portable information terminal, a mobile computer, a portable telephone, and an electronic book.

12. A method of operating a semiconductor device comprising:
increasing a voltage of a clock signal which is input to a first level shifter circuit, to a voltage amplitude level at which it is sufficient for a shift register circuit to operate, and inputting increased signal to the shift register circuit;
creating a selection signal by the shift register circuit, based on the signal from the first level shifter, and inputting the selection signal to a second level shifter circuit; and
increasing a voltage amplitude level of the selection signal by the second level shifter circuit to a voltage amplitude level at which it is sufficient for all pixel TFTs to operate, and supplying the increased selection signal to gate signal lines.

13. A method according to claim 12, wherein the selection signal from the second level shifter circuit is supplied to the gate signal lines directly.

14. A method according to claim 12, wherein the selection signal from the second level shifter circuit is supplied to the gate signal lines via a buffer circuit.

15. A method according to claim 12, wherein the semiconductor device comprising an electroluminescence display device.

16. A method according to claim 12, wherein the semiconductor device is an electronic equipment selected from the group consisting of a video camera, a still camera, a digital camera, a head mount display, a game machine, a car navigation system, a personal computer, a portable information terminal, a mobile computer, a portable telephone, and an electronic book.

17. A semiconductor device comprising at least one pixel region and driving circuits, at least one of driving circuits comprising:
a source signal line driving circuit comprising a first level shifter circuit, a second level shifter circuit, a shift register circuit, and a sampling circuit,
wherein the first level shifter circuit increases a voltage of an input signal, which is input to the first level shifter circuit, to a voltage amplitude level at which it is sufficient for the shift register circuit to operate, and inputs a signal to the shift register circuit,
wherein the shift register circuit creates a timing signal, based on the input signal input from the first level shifter circuit, and inputs the timing signal to the second level shifter circuit,
wherein the second level shifter circuit increases a voltage amplitude level of the timing signal, and inputs increased timing signal to the sampling circuit,
wherein the sampling circuit samples an image signal in accordance with input timing signal, and supplies a signal to source signal lines connected to the source signal line driving circuit, and
wherein the driving circuits comprise a plurality of thin film transistors, each thin film transistor comprising at least one semiconductor island, and at least one gate electrode adjacent to the semiconductor island with a gate insulating film interposed therebetween.

18. A device according to claim 17, wherein the pixel region and the driving circuits are located on one substrate.

19. A device according to claim 17, wherein the semiconductor device comprising an electroluminescence display device.

20. A device according to claim 17, wherein the semiconductor device is an electronic equipment selected from the group consisting of a video camera, a still camera, a digital camera, a head mount display, a game machine, a car navigation system, a personal computer, a portable information terminal, a mobile computer, a portable telephone, and an electronic book.

21. A semiconductor device comprising at least one pixel region and driving circuits, at least one of driving circuits comprising:
a gate signal line driving circuit comprising a first level shifter circuit, a second level shifter circuit, and a shift register circuit,
wherein the first level shifter circuit increases a voltage of an input signal, which is input to a voltage amplitude level at which it is sufficient for the shift register circuit to operate, and inputs a signal to the shift register circuit,
wherein the shift register circuit creates a selection signal, based on the input signal from the first level shifter circuit, and inputs the selection signal to the second level shifter circuit,
wherein the second level shifter circuit increases a voltage amplitude level of the input selection signal, to a voltage amplitude level at which it is sufficient for all pixel TFTs connected to gate signal lines to operate, and supplies the increased selection signal to the gate signal lines, and
wherein the driving circuits comprise a plurality of thin film transistors, each thin film transistor comprising at least one semiconductor island, and at least one gate electrode adjacent to the semiconductor island with a gate insulating film interposed therebetween.

22. A device according to claim 21, wherein the selection signal from the second level shifter circuit is supplied to the gate signal lines directly.

23. A device according to claim 21, wherein the selection signal from the second level shifter circuit is supplied to the gate signal lines via a buffer circuit.

24. A device according to claim 21, wherein the pixel region and the driving circuits are located on one substrate.

25. A device according to claim 21, wherein the semiconductor device comprising an electroluminescence display device.

26. A device according to claim 21, wherein the semiconductor device is an electronic equipment selected from the group consisting of a video camera, a still camera, a digital camera, a head mount display, a game machine, a car navigation system, a personal computer, a portable information terminal, a mobile computer, a portable telephone, and an electronic book.

* * * * *